United States Patent
Ohmae et al.

(10) Patent No.: US 9,911,894 B2
(45) Date of Patent: Mar. 6, 2018

(54) NITRIDE-BASED III-V GROUP COMPOUND SEMICONDUCTOR

(71) Applicant: Sony Corporation, Tokyo (JP)

(72) Inventors: Akira Ohmae, Kanagawa (JP); Michinori Shiomi, Kanagawa (JP); Noriyuki Futagawa, Kanagawa (JP); Takaaki Ami, Kanagawa (JP); Takao Miyajima, Kanagawa (JP); Yuuji Hiramatsu, Kanagawa (JP); Izuho Hatada, Kanagawa (JP); Nobukata Okano, Kanagawa (JP); Shigetaka Tomiya, Kanagawa (JP); Katsunori Yanashima, Kanagawa (JP); Tomonori Hino, Kanagawa (JP); Hironobu Narui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/689,892

(22) Filed: Apr. 17, 2015

(65) Prior Publication Data

US 2015/0228846 A1 Aug. 13, 2015

Related U.S. Application Data

(62) Division of application No. 11/533,965, filed on Sep. 21, 2006, now Pat. No. 9,034,738.

(30) Foreign Application Priority Data

Sep. 22, 2005 (JP) .................................. 2005-275504
Aug. 8, 2006 (JP) .................................. 2006-215342

(51) Int. Cl.
*H01L 33/00* (2010.01)
*H01L 31/0328* (2006.01)
(Continued)

(52) U.S. Cl.
CPC .......... *H01L 33/0025* (2013.01); *C30B 23/04* (2013.01); *C30B 25/04* (2013.01);
(Continued)

(58) Field of Classification Search
CPC ..... H01L 33/0025; H01L 33/24; H01L 27/15; H01L 33/32; H01L 21/0262;
(Continued)

(56) References Cited

U.S. PATENT DOCUMENTS 6,015,979 A 1/2000 Sugiura et al.
6,153,010 A * 11/2000 Kiyoku ................. B82Y 20/00
117/106

(Continued)

FOREIGN PATENT DOCUMENTS

EP 0874405 10/1998
JP 2001-148348 5/2001
(Continued)

OTHER PUBLICATIONS

Chinese Office Action issued in connection with related Chinese Patent Application No. CN 200610064047.
(Continued)

*Primary Examiner* — Shouxiang Hu
(74) *Attorney, Agent, or Firm* — Dentons US LLP

(57) ABSTRACT

A method for manufacturing a light-emitting diode, which includes the steps of: providing a substrate having a plurality of protruded portions on one main surface thereof wherein the protruded portion is made of a material different in type from that of the substrate and growing a first nitride-based III-V Group compound semiconductor layer on each recess portion of the substrate through a state of making a triangle in section wherein a bottom surface of the recess portion becomes a base of the triangle; laterally growing a second nitride-based III-V Group compound semiconductor layer
(Continued)

on the substrate from the first nitride-based III-V Group compound semiconductor layer; and successively growing, on the second nitride-based III-V Group compound semiconductor layer, a third nitride-based III-V Group compound semiconductor layer of a first conduction type, an active layer, and a fourth nitride-based III-V compound semiconductor layer of a second conduction type.

18 Claims, 73 Drawing Sheets

(51) Int. Cl.
| | |
|---|---|
| C30B 23/04 | (2006.01) |
| C30B 25/04 | (2006.01) |
| C30B 29/40 | (2006.01) |
| H01L 21/02 | (2006.01) |
| H01L 33/08 | (2010.01) |
| H01L 27/15 | (2006.01) |
| H01L 33/24 | (2010.01) |
| H01L 33/32 | (2010.01) |
| H01L 33/12 | (2010.01) |
| H01L 33/22 | (2010.01) |
| H01L 33/46 | (2010.01) |

(52) U.S. Cl.
CPC ........ *C30B 29/403* (2013.01); *H01L 21/0254* (2013.01); *H01L 21/0262* (2013.01); *H01L 21/02439* (2013.01); *H01L 21/02458* (2013.01); *H01L 21/02507* (2013.01); *H01L 21/02642* (2013.01); *H01L 21/02647* (2013.01); *H01L 27/15* (2013.01); *H01L 33/007* (2013.01); *H01L 33/08* (2013.01); *H01L 33/24* (2013.01); *H01L 33/32* (2013.01); *H01L 33/0079* (2013.01); *H01L 33/12* (2013.01); *H01L 33/22* (2013.01); *H01L 33/46* (2013.01)

(58) Field of Classification Search
CPC ........ H01L 21/02507; H01L 21/02439; H01L 21/02458; H01L 21/02647; H01L 21/0254; H01L 21/02642; H01L 33/007; H01L 33/08; H01L 33/0079; H01L 33/46; H01L 33/22; H01L 33/12; H01L 33/0075; H01L 33/025; H01L 33/20; H01L 33/0066; H01L 33/16
USPC ........................................ 257/190, 79, 13, 94
See application file for complete search history.

(56) References Cited

U.S. PATENT DOCUMENTS

| | | | |
|---|---|---|---|
| 6,252,261 B1 * | 6/2001 | Usui | B82Y 20/00 257/190 |
| 6,413,627 B1 | 7/2002 | Motoki et al. | |
| 6,500,747 B1 | 12/2002 | Lee et al. | |
| 6,555,845 B2 | 4/2003 | Sunakawa | |
| 6,576,533 B2 | 6/2003 | Tomiya | |
| 6,809,351 B2 | 10/2004 | Kuramoto et al. | |
| 6,967,359 B2 | 11/2005 | Kamiyama et al. | |
| 6,969,670 B2 | 11/2005 | Biwa et al. | |
| 7,141,444 B2 | 11/2006 | Koike et al. | |
| 7,294,200 B2 | 11/2007 | Fujikura et al. | |
| 2002/0115267 A1 * | 8/2002 | Tomiya | B29C 43/222 438/478 |
| 2004/0232428 A1 | 11/2004 | Senda | |
| 2005/0064206 A1 | 9/2005 | Akita et al. | |
| 2009/0091002 A1 | 4/2009 | Arena et al. | |

FOREIGN PATENT DOCUMENTS

| | | |
|---|---|---|
| JP | 2001-148543 | 5/2001 |
| JP | 2002-353134 | 12/2002 |
| JP | 2003-046127 | 2/2003 |
| JP | 2004-297010 | 10/2004 |
| JP | 2005-236328 | 9/2005 |
| JP | 2005-247594 | 9/2005 |

OTHER PUBLICATIONS

Japanese Office Action issued in connection with related Japanese patent application No. JP 2006-215342 dated Jan. 20, 2009.
Japanese Office Action issued in connection with related Japanese patent application No. JP 2009-174008 dated Mar. 27, 2012.
European Search Report issued in connection with related EP Application No. 06019703.5 dated Oct. 2, 2012.

* cited by examiner

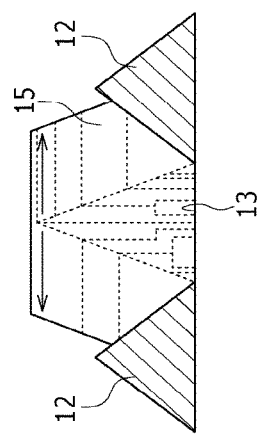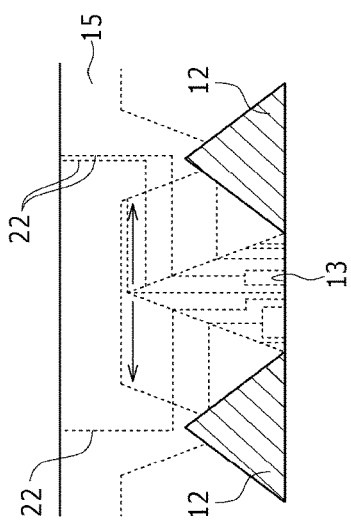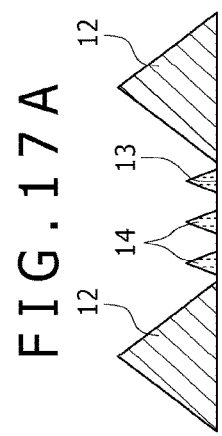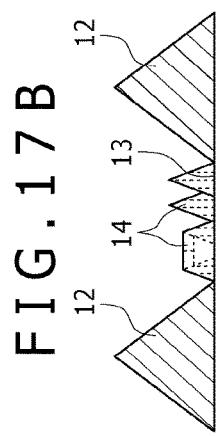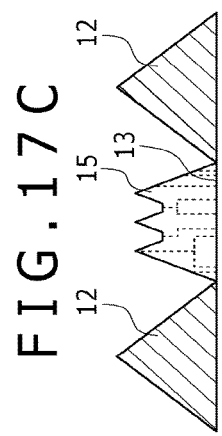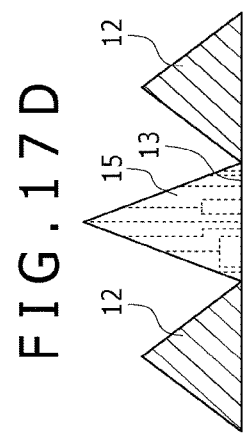

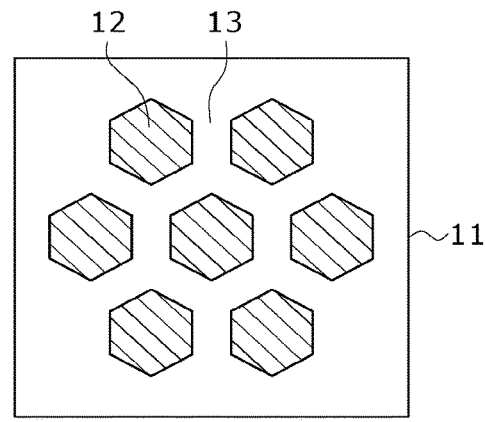
F I G . 4 3 A
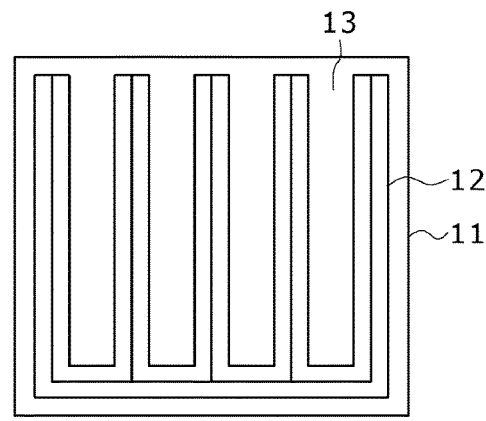
F I G . 4 3 B
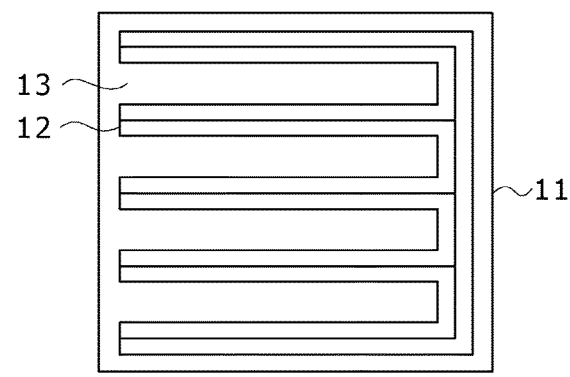
F I G . 4 3 C

LIGHT

F I G . 7 3
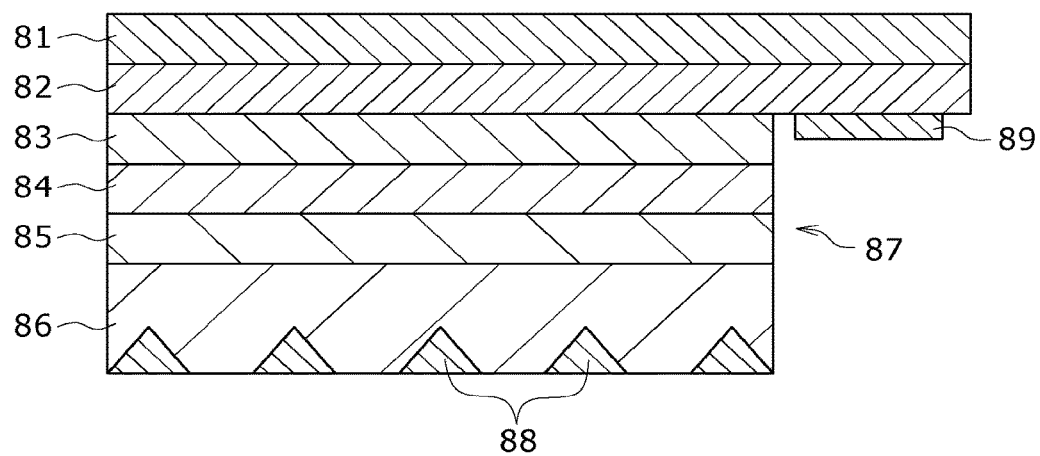

NITRIDE-BASED III-V GROUP COMPOUND SEMICONDUCTOR

CROSS REFERENCES TO RELATED APPLICATIONS

This application is a division of U.S. patent application Ser. No. 11/533,965 filed Sep. 21, 2006, the entirety of which is incorporated herein by reference to the extent permitted by law. The present application contains subject matter related to Japanese Patent Application JP 2005-275504 filed with the Japanese Patent Office on Sep. 22, 2005, and Japanese Patent Application JP 2006-215342 filed with the Japanese Patent Office on Aug. 8, 2006, the entire contents of which being incorporated herein by reference.

BACKGROUND OF THE INVENTION

1. Field of the Invention

This invention relates to a light-emitting diode and a method for manufacturing same, an integrated light-emitting diode and a method for making same, a method for growing a nitride-based III-V Group compound semiconductor, a substrate for growing a nitride-based III-V Group compound semiconductor, a light source cell unit, a light-emitting diode backlight, a light-emitting diode illuminating device, a light emitting diode display, an electronic instrument, and an electronic device and a method for manufacturing same. The invention is suited for application, for example, to a light-emitting diode using a nitride-based III-V Group compound semiconductor and also to various types of instruments or devices using the light-emitting diode.

2. Description of the Related Art

In case where a GaN semiconductor is epitaxially grown on a hetero-substrate such as a sapphire substrate, crystal defects, especially, threading dislocations, occur in high density owing to the great difference in lattice constant or coefficient of thermal expansion therebetween.

To avoid this problem, a dislocation density reducing technique based on selective lateral growth has been hitherto in wide use. In this technique, a GaN semiconductor is epitaxially grown on a sapphire substrate or the like, after which the substrate is removed from a crystal growth device. A growth mask made of a $SiO_2$ film or the like is formed on the GaN semiconductor layer, and the substrate is returned to the crystal growth device, followed by epitaxially growing a GaN semiconductor once more by use of the growth mask.

According to this technique, although the dislocation density in the upper GaN semiconductor layer can be reduced, the epitaxial growth is needed twice, resulting in high costs.

To cope with this, there has been proposed a method, in which a hetero-substrate is subjected to patterned indentation and a GaN semiconductor is epitaxially grown on the indented substrate (e.g. see Mitsubishi Cable Industries Review No. 98, October, 2001, entitled "Development of High Output UV LED Using an LEPS Technique" and Japanese Patent Laid-open Nos. 2004-6931 and 2004-6937). The outline of this method is shown in FIGS. 77A to 77C. According to this method, as shown in FIG. 77A, patterned indentation is made in one main surface of the c face of a sapphire substrate 101. A recessed portion is indicated by reference numeral 101a and a protruded portion is indicated by reference numeral 101b. These recessed portions 101a and protruded portions 101b, respectively, extend along a <1-100> direction of the sapphire substrate 101. Next, a GaN semiconductor layer 102 is formed over the sapphire substrate 101 via the steps shown in FIGS. 77B and 77C. In FIG. 77C, the dotted line indicates a growth interface in the course of the growth. As is particularly shown in FIG. 77C, it is characteristically observed that the recessed portion 101a is unfavorably formed with a space 103 between the sapphire substrate 101 and the GaN semiconductor 102. The distribution of crystal defects in the GaN semiconductor layer 102 grown by the method is schematically shown in FIG. 78. As shown in FIG. 78, threading dislocations 104 occur at a portion over the protruded portion 101b of the GaN semiconductor layer 102 in a direction vertical to the interface with an upper surface of the protruded portion 101b, thereby forming a high defect density region 105. On the other hand, an area or portion above the recessed portion 101a becomes a low defect density region 106 at a portion between the high defect density regions 105.

It will be noted that although, in FIG. 77C, the GaN semiconductor layer 102 beneath the space 103 formed within the recessed portion 101a of the sapphire substrate 101 is buried in the form of a rectangle, the buried form may be triangular in some case. In the latter case, the GaN semiconductor layer 102 buried inside the recessed portion 101a is in contact with the GaN semiconductor layer 102 laterally grown from the protruded portion 101b, with the possibility that a space is formed, like the rectangular form.

For reference, there is shown in FIGS. 79A to 79D how a GaN semiconductor layer 102 is grown in case where the direction of extension of the recessed portions 101a and the protruded portions 101b is a <11-20> direction of intersecting at right angles with a <1-100> direction of the sapphire substrate 101.

FIGS. 80A to 80F schematically show another conventional growth method (Refer to, for example, Japanese Patent Laid-open No. 2003-31441). In this method, as shown in FIG. 80A, a sapphire substrate 101 subjected to patterned indentation is used, and a GaN semiconductor layer 102 is grown thereon through the steps shown in FIGS. 80B to 80F. It is stated that according to the method, the GaN semiconductor layer 102 can be grown without formation of a space in relation with the sapphire substrate 101.

A further growth method has been proposed in which protruded portions are formed on a substrate using a material different from that of the substrate and a nitride III-V Group compound semiconductor starts to be grown from a recess portion between the protruded portions (see, for example, Japanese patent Laid-open No. 2003-324069 and Japanese Patent No. 2830814). However, the manner of the growth in this method greatly differs from that of the present invention.

Only for reference, main crystal faces and crystal orientations of sapphire are shown in FIGS. 81A and 81B.

SUMMARY OF THE INVENTION

With the conventional method illustrated with respect to FIGS. 77A to 77C, the formation of the space 103 between the sapphire substrate 101 and the GaN semiconductor layer 102 is as stated hereinabove. According to the results of a test made by us, where a light-emitting diode structure in which a GaN semiconductor layer is formed on the GaN semiconductor layer 102 is formed, there is left a problem that the luminous efficiency of the light-emitting diode is low. This is considered for the reason that light generated from an active layer in the course of operation of the light-emitting diode is repeatedly reflected at the inside of the space 103 and is eventually absorbed, thereby worsening a light extraction efficiency.

On the other hand, with the conventional growth method illustrated with respect to 80A to 80F, although it is stated that the space 103 is not formed between the sapphire substrate 101 and the GaN semiconductor layer 102, it is considered that a difficulty is involved in reducing the dislocation density in the GaN semiconductor layer 102 to such a level as that of the conventional growth method shown in FIGS. 77A to 77C. For this, where a light-emitting diode structure in which a GaN semiconductor layer is grown on the GaN semiconductor layer 102 having this high dislocation density is formed, the dislocation density of these GaN semiconductor layers becomes high, thereby inviting a lowering of luminous efficiency.

Further, in either of the conventional growth methods illustrated in FIGS. 77A to 77C and 80A to 80F, dry etching is usually used to subject the surface of the sapphire substrate 101 to patterned indentation, but the sapphire substrate 101 is very unlikely to undergo dry etching, thus not only taking a long time for the etching, but also being low in processing accuracy.

Accordingly, it is desirable to provide a light-emitting diode and a method for manufacturing such a diode in which a light extraction efficiency is remarkably improved owing to the absence of such a space as set out hereinabove, a nitride-based III-V Group compound semiconductor layer constituting a light-emitting diode is significantly improved in crystallinity to provide a very high luminous efficiency, and the diode can be manufactured at low costs by a single run of epitaxial growth, with the ease in processing of a substrate to provide a protrusion and recess pattern thereon.

It is further desirable to provide an integrated light-emitting diode and a method for manufacturing same in a manner as set out in the first desire, a method for growing a nitride-based III-V Group compound semiconductor conveniently used for the manufacture of such a light-emitting diode and integrated light-emitting diode as mentioned above, and a substrate useful for the growth of such a nitride-based III-V Group compound semiconductor.

It is still further desirable to provide a high-performance light source cell unit, light-emitting diode backlight, light-emitting diode illuminating device, light-emitting diode display and electronic device, each using such a diode as mentioned above.

It is yet further desirable to provide electronic devices such as a light-emitting diode, a semiconductor laser, a transistor and the like and a method for manufacturing such devices, in which characteristic properties are very good owing to the absence of such a space as set out hereinbefore and an remarkable improvement of crystallinity of a layer material constituting a device structure, such electronic devices can be manufactured at low costs by a single run of epitaxial growth, and patterned indentation of a substrate is simple.

In order to achieve those desires, according to a first embodiment of the invention, there is provided a method for manufacturing a light-emitting diode. The method includes a providing step, laterally growing step, and successively growing step. The providing step provides a substrate having a plurality of protruded portions on one main surface thereof, in which the protruded portion is made of a material different in type from that of the substrate, and grows a first nitride-based III-V Group compound semiconductor layer on each recess portion of the substrate through a state of making a triangle in section wherein a bottom surface of the recess portion becomes a base of the triangle. The laterally growing step grows a second nitride-based III-V Group compound semiconductor layer on the substrate from the first nitride-based III-V Group compound semiconductor layer. The successively growing step grows a third nitride-based III-V Group compound semiconductor layer of a first conduction type, an active layer, and a fourth nitride-based III-V compound semiconductor layer of a second conduction type on the second nitride-based III-V Group compound semiconductor layer.

The first nitride-based III-V compound semiconductor layer and the second nitride-based III-V compound semiconductor layer may be of any conduction type and may be either of a p-type, an n-type or an i-type, and may be of the same conduction type or may be different in conduction type. Moreover, two or more portions that differ in conduction type may exist in the first nitride-based III-V compound semiconductor layer or the second nitride-based III-V compound semiconductor layer.

Typically, when the first nitride-based III-V Group compound semiconductor layer is grown, a dislocation occurs in a vertical direction relative to the one main surface of the substrate from the interface with the bottom surface of the recess portion of the substrate. At the time when this dislocation arrives at an inclined face or its neighborhood of the first nitride-based III-V compound semiconductor layer in such a state of making a triangle in section as set forth above, the dislocation is bent thereat in a direction parallel to the one main surface as being kept away from the triangular portion. The triangle in section or triangular shape at the triangular portion is intended to mean not only an exact triangle, but also those shapes regarded approximately as a triangle and including, for example, ones having rounded apexes herein and whenever it appears hereinafter. Favorably, at the initial stage of growth of the first nitride-based III-V compound semiconductor layer, a plurality of fine nuclei or micronuclei occur at the bottom surface of the recess portion of the substrate, and a dislocation, which occurs in a vertical direction relative to the one main surface of the substrate from the interface with the bottom surface of the recess portion of the substrate in the course of growth and combination of these fine nuclei, is repeatedly bent thereat in directions parallel to the one main surface. In this way, a dislocation passing through toward the upper side at the stage of growth of the first nitride-based III-V compound semiconductor layer can be reduced in number.

Typically, the protruded portions and recess portions are alternately formed at intervals on the one main surface of the substrate. In this case, the alternate intervals of the protruded portions and recess portions are preferably at 3 to 5 µm. The ratio between the length of a base of the protruded portion and the length of a base of the recess portion is preferably at 0.5 to 3, more preferably at approximately 0.5. The height of the protruded portion as viewed from the one main surface of the substrate is preferably at 0.3 µm or over, more preferably at 1 µm or over. This protruded portion should favorably have a side face inclined relative to the one main surface of the substrate (e.g. a side face in contact with the one main surface of the substrate). When an angle established between the side face and the one main surface of the substrate is taken as θ, it is preferred from the standpoint of improving a light extraction efficiency that the angle is within a range of $100°<θ<160°$, more preferably $132°<θ<139°$ or $147°<θ<154°$ and most preferably at 135° or 152°. The sectional shape of the protruded portion may take a variety of forms, with its side face being not only flat, but also curved, e.g. an n-gonal shape (n is an integer of 3 or over), particularly, a triangle, a rectangle, a pentagon, a hexagon and the like, with or without their apexes being cut off or rounded, a circle, an ellipse and the like, of which a shape having one apex at the highest position as viewed from the one main surface of the substrate is preferred, and a triangle or a triangle with its apex being cut off or rounded is more preferred. The recess portion may be in various sectional forms including, for example, n-gonal shapes (where n is an integer of 3 or over) such as a triangle, a rectangle, a pentagon, a hexagon and the like, or the just-indicated shapes with their corners being cut off or rounded, a circle, an ellipse and the like. From the standpoint of improving a light extraction efficiency, the recess portion is preferably in the form of an inverted trapezoid in section. The term "inverted trapezoid" means not only an exact inverted trapezoid, but also one regarded approximately as an inverted trapezoid herein and whenever it appears hereinafter. In this case, it is preferred from the standpoint of minimizing the dislocation density of the second nitride-based III-V compound semiconductor layer that when the depth of the recess portion (equal to the height of the protruded portion) is taken as d, the width of the base of the recess portion taken as $W_g$, and the angle made between the inclined surface of the first nitride-based III-V compound semiconductor layer that is triangular in section and the one main surface of the substrate taken as α, d, $W_g$ and α are determined in such a way that $2d \geq W_g \tan \alpha$. α is usually constant, so that d and $W_g$ are so determined as to establish the formula. When d is too great, a material gas is not satisfactorily fed to the inside of the recess portion, thereby impeding the growth of the first nitride-based III-V compound semiconductor layer from the bottom of the recess portion. In contrast, when d is too small, the first nitride-based III-V compound semiconductor layer grows not only at the recess portion of the substrate, but also at the protruded portion at opposite sides thereof. To avoid this, d is generally selected within a range of $0.5 \leq d \leq 5$ μm, preferably within a range of $1.0 \pm 0.2$ μm. $W_g$ is generally in the range of 0.5 to 5 μm, and is preferably selected from a range of $2 \pm 0.5$ μm. The width $W_t$ at the upper surface of the protrude portion is at zero when the protruded portion is triangular in section. If the protruded portion is trapezoidal in section, this protruded portion serves as a region used for the lateral growth of the second nitride-based III-V compound semiconductor layer, for which a longer width results in a larger area of a portion where a dislocation density is reduced. Where the protruded portion is trapezoidal in section, $W_t$ is generally at 1 to 1000 μm, and is preferably within a range of $4 \pm 2$ μm.

The protruded portions or recess portions may extend in a striped shape in one direction of the substrate and when these portions are extended in striped form in first and second directions at least interesting with each other, the protruded portions may be arranged in a two-dimensional pattern of an n-gonal shape (n is an integer of 3 or over), particularly, a triangle, a rectangle, a pentagon, a hexagon or the like or such n-gonal shape as indicated above, but with their corners being cut off or rounded, a circle, an ellipse, a dot or the like. For one preferred example, the protruded portion has a hexagonal planar shape, being arranged two-dimensionally in the form of a honeycomb, and the recess portions are formed so as to surround individual protruded portions therewith, thereby efficiently obtain lights emitted from the active layer into 360-degree surrounding of all directions. Alternatively, the recess portion may have a hexagonal planar shape, being arranged two-dimensionally in the form of a honeycomb, and the protruded portions may be formed so as to surround individual recess portions therewith. Where the recess portions of the substrate are formed in a striped fashion, they may extend, for example, in a <1-100> direction of the first nitride-based III-V compound semiconductor layer, or may extend in <11-20> direction of a sapphire substrate if the substrate used is a sapphire substrate. The protruded portion may be, for example, an n-gonal pyramid (n is an integer of 3 or over) such as a triangular pyramid, a square pyramid, a pentagonal pyramid, a hexagonal pyramid or the like, or such an n-gonal pyramid as indicated above but with their corners being cut off or rounded, a circular cone, an elliptic cone or the like.

The materials for the protruded portion may be of various types and may be electrically conductive or non-conductive. Mention is made, for example, dielectric materials such as oxides, nitrides, carbides and the like and conductors such as of metals, alloys and the like (including transparent conductors). Examples of the oxide include silicon oxides ($SiO_x$), titanium oxides ($TiO_x$), tantalum oxides ($TaX_x$), hafnium oxides ($HfO_2$), zirconium oxides ($ZrO_x$), zinc oxides ($ZnO_x$), aluminium oxides ($AlO_x$), gallium oxides ($GaO_x$), magnesium oxides ($MgO_x$), barium oxides ($BaO_x$), indium oxides ($InO_x$), $MgIn_2O_4$, fluoride-doped tin oxide ($SnO_2$:F (FTO)), titanium oxides ($SnO_x$), lithium oxides ($LiO_x$), calcium oxides ($CaO_x$), copper oxides ($CiO_x$), $CuAlO_2$, $SrCu_2O_2$, iridium oxides ($IrO_x$), ruthenium oxides ($RhO_x$), $Cu_a(Al_xGa_yIn_z)_{1-a}O_2$, CdGeO, InGaZnO, ZnRhO, $GaIn_2O_4$, LaO, LaCuO and the like. These oxides may be used in combination of two or more or may be used in the form of a stacked film. For nitrides, mention is made, for example, silicon nitrides ($SiN_x$), TiN, WN, CN, BN, LiN, TiON, SiON, CrN, CrNO and the like, and two or more of these nitrides may be used in combination or may be used in the form of a stacked film. For carbides, mention is made of SiC, HfC, ZrC, WC, TiC, CrC and the like, and two or more of these carbides may be used in combination or may be used as a stacked film. For metals or alloys, mention is made of B, Al, Ga, In, W, Ni, Co, Pd, Pt, Ag, Hf, Zr, Au, Cu, Ru, Ir, AgNi, AgPd, AuNi, AuPd, AlCu, AlSi, AlSiCu and the like. Two or more of these metals or alloys may be used in combination or may be used in the form of a stacked film. For transparent conductors, there may be used ITO (indium-tin composite oxide), IZO (indium-zinc composite oxide), ZO (zinc oxide), FTO (fluorine-doped tin oxide), tin oxide and the like. These may be used in combination of two or more or may be used in the form of a stacked film. Moreover, different types of materials as mentioned above may be used in combination of two or more, or may be used in the form of a layer-stacked film. The protruded portion may be formed of a metal or the like, which is subjected to nitridation, oxidation or carbonization at least on the surface thereof to form a nitride, oxide or carbide.

The refractive index of the protruded portion is determined depending on the design thereof, if necessary. In general, a substrate and a nitride-based III-V compound semiconductor layer grown on the substrate are so selected that the refractive indices differ from each other. Typically, the semiconductor layer is selected in type to have a refractive index lower than that of the substrate.

If necessary, the protruded portion may be incorporated with a scattering center for the purposes of scattering light emitted from an active layer to improve a light extraction efficiency and ensure high outputting of the resulting light-emitting diode. Such a scattering center used may be silicon fine particles such as, for example, silicon nanocrystals. For the formation of such a protruded portion incorporated with silicon fine particles, the protruded portion made of silicon oxide is formed on a substrate and is thermally treated.

From the standpoint of permitting a first nitride-based III-V compound semiconductor layer to be grown only at recess portions of a substrate, an amorphous layer may be formed at least on the surface of a protruded portion. This amorphous layer serves as a growth mask. This makes use of the fact that nucleic formation at the stage of growth is unlikely to occur on an amorphous layer. This amorphous layer may be formed by forming a film on a substrate by one of various film formation methods or by forming a protruded portion with a metal and oxidizing the surface of the protruded portion. The amorphous layer may be, for example, an $SiO_x$ film, an $SiN_x$ film, an amorphous Si(a-Si) film, an amorphous CrN film or a stacked film of two or more of these films and is ordinarily an insulating film. In some case, the protruded portion may be formed of a first amorphous film, a second amorphous film and a third amorphous film formed on a substrate. In this case, for example, the second amorphous film may be one, which is selectively etched relative to the first and third amorphous films.

After lateral growth of the second nitride-based III-V compound semiconductor layer, at least a part of an upper portion of the protruded portion and/or an upper portion of the recess portion of the first nitride-based III-V compound semiconductor layer and the second nitride-based III-V compound semiconductor layer may be removed, followed by lateral growth of a third nitride-based III-V compound semiconductor layer on a left portion of the second nitride-based III-V compound semiconductor layer and successive growth of an active layer and a fourth nitride-based III-V compound semiconductor layer on the third nitride-based III-V compound semiconductor layer. Alternatively, after the lateral growth of the second nitride-based III-V compound semiconductor layer, at least a part of an upper portion of the protruded portion and/or an upper portion of the recess portion of the first nitride-based III-V compound semiconductor layer and the second nitride-based III-V compound semiconductor layer may be removed, followed by lateral growth of a fifth nitride-based III-V compound semiconductor layer on a left portion of the second nitride-based III-V compound semiconductor layer and successive growth, on the fifth nitride-based III-V compound semiconductor layer, of a third nitride-based III-V compound semiconductor layer, an active layer and a fourth nitride-based III-V compound semiconductor layer.

Further, because threading dislocations concentrate at the associated portion of the second nitride-based III-V compound semiconductor layer at a portion above the protruded portion, a dislocation propagation inhibiting unit made of an insulator or a space has been formed beforehand over the protruded portion of a portion serving as the associated portion. In doing so, a dislocation propagating in the second nitride-based III-V compound semiconductor layer along a direction parallel to the one main surface of the substrate is inhibited from propagation by the dislocation propagation inhibiting unit. Eventually, it can be prevented that the dislocation is passed through up to the surface of the second nitride-based III-V compound semiconductor layer and converted to a threading dislocation.

The third nitride-based III-V compound semiconductor layer is formed thereon with an electrode of the first conduction type in electric connection therewith. Likewise, the fourth nitride-based III-V compound semiconductor layer is formed with an electrode of the second conduction type in electric connection therewith.

The substrate may be made of various types of materials. For a substrate made of a material different from a nitride-based III-V compound semiconductor layer, specific examples include those substrates of sapphire (including c face, a face, r face and the like and also faces off therefrom), SiC (including 6H, 4H and 3C), Si, ZnS, ZnO, LiMgO, GaAs, spinnels ($MgAl_2O_4$, $ScAlMgO_4$), garnets, CrN (e.g. CrN (111)) and the like. Preferably, hexagonal substrates or cubic substrates of these materials are preferred, of which hexagonal substrates are more preferred. For a substrate, a substrate made of a nitride-based III-V compound semiconductor such as GaN, AlGaInN, AlN, GaInN or the like may also be used. Alternatively, a nitride-based III-V compound semiconductor layer is grown on a substrate made of a material that differs from a nitride-based III-V compound semiconductor layer, and protruded portions may be formed on this nitride-based III-V compound semiconductor layer.

It will be noted that if a substrate used is one where a layer such as a nitride-based III-V compound semiconductor layer is grown on a substrate, a material for protruded portion is one that is made of a material different from a material of a layer provided beneath the protruded portion.

The substrate may be removed, if required.

The first to fifth nitride-based III-V compound semiconductor layers and a nitride-based III-V compound semiconductor layer serving as an active layer are most generally made of $Al_xB_yGa_{1-x-y-z}In_zAs_uN_{1-u-v}P_v$, in which $0 \leq x \leq 1$, $0 \leq y \leq 1$, $0 \leq z \leq 1$, $0 \leq u \leq 1$, and $0 \leq v \leq 1$ provided that $0 \leq x+y+z<1$ and $0 \leq u+v<1$, more specifically, made of $Al_xB_yGa_{1-x-y-z}In_zN$, in which $0 \leq x \leq 1$, $0 \leq y \leq 1$, $0 \leq z \leq 1$ provided that $0 \leq x+y+z<1$, and typically made of $Al_xGa_{1-x-z}In_zN$, in which $0 \leq x \leq 1$ and $0 \leq z \leq 1$. Specific examples include GaN, InN, AlN, AlGaN, InGaN, AlGaInN and the like. Where B or Cr is contained in GaN, for example, an effect of promoting the bending of dislocation is shown. In this sense, the first to fifth nitride-based III-V compound semiconductor layers and a nitride-based III-V compound semiconductor layer serving as an active layer may be, respectively, made of BGaN or GaN doped with B such as GaN:B, GaN doped with Cr such as GaN:Cr, or the like. Especially, the first nitride-based III-V compound semiconductor layer, which is initially grown on a recess portion of a substrate, should preferably be one that is made of GaN, $In_xGa_{1-x}N$ ($0<x<0.5$), $Al_xGa_{1-x}N$ ($0<x<0.5$) or $Al_xIn_yGa_{1-x-y}N$ ($0<x<0.5$ and $0<y<0.2$). The first conduction type may be either an n type or a p type and correspondingly, the second conduction type may be correspondingly a p type or an n type. For a so-called low-temperature buffer layer that is initially grown on a substrate, there is usually employed a GaN buffer layer, an AlN buffer layer, an AlGaN buffer layer or the like. In addition, those buffer layers indicated above and doped with Cr therein or a CrN buffer layer may also be used.

The thickness of the second nitride-based III-V compound semiconductor layer is selected as required and typically is several micrometers or below, and may be greater depending on the purpose in end use and may be, for instance, at about several tens of micrometers to 300 micrometers.

For a growing method of the first to fifth nitride-based III-V compound semiconductor layers and a nitride-based III-V compound semiconductor layer serving as an active layer, mention is made, for example, of various epitaxial growth methods such as metalorganic chemical vapor deposition (MOCVD), hydride vapor phase epitaxial growth, halide vapor phase epitaxial growth (HVPE), molecular beam epitaxy (MBE) and the like.

According to a second embodiment of the invention, there is provided a light-emitting diode. The diode includes a substrate having a plurality of protruded portions on one main surface thereof, in which the protruded portions are made of a material different in type from that of the substrate. The diode further includes a sixth nitride-based III-V compound semiconductor layer grown on the substrate without formation of a space in each recess portion of the substrate, and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

In this second embodiment of the invention, and fourth, sixth and seventh to eleventh embodiments of the invention described hereinafter, the sixth nitride-based III-V compound semiconductor layer is one corresponding to the first nitride-based III-V compound semiconductor layer and the second nitride-based III-V compound semiconductor layer in the first embodiment of the invention.

In the second embodiment and third to thirteenth embodiments of the invention described hereinafter, those illustrated with respect to the first embodiment are true of these embodiments unless otherwise stated.

According to a third embodiment of the invention, there is provided a method for manufacturing an integrated, light-emitting diode in which a plurality of light-emitting diodes are integrated. The method includes a providing step, laterally growing step, and successively growing step. The providing step provides a substrate having a plurality of protruded portions on one main surface thereof, in which each protruded portion is made of a material different in type from that of the substrate, and grows a first nitride-based III-V Group compound semiconductor layer on each recess portion of the substrate through a state of making a triangle in section wherein a bottom surface of the recess portion becomes a base of the triangle. The laterally growing step grows a second nitride-based III-V Group compound semiconductor layer on the substrate from the first nitride-based III-V Group compound semiconductor layer. The successively growing step grows a third nitride-based III-V Group compound semiconductor layer of a first conduction type, an active layer and a fourth nitride-based III-V Group compound semiconductor layer of a second conduction type on the second nitride-based III-V Group compound semiconductor layer.

According to a fourth embodiment of the invention, there is provided an integrated, light-emitting diode, in which a plurality of light-emitting diodes are integrated. At least one of the plurality of light-emitting diodes include a substrate having a plurality of protruded portions on one main surface thereof, in which the protruded portions are made of a material different in type from that of the substrate. At least one of the plurality of light-emitting diodes further include: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

In the third and fourth embodiments of the invention, although no limitation is placed on the field of application of the integrated light-emitting diodes, typical use includes a light-emitting diode backlight used for liquid crystal displays, a light-emitting diode illuminating device, a light-emitting diode display, a light-emitting diode optical communication device (e.g. a visible light communication device), a light-emitting diode optical apparatus or the like. This integrated light-emitting diode has no limitation with respect to the manner of arrangement and shape of light-emitting diodes. Light-emitting diodes can be arranged in a two-dimensional array, for example, on a support (a support substrate), a board or plate used for the purpose of interconnections to a variety of devices or inner and outer surfaces of a casing directly or through another board or plate such as a wiring board or a heat sink, or can be arranged in a line or plural lines of striped light-emitting diodes. The form of the integrated light-emitting diode may be not only one in which individual light-emitting diodes are finely, plurally integrated along with circuit patterns by subjecting a wafer of semiconductor layers being stacked to batch processing by use of a so-called semiconductor process technique, but also one in which a plurality of light-emitting diodes, each having being already chipped, are finely integrated and arranged on a patterned circuit board. These light-emitting diodes may be driven independently or collectively, or a group of light-emitting diodes within an arbitrarily selected area may be driven by collective independence (driven in area).

According to a fifth embodiment of the invention, there is provided a method for growing a nitride-based III-V compound semiconductor layer. The method includes a providing step, and a laterally growing step. The providing step provides a substrate having a plurality of protruded portions on one main surface thereof in which each protruded portion is made of a material different in type from that of the substrate, and grows a first nitride-based III-V Group compound semiconductor layer on each recess portion of the substrate through a state of making a triangle in section in which a bottom surface of the recess portion becomes a base of the triangle.

The laterally growing step grows a second nitride-based III-V Group compound semiconductor layer on the substrate from the first nitride-based III-V Group compound semiconductor layer.

This growing method of nitride-based III-V Group compound semiconductor layers may be applicable, aside from the manufacture of a light-emitting diode or an integrated light-emitting diode, to the manufacture of various types of semiconductor devices.

According to a sixth embodiment of the invention, there is provided a substrate for growing a nitride-based III-V Group compound semiconductor layer. The substrate includes: a substrate having a plurality of protruded portions on one main surface thereof in which each protruded portion is made of a material different in type from that of the substrate; and a sixth nitride-based III-V Group compound semiconductor layer grown on the substrate without formation of a space in each recess portion of the substrate. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

According to a seventh embodiment of the invention, there is provided a light source cell unit. The unit includes, on a printed wiring board, a plurality of cells each containing at least one of each of a red light-emitting diode, a green light-emitting diode and a blue light-emitting diode. At least one light-emitting diode selected from the red light-emitting diode, green light-emitting diode and blue light-emitting diode mentioned above, which includes a substrate having a plurality of protruded portions on one main surface thereof in which the protruded portions are made of a material different in type from that of the substrate. At least one diode selected form the above diodes further includes: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

According to an eighth embodiment of the invention, there is provided a light-emitting diode backlight, in which a red light-emitting diode, a green light-emitting diode and a blue light-emitting diode, each being plural in number, are arranged. At least one light-emitting diode selected from the red light-emitting diode, green light-emitting diode and blue light-emitting diode mentioned above, which includes a substrate having a plurality of protruded portions on one main surface thereof in which the protruded portions are made of a material different in type from that of the substrate. At least one diode selected form the above diodes further includes: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

According to a ninth embodiment of the invention, there is provided a light-emitting diode illuminating device, in which a red light-emitting diode, a green light-emitting diode and a blue light-emitting diode, each being plural in number, are arranged. At least one type of light-emitting diode selected from the red light-emitting diode, green light-emitting diode and blue light-emitting diode mentioned above, which includes a substrate having a plurality of protruded portions on one main surface thereof in which the protruded portions are made of a material different in type from that of the substrate. At least one diode selected form the above diodes further includes: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

A tenth embodiment of the invention, there is provided a light-emitting diode display, in which a red light-emitting diode, a green light-emitting diode and a blue light-emitting diode, each being plural in number, are arranged. At least one light-emitting diode selected from the red light-emitting diode, green light-emitting diode and blue light-emitting diode mentioned above, which includes a substrate having a plurality of protruded portions on one main surface thereof in which the protruded portions are made of a material different in type from that of the substrate. At least one diode selected form the above diodes further includes: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

In the seventh to tenth embodiments of the invention, the red light-emitting diode used may be, for example, one that makes use of an AlGaP semiconductor.

According to an eleventh embodiment of the invention, there is provided an electronic device having one or plural light-emitting diodes. At least one of the light-emitting diodes include a substrate having a plurality of protruded portions on one main surface thereof in which the protruded portions are made of a material different in type from that of the substrate. At least one of the diodes mentioned above further include: a sixth nitride-based III-V compound semiconductor layer grown on the substrate without formation of a space in each recess portion of the substrate; and a third nitride-based III-V compound semiconductor layer of a first conduction type, an active layer and a fourth nitride-based III-V compound semiconductor layer of a second conduction type formed on the sixth nitride-based III-V compound semiconductor layer. In the sixth nitride-based III-V compound semiconductor layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

In the eleventh embodiment of the invention, the electronic device includes a light-emitting diode backlight (a backlight for liquid crystal display and the like), a light-emitting diode illuminating device, a light-emitting diode display and the like, and also a projector or rear projection television using a light-emitting diode as a light source, a grating light valve (GLV) and the like. In general, limitation is not fundamentally placed on the types of electronic devices provided that at least one light-emitting diode is contained therein for the purposes of display, illumination, optical communication, optical transmission and the like, and those devices of both a portable type and a desktop type are included within the category of the electronic device. Specific examples other than those indicated above include cell phones, mobile devices, robotic devices, personal computers, in-vehicle devices, various types of home electric appliances, light-emitting diode optical communication apparatus, light-emitting diode optical transmission devices, portable security devices such as electronic keys, and the like. The electronic device may also include combinations of two or more light-emitting diodes that emit lights of different wavelength regions selected among a far-infrared wavelength region, an infrared wavelength region, a red wavelength region, a yellow wavelength region, a green wavelength region, a blue wavelength region, a violet wavelength region, a ultraviolet wavelength region. Especially, with a light-emitting diode illuminating device, two or more light-emitting diodes emitting visible lights of different wavelength regions which differ from each other and are selected from among a red wavelength region, a yellow wavelength region, a green wavelength region, a blue wavelength region, a violet wavelength region and the like are combined, and two or more lights emitted from these light-emitting diodes are mixed to provide natural or white light. Moreover, using, as a light source, a light-emitting diode emitting light of at least one wavelength region selected from a blue wavelength region, a violet wavelength region, an ultraviolet region and the like, the light emitted from this light-emitting diode is irradiated on a phosphor for excitation and the resulting lights are mixed to obtain natural or white light. Additionally, light-emitting diodes emitting visible lights of wavelength regions that differ from one another are assembled, for example, into an assembly unit such as a cell unit, a quartet unit, a cluster unit and the like, (strictly speaking, the assembly unit is not defined with respect to the number of light-emitting diodes contained in one unit of these units and means one assembly unit in case where a plurality of equal groups, each made of a plurality of light-emitting diodes emitting lights of the same wavelength or different wavelengths, are formed and mounted on a wiring board, a wiring package, a wiring case wall and the like). More particularly, light-emitting diodes are assembled, for example, into a unit consisting of three light-emitting diodes (e.g. one red light-emitting diode, one green light-emitting diode and one blue light-emitting diode), or a unit consisting of four light-emitting diodes (e.g. one red light-emitting diode, two green light-emitting diodes and one blue light-emitting diode), and a plurality of such units as mentioned above are mounted on a board or case plate in a two-dimensional array, in a line or in plural lines.

According to a twelfth embodiment of the invention, there is provided a method for manufacturing an electronic device. The method includes the steps of: providing a substrate having a plurality of protruded portions on one main surface thereof in which each protruded portion is made of a material different in type from that of the substrate and growing a first layer on each recess portion of the substrate through a state of making a triangle in section using a bottom surface of the recess portion as a base of the triangle; and laterally growing, on the substrate, a second layer from the first layer.

According to a thirteenth embodiment of the invention, there is provided an electronic device. The device includes: a substrate having a plurality of protruded portions on one main surface thereof in which each protruded portion is made of a material different in type from that of the substrate; and a third layer grown on the substrate without formation of a space in each recess portion of the substrate. In the third layer, a dislocation occurring from an interface with a bottom surface of the recess portion in a vertical direction relative to the one main surface arrives at an inclined face of a triangle using the bottom surface of the recess portion as a base or a vicinity thereof and is bent thereat in a direction parallel to the one main surface.

In the twelfth and thirteenth embodiments of the invention, the first to third layers may be made, aside from a nitride-based III-V Group compound semiconductor, of other types of semiconductors having a wurtzit structure and more generally, a hexagonal crystal structure and also of various types of semiconductors having other crystal structures such as, for example, ZnO, α-ZnS, α-CdS, α-CdSe and the like, along with CrS (111). The semiconductor devices using these types of semiconductors contain, aside from light-emitting devices including light-emitting devices such as ordinary light-emitting diodes, intrasubband transition (quantum cascade) light-emitting diodes, ordinary semiconductor lasers and intrasubband transition (quantum cascade) semiconductor lasers, light-receiving devices or sensors such as photodiodes, solar cells, and electron transit devices typical of which are transistors including field effect transistors (FET) such as high electron mobility transistors and bipolar transistors such as hetero-junction bipolar transistors (HBT). These devices are formed on the same substrate or chip singly or plurally. These devices may be so arranged as to be independently driven, if necessary. If light-emitting devices and electron transit devices are integrated on the same substrate, an optoelectronic integrated circuit (OEIC) may be arranged. If necessary, optical wiring may be formed. Using light supply by flashing of at least one light-emitting device (e.g. a light-emitting diode or semiconductor laser), illumination communication or optical communication can be performed. In this case, the illumination communication or optical communication may be performed using a plurality of lights of different wavelength regions.

The electronic devices include, aside from such semiconductor devices as mentioned above (e.g. light-emitting devices, light-receiving devices, electron transit devices and the like), piezoelectric devices, pyroelectric devices, optical devices (such as a second-order harmonic generator using a non-linear optical crystal, and the like), dielectric devices (including ferroelectric devices), superconduction devices and the like. In this connection, the materials for the first to third layers are such various types of semiconductors as mentioned above for semiconductor devices, and various types of material such as oxides having a hexagonal crystal structure for piezoelectric devices, pyroelectric devices, optical devices, dielectric devices, superconducton devices and the like.

When using those devices including a light-emitting diode or semiconductor laser as an electronic device, there can be constituted electronic devices such as a light-emitting diode backlight, a light-emitting diode illumination device, a light-emitting diode display and the like, and also a projector or rear projection television, a grating light valve using light-emitting diodes or semiconductor lasers as a light source.

As to the twelfth and thirteenth embodiments of the invention, similar applications as in the first to eleventh embodiments may be possible.

In the embodiments of the invention so arranged as stated hereinabove, the first nitride-based III-V Group compound semiconductor layer commences to grow from the bottom surface of each recess of the substrate, during which the first nitride-based III-V Group compound semiconductor layer is grown in a state of making a triangle in section using the bottom surface as a base thereof thereby burying the recess without a space. The second nitride-based III-V Group compound semiconductor layer is laterally grown from the thus grown, first nitride-based III-V Group compound semiconductor layer. At this stage, the first nitride-based III-V Group compound semiconductor layer involves a dislocation that occurs from the interface with the bottom surface of the recess of the substrate in a direction vertical to one main surface of the substrate. This dislocation arrives at the inclined face of the first nitride-based III-V Group compound semiconductor layer or a vicinity thereof. As the second nitride-based III-V Group compound semiconductor layer grows, the dislocation is bent at the arrived portion in a direction parallel to the one main surface of the substrate. At the time when the second nitride-based III-V Group compound semiconductor layer grows to a satisfactory thickness, a portion above the dislocation occurring parallel to the one main surface of the substrate becomes a region where a dislocation density is very small. According to this method, the first to fourth nitride-based III-V Group compound semiconductor layers can be grown by one cycle of epitaxial growth. Moreover, the formation, on the substrate, of the protruded portion made of a material different in type from that of the substrate is much simpler than the case that a substrate is directly processed by dry etching to form a patterned indented surface and is generally high in processing accuracy.

More generally, this is true of the case where the first nitride-based III-V Group compound semiconductor layer is taken as a first layer and the second nitride-based III-V Group compound semiconductor layer is taken as a second layer.

According to the embodiments of the present invention, because no space is formed between each of the first nitride-based III-V Group compound semiconductor layer and the second nitride-based III-V Group compound semiconductor layer and the substrate, a light extraction efficiency can be remarkably improved. Moreover, the crystallinity of the second nitride-based III-V Group compound semiconductor layer is so good that the third nitride-based III-V Group compound semiconductor layer, active layer and fourth nitride-based III-V Group compound semiconductor layer, each formed thereon, can also be remarkably improved with respect to the crystallinity, thereby obtaining a light-emitting diode having a very high luminous efficiency. In addition, the light-emitting diode can be manufactured by a single run of epitaxial growth, thus leading to low manufacture costs. The surface indentation of substrate is easy with a high processing accuracy. Using this light-emitting diode with a high luminous efficiency, there can be obtained various types of electronic devices such as a high-performance light source cell unit, light-emitting diode backlight, light-emitting diode illuminating device, light-emitting diode display, light-emitting diode optical communication device, optical space transmission device and the like.

More generally, as set out above, similar results can be obtained when the first nitride-based III-V Group compound semiconductor layer is taken as a first layer and the second nitride-based III-V Group compound semiconductor layer is taken as a second layer.

BRIEF DESCRIPTION OF THE DRAWINGS

FIGS. 17A to 17F are, respectively, a schematic view showing how the nitride-based III-V Group compound semiconductor layer is grown on a substrate in the method of manufacturing a light-emitting diode according to the embodiment of the invention;

FIGS. 43A to 43C are, respectively, a plan view showing an example of a planar shape of a protruded portion provided below an active layer of the light-emitting diode according to the further embodiment of the invention;

FIG. 73 is a sectional view showing another example of a light-emitting diode;

DETAILED DESCRIPTION OF THE PREFERRED EMBODIMENTS

Figure 1A:
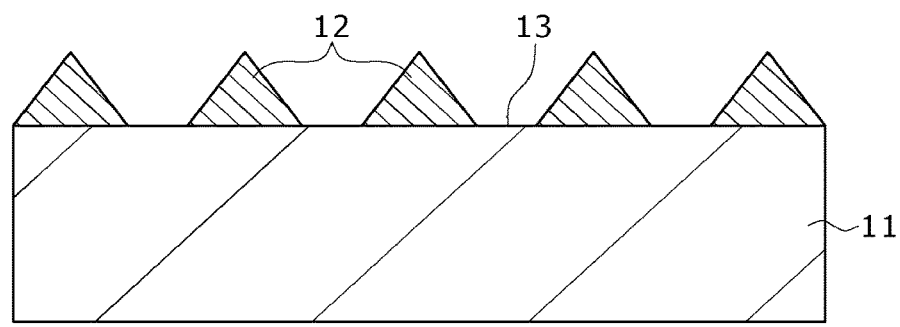
FIGS. 1A to 1C are, respectively, a sectional view illustrating a method for manufacturing a light-emitting diode according to an embodiment of the invention.

The embodiments of the invention are described with reference to the accompanying drawings. It will be noted that like reference numerals indicate like or corresponding parts, members or portions throughout the drawings illustrating the embodiments of the invention.

In FIGS. 1A to 3, a method of manufacturing a light-emitting diode according to a first embodiment of the invention is shown in sequence. This light-emitting diode makes use of a nitride-based III-V Group compound semiconductor such as GaN.

Figure 4:
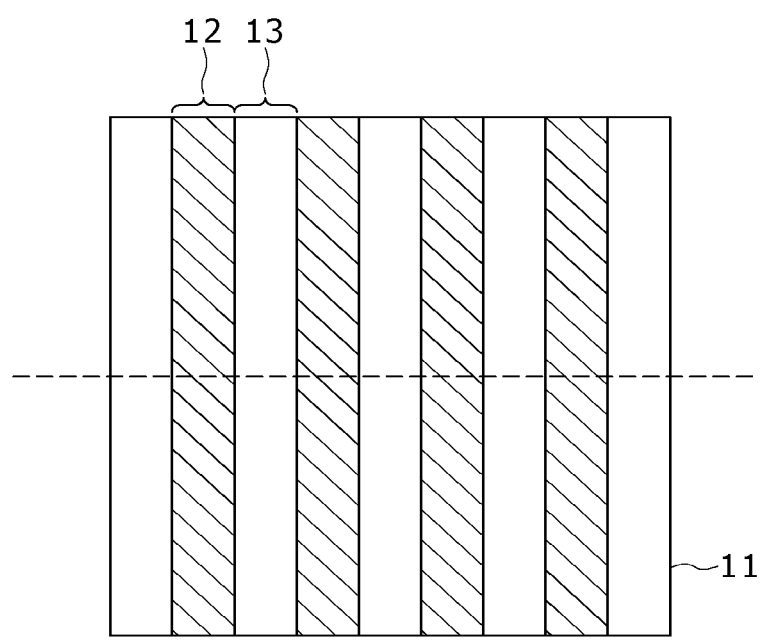
FIG. 4 is a plan view showing an example of a planar shape of protruded portions formed on a substrate in the method of manufacturing a light-emitting diode according to the embodiment of the invention.
Figure 5:
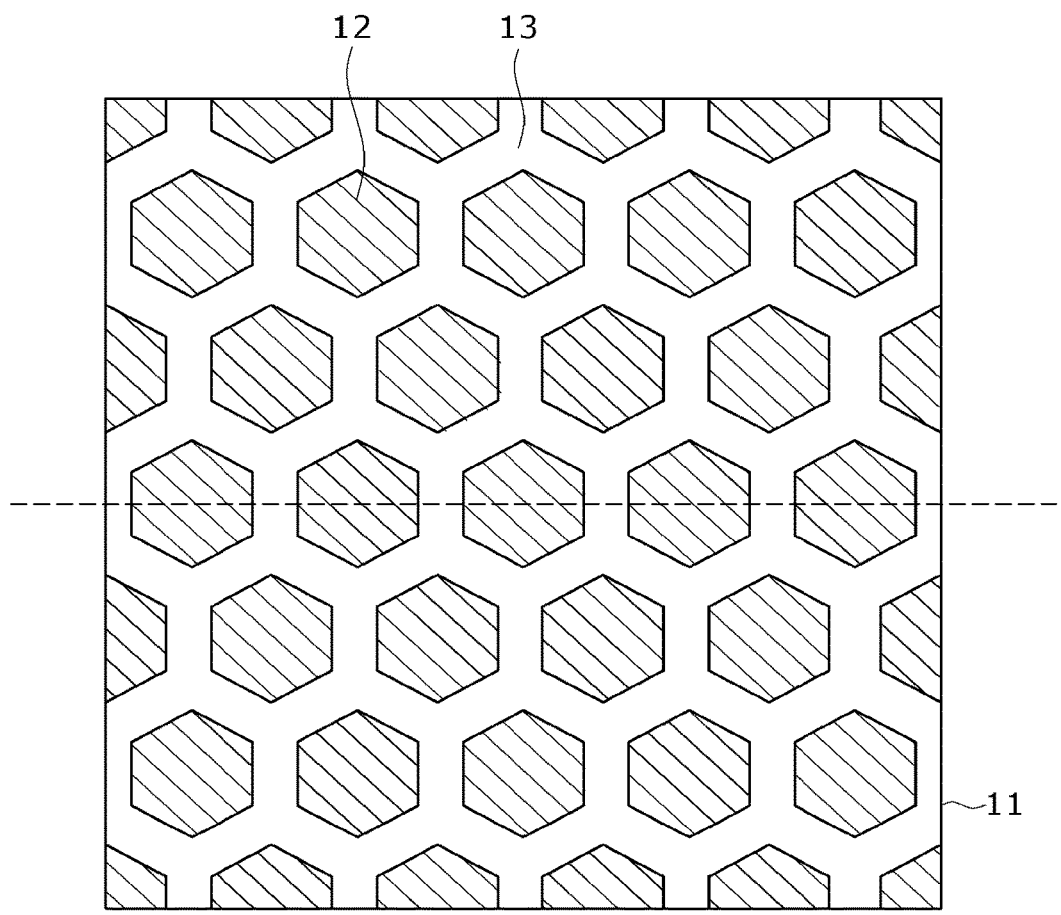
FIG. 5 is a plan view showing an example of a planar shape of protruded portions formed on a substrate in the method of manufacturing a light-emitting diode according to the embodiment of the invention.

In the first embodiment, as shown in FIG. 1A, a substrate 11 having a flat main surface and made of a material different from a nitride-based III-V compound semiconductor is provided. Protruded portions 12 having a isosceles triangle are formed on the substrate 11 in a given planar pattern at intervals. Thus, a recess 13 having an inverted trapezoid in section is formed between adjacent protruded portions 2. The substrate 11 may be, for example, one that has been stated hereinbefore and includes, for example, a sapphire substrate, with its main face being, for example, a c face. The planar shape or form of the protruded portions 12 and recess portions 13 may be one selected from many planar shapes set out hereinbefore. For instance, the planar shape may be one of which the protruded portion 12 and recess portion 13 both extend in one direction to provide a striped pattern as shown in FIG. 4, or one of which each protruded portion 12 has a hexagonal planar shape and is arranged two-dimensionally in the form of a honeycomb. Typically, it is so arranged that a direction of a dotted line in FIG. 4 (i.e. a direction intersecting with the stripe) becomes parallel to the a axis of a nitride-based III-V Group compound semiconductor layer 15 described hereinafter, or a direction of the dotted line in FIG. 5 (i.e. a direction connecting the most adjacent protruded portions 12) becomes parallel to the m axis of a nitride-based III-V Group compound semiconductor layer 15 described hereinafter. For instance, where the substrate 11 is a sapphire substrate, the direction of extension of the protruded portion 12 and recess portion 13 in striped form in FIG. 4 is at the <1-100> direction of the sapphire substrate and the direction of extension of the recess portion in FIG. 5 is likewise at the <1-100> direction of the sapphire substrate. The extension directions may be at the <11-20> direction of the sapphire substrate. The materials for the protruded portions may be those described hereinbefore. In view of the ease in processing, preferred ones include, fore example, $SiO_2$, SiN, CrN, SiON, CrON and the like.

In order to form the protruded portions 12 having an isosceles triangle in section on the substrate 11, any known techniques may be used. For instance, a film serving as a material for the protruded portion 12 (e.g. an SiO$_2$ film) is formed the entire surface of the substrate 11 by a CVD method, a vacuum deposition method, a sputtering method or the like. Next, a resist pattern of a given form is formed on the film by lithography. Thereafter the film is etched through the mask of the resist pattern by a reactive ion etching (RIE) method or the like under conditions where taper etching is performed, thereby forming a protruded portion 12 of an isosceles triangle in section.

Figure 1B:
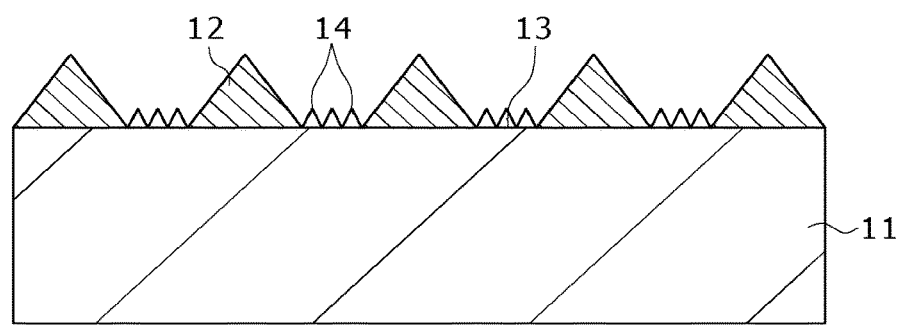
Figure 1C:
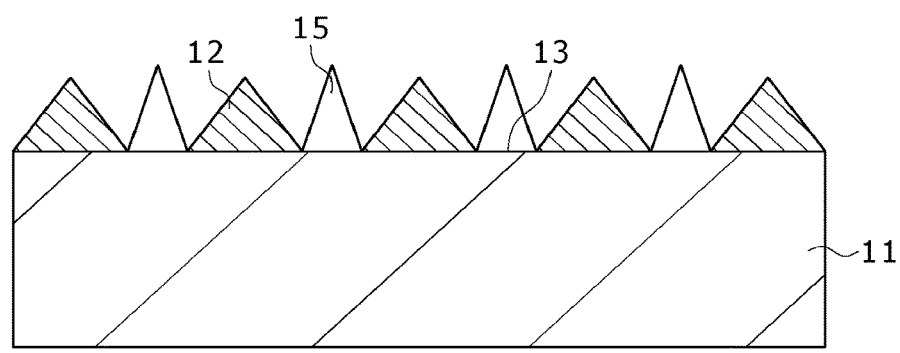

Next, the substrate 11 and the protruded portions 12 are cleaned on the surfaces thereof by subjecting them to thermal cleaning, and the substrate 11 is grown thereon, for example, with a GaN buffer layer, an AlN buffer layer, a CrN buffer layer, a Cr-dope GaN buffer layer or a Cr-doped AlN buffer layer (not shown) by a known method at a growth temperature, for example, of about 550° C. Subsequently, a nitride-based III-V Group compound semiconductor layer is epitaxially grown, for example, by a MOCVD method. This nitride-based III-V Group compound semiconductor layer is made, for example, of GaN. At this stage, as shown in FIG. 1B, the growth starts from the bottom surface of the recess 13 to form a plurality of micronuclei 14 made of the nitride-based III-V Group compound semiconductor. As shown in FIG. 1C, the nitride-based III-V Group compound semiconductor layer 15 is grown through a step of growth and combination of the micronuclei 14 in such a way as to make an isosceles triangle in section which has the bottom surface of the recess 13 as a base and facets inclined relative to the main surface of the substrate 11 as an oblique side. In this instance, the height of the nitride-based III-V Group compound semiconductor layer 15 with an isosceles triangle in section is larger than the height of the protruded portion. For instance, the extension direction of the nitride-based III-V Group compound semiconductor layer 15 is at a <1-100> direction thereof, with the facets of the inclined surface being a (1-101) face. The nitride-based III-V Group compound semiconductor layer 15 may be either undoped or doped with an n-type impurity or p-type impurity. The growth conditions of the nitride-based III-V Group compound semiconductor layer 15 will be described hereinlater. The extension direction of the nitride-based III-V Group compound semiconductor layer 15 may be at a <11-20> direction thereof.

Subsequently, when the growth of the nitride-based III-V Group compound semiconductor layer 15 is carried out while keeping the facet orientation of the inclined surface, the opposite ends of the nitride-based III-V Group compound semiconductor layer 15 grow to an extent of the lower portion of the side face of the protruded portion 12 to provide a state of making a pentagon in section as is particularly shown in FIG. 2A.

Figure 2A:
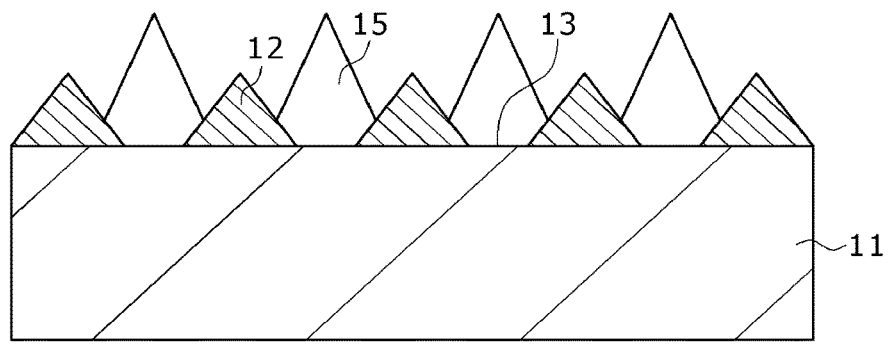
FIGS. 2A to 2C are, respectively, a sectional view illustrating a method for manufacturing a light-emitting diode according to the embodiment of the invention.
Figure 2B:
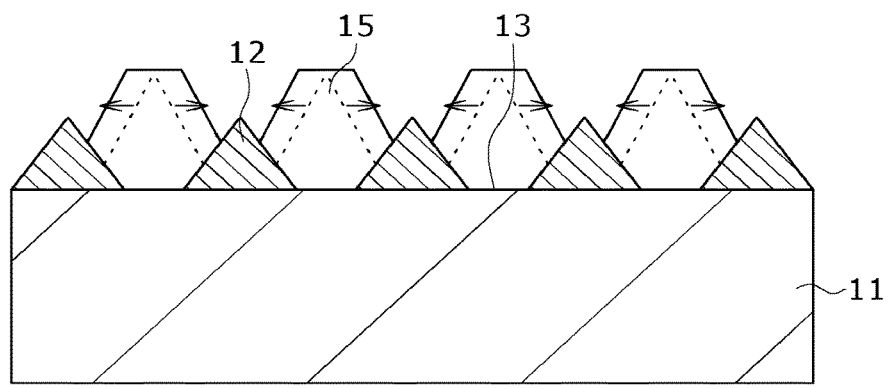

Next, the growth is continued while setting the growth conditions in such a way that lateral growth becomes predominant, whereupon as shown in FIG. 2B, the nitride-based III-V Group compound semiconductor layer 15 laterally grows as indicated by the arrow and spreads over the protruded portion 12 in a state of making a hexagon in section. In FIG. 2B, the dotted line indicates a growth interface during the course of the growth herein and whenever it appears hereinafter.

Figure 2C:
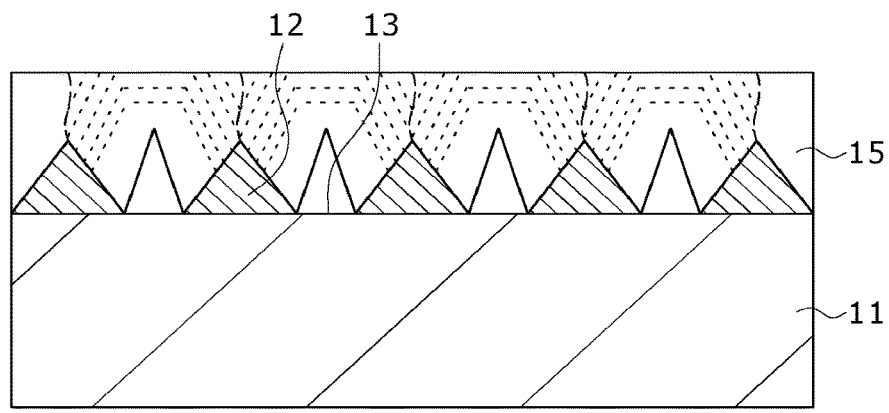

As the lateral growth is further continued, the nitride-based III-V Group compound semiconductor layer 15 grows while increasing its thickness as shown in FIG. 2C and finally the nitride-based III-V Group compound semiconductor layers 15 grown from adjacent recess portions 13 contact with each other and combine together.

Subsequently, as shown in FIG. 2C, the nitride-based III-V Group compound semiconductor layer 15 is further laterally grown until the surface thereof becomes a flat surface that is parallel to the main surface of the substrate 11. The thus grown nitride-based III-V Group compound semiconductor layer 15 becomes very low in dislocation density at a portion over the recess portion 13.

It will be noted that in some case, it is possible to change from the state shown in FIG. 1C directly to the state of FIG. 2B without the step shown in FIG. 2A.

Figure 3:
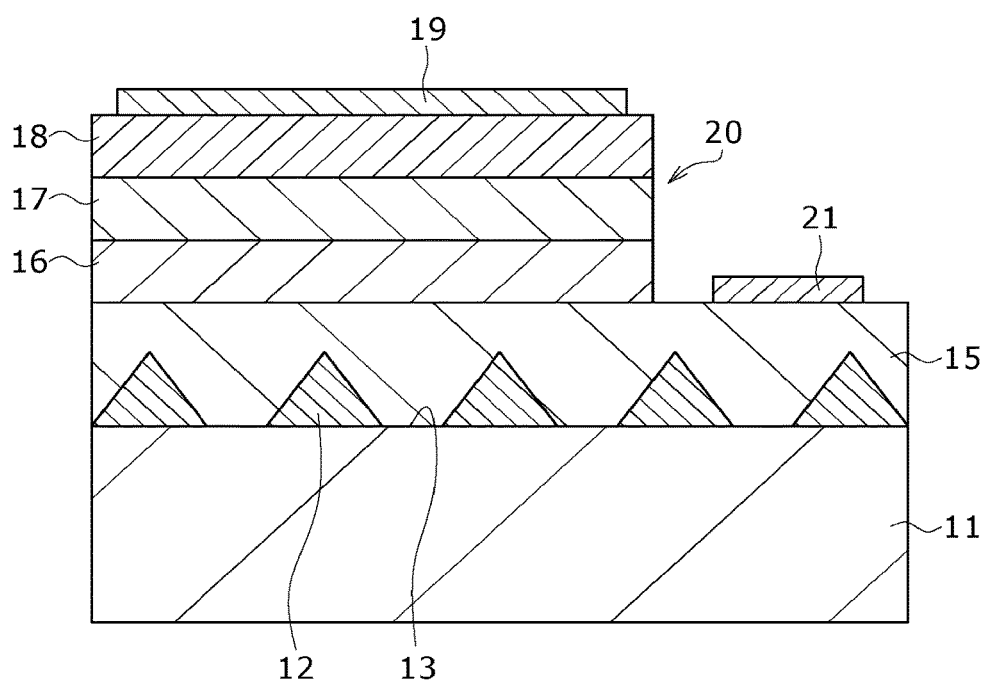
FIG. 3 is a sectional view illustrating a method for manufacturing a light-emitting diode according to the embodiment of the invention.

Next, as shown in FIG. 3, the nitride-based III-V Group compound semiconductor layer 15 is formed thereon successively with an n-type nitride-based III-V Group compound semiconductor layer 16, an active layer 17 using a nitride-based III-V Group compound semiconductor, and a p-type nitride-based III-V Group compound semiconductor layer 18, for example, by a MOCVD method. In this case, the nitride-based III-V Group compound semiconductor layer 15 is of an n-type.

Next, the substrate 11 on which the nitride-based III-V Group compound semiconductor layers have been grown is removed from the MOCVD apparatus.

Thereafter, a p-side electrode 19 is formed on the p-type nitride-based III-V Group compound semiconductor layer 18. The material of the p-side electrode 19 should preferably be, for example, an ohmic metal having high reflectivity.

Thereafter, for the purpose of activating the p-type impurity in the p-type nitride-based III-V Group compound semiconductor layer 18, thermal treatment is carried out in an atmosphere, for example, of a mixed gas of N$_2$ and O$_2$ (having a composition, for example, of 99% of N$_2$ and 1% of O$_2$) at a temperature of 550 to 750° C. (e.g. 650° C.) or 580 to 620° C. (e.g. 600° C.). When O$_2$ is mixed with N$_2$, the activation becomes likely to occur. Alternatively, a nitrogen halide (NF$_3$, NCl$_2$ or the like) serving as a starting material for F or Cl that has high electronegativity like O and N may be mixed with an atmosphere of N$_2$ or a mixed gas of N$_2$ and O$_2$. The thermal treatment time is, for example, at five minutes to two hours, preferably 40 minutes to two hours and more preferably about 10 to 60 minutes. The reason why the thermal treatment temperature is relatively low is to prevent the active layer 16 from degrading during the thermal treatment. It will be noted that the thermal treatment may be effected after the epitaxial growth of the p-type nitride-based III-V Group compound semiconductor layer 18, but prior to the formation of the p-side electrode 19.

Next, the n-type nitride-based III-V Group compound semiconductor layer 16, active layer 17 and p-type nitride-based III-V Group compound semiconductor layer 18 are patterned in a desired form, for example, by a RIE method, a powder blasting method, a sand blasting method or the like to form a mesa portion 20.

Next, an n-side electrode 21 is formed on the nitride-based III-V Group compound semiconductor layer 15 at a portion adjacent to the mesa portion 20.

If necessary, the substrate on which such a light-emitting diode structure has been formed may be polished or lapped from the backside thereof to decrease the thickness thereof, followed by scribing of the substrate 11 to form a bar. Thereafter, the bar is scribed to provide a chip.

In this way, an intended light-emitting diode is made.

Figure 6:
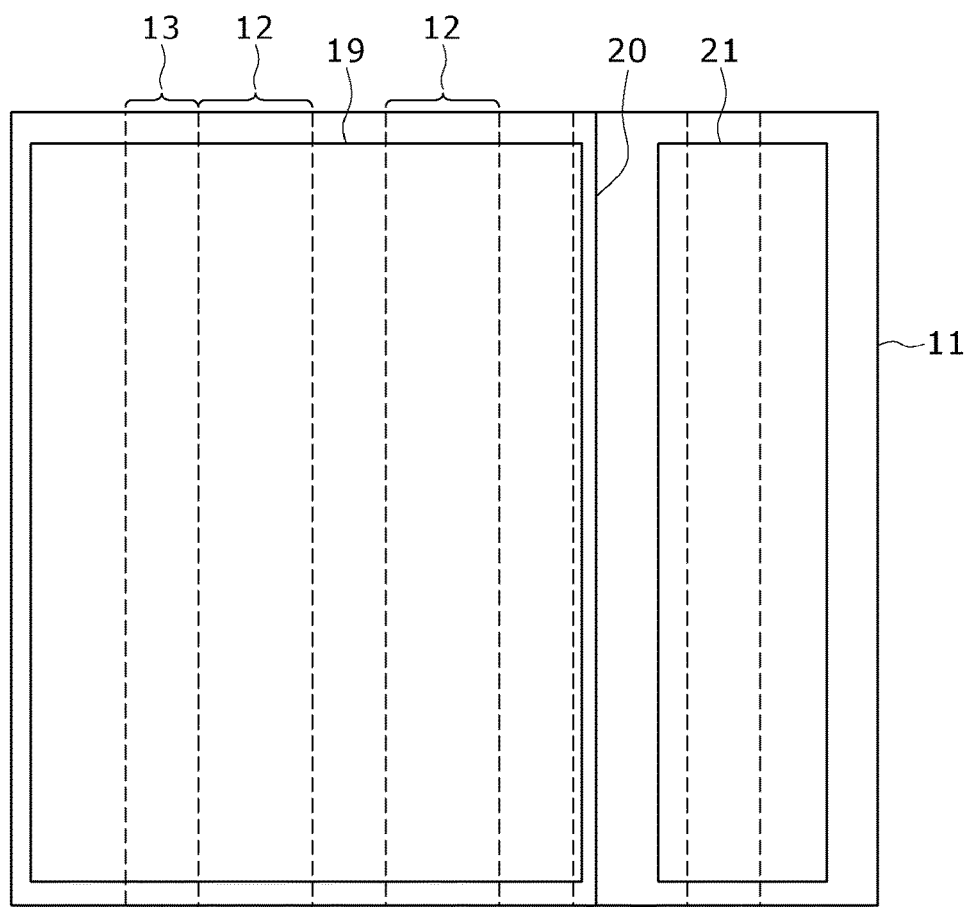
FIG. 6 is a plan view showing a light-emitting diode manufactured by the method of manufacturing a light-emitting diode according to the embodiment of the invention.
Figure 7:
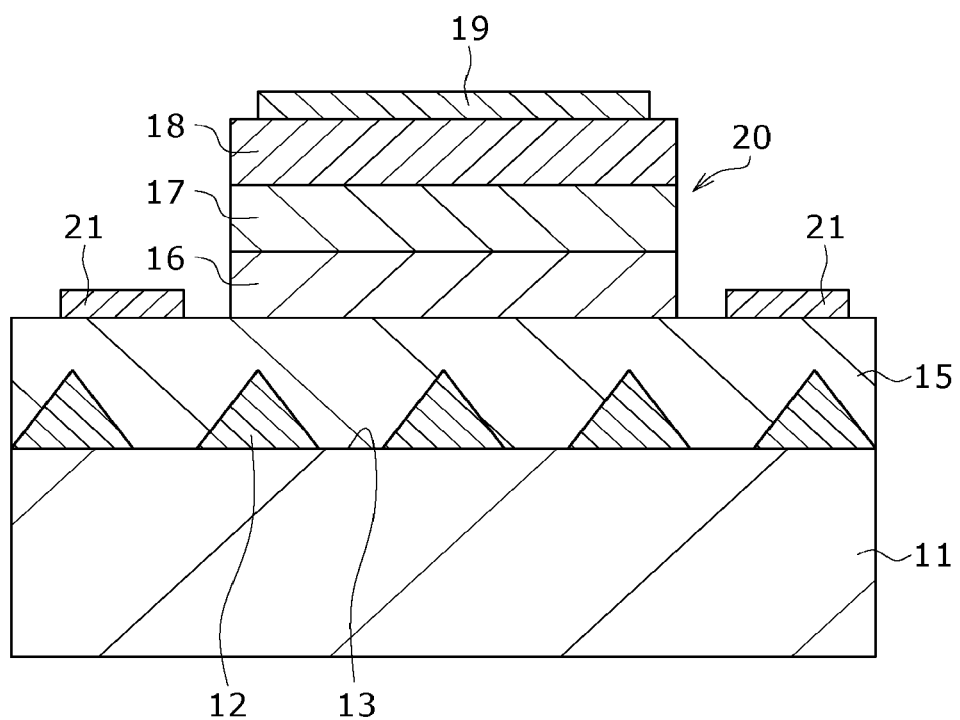
FIG. 7 is a sectional view of other structural example of the light-emitting diode manufactured according to the embodiment of the invention.
Figure 8:
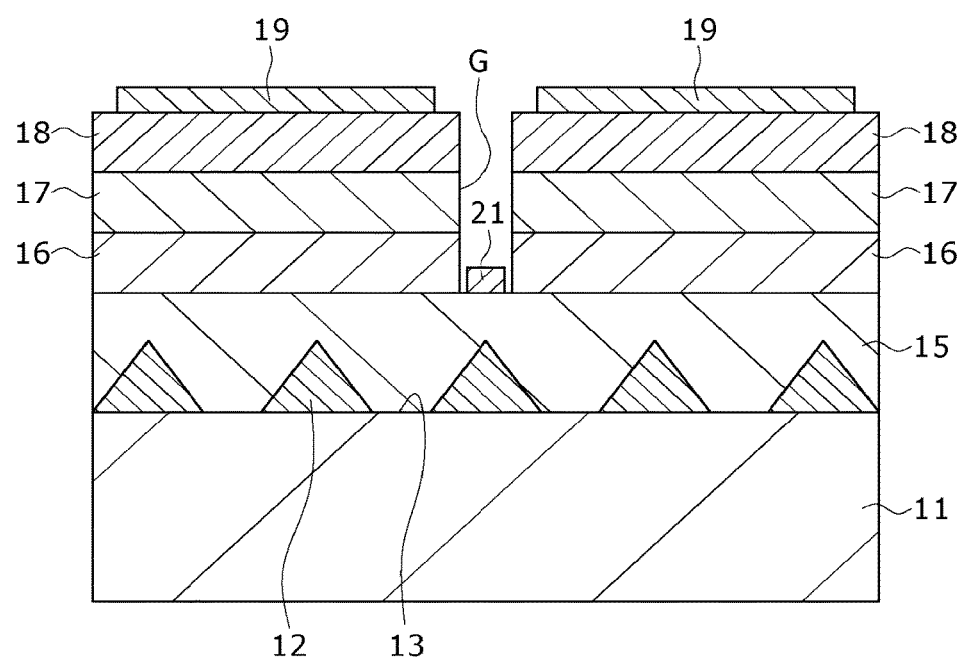
FIG. 8 is a sectional view of other structural example of the light-emitting diode manufactured according to the embodiment of the invention.
Figure 9:
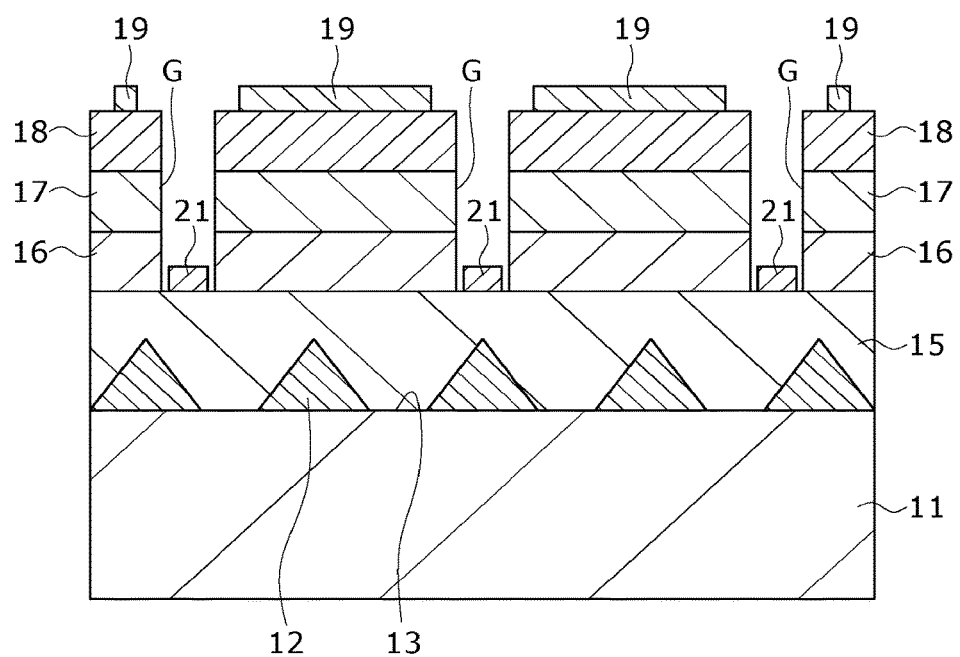
FIG. 9 is a sectional view of other structural example of the light-emitting diode manufactured according to the embodiment of the invention.
Figure 10:
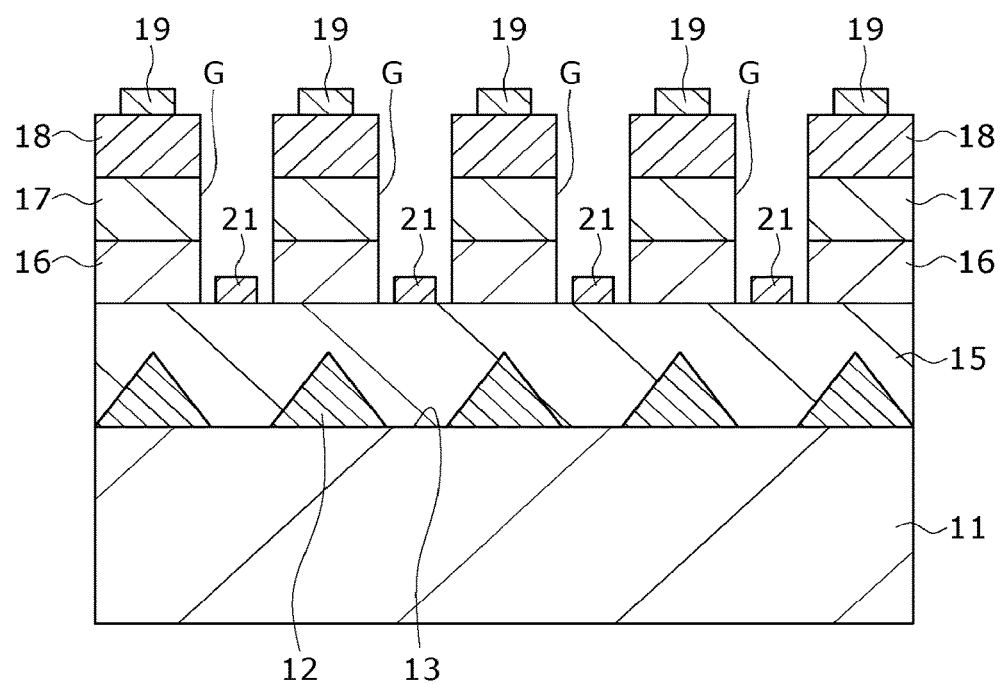
FIG. 10 is a sectional view of other structural example of the light-emitting diode manufactured according to the embodiment of the invention.

An instance of planar shapes of the p-side electrode 19 and the n-side electrode 21 is shown in FIG. 6 in the case where the protruded portion has a striped form extending in one direction.

The starting materials for the growth of the nitride-based III-V Group compound semiconductor layer include triethyl gallium (($C_2H_5$)$_3$Ga, TEG) or trimethyl gallium (($CH_3$)$_3$Ga, TMG) for a starting material for Ga, trimethyl aluminium (($CH_3$)$_3$Al, TMA) for a starting material for Al, triethyl indium (($C_2H_5$)$_3$In, TMI) or trimethyl indium (($CH_3$)$_3$In, TMI) for a starting material for In, and ammonia for a starting material for N. Dopants used include an n-type dopant such as, for example, silane ($SiH_4$) or disilane ($Si_2H_6$) and a p-type dopant such as, for example, bis(methylcyclopentadienyl)magnesium (($CH_3C_5H_4$)$_2$Mg), bis(ethylcyclopentadienyl)magnesium (($C_2H_6C_5H_4$)$_2$Mg), or bis(cyclopentadienyl)magnesium (($C_5H_4$)$_2$Mg). For a carrier gas atmosphere used upon growth of the nitride-based III-V Group compound semiconductor layers, $H_2$ gas is used, for example.

A specific structural example of the light-emitting diode is now described. More particularly, for example, the nitride-based III-V Group compound semiconductor layer 15 is an n-type GaN layer, the nitride-based III-V Group compound semiconductor layer 16 is constituted, in order from below, of an n-type GaInN layer, an n-type GaN layer and an n-type GaInN layer, and the p-type nitride-based III-V Group compound semiconductor layer 18 is made, in order from below, of a p-type GaInN layer, a p-type AlInN layer, a p-type GaN layer and a p-type GaInN layer. The active layer 17 has, for example, a GaInN-based multiple quantum well (MQW) structure (e.g. an alternate lamination of a GaInN quantum well layer and a GaN barrier layer). The In composition in the active layer 17 is selected depending on the emission wavelength of a light-emitting diode. For instance, the In content is up to 11% for an emission wavelength of 405 nm, up to 18% for 450 nm, and up to 24% for 520 nm. The material for the p-side electrode 19 includes, for example, Ag or Pd/Ag, or if necessary, barrier metals made of Ti, W, Cr, WN, CrN or the like in addition to the first-mentioned material. The n-side electrode 21 used may be, for example, one having a Ti/Pt/Au structure.

In the thus obtained light-emitting diode shown in FIG. 3, a forward voltage is applied between the p-side electrode 19 and the n-side electrode 21 for passage of a current to effect light emission, and the resulting light is extracted through the substrate 11 to outside. Proper selection of the In composition in the active layer 17 results in red to violet light emission, particularly, blue light emission, green light emission or red light emission. In this case, a light, which is directed to the substrate 11 among lights generated from the active layer 17, is refracted at the interface between the substrate 11 and the nitride-based III-V Group compound semiconductor layer 15 at the recess portion 13 and goes out to outside through the substrate 11. A light, directed to the p-side electrode 19 among the lights generated in the active layer 17, is reflected at the p-side electrode 19 and directed to the substrate 11, and goes out to outside through the substrate 11.

The structure of the light-emitting diode is not limited to that shown in FIG. 3 and may be, for example, those structures shown in FIGS. 7 to 11. With the structure shown in FIG. 7, the n-type nitride-based III-V Group compound semiconductor layer 16, active layer 17 and p-type nitride-based III-V Group compound semiconductor layer 18 are so patterned as to leave the central portions thereof, thereby forming the mesa portion 20. The p-side electrode 19 is formed on the p-type nitride-based III-V Group compound semiconductor layer 18 of the mesa portion 20, and the n-side electrode 21 is formed on the n-type nitride-based III-V Group compound semiconductor layer 15 at the opposite sides of the mesa portion 20. In the instance shown in FIG. 8, the n-type nitride-based III-V Group compound semiconductor layer 16, active layer 17 and p-type nitride-based III-V Group compound semiconductor layer 18 are, respectively, formed thereinto with a recessed portion G, for example, in the form of a slit groove with a small width or a columnar hole (e.g. the bottom surface of the column being circular, anglewise, point-like or the like) at the central portions thereof. A striped or point-like n-side electrode 21 is formed on the n-type nitride-based III-V Group compound semiconductor layer 15 at the bottom of the recessed portion G. Because the contact resistance of the n-side electrode 21 with the n-type nitride-based III-V Group compound semiconductor layer is low, such a small contact area of the n-side electrode 21 ensures a good ohmic contact characteristic, thereby permitting an electric current to be relatively readily prevailed throughout the n-type nitride-based III-V Group compound semiconductor layer 15 from the contact point (or contact face). The p-side electrode 19 is formed to surround the n-side electrode 21. Alternatively, the n-side electrode 21 may be formed to surround the p-side electrode 19. With an instance shown in FIG. 9, the n-type nitride-based III-V Group compound semiconductor layer 16, active layer 17 and p-type nitride-based III-V Group compound semiconductor layer 18 are, respectively, formed thereinto with a recessed portion G made of a slit groove of a small width or a columnar hole (e.g. the bottom surface of the column being circular, anglewise, point-like or the like) (when the recessed portion G is in the form of a columnar hole, a plurality of such recessed portions G are two-dimensionally arranged in the form of a honeycomb, a grid or spots on a dice (i.e. in the form of holes that are relatively distant from one another like holes indicating spots on a dice). In this case, an n-side electrode 21 is formed on the n-type nitride-based III-V Group compound semiconductor layer 15 at the bottom of the respective recessed portion G. If, for example, the recessed portions G are each in the form of such a columnar hole as mentioned above and are two-dimensionally formed in an arrangement of a honeycomb, a grid or spots on a dice, the p-side electrode 19 is formed to surround the n-side electrode 21. Alternatively, the n-side electrode is formed to surround the p-side electrode. With an instance shown in FIG. 10, the n-type nitride-based III-V Group compound semiconductor layer 16, active layer 17 and p-type nitride-based III-V Group compound semiconductor layer 18 are, respectively, formed thereinto with a recessed portion G in the form of a slit groove of a small width or a columnar hole (e.g. the bottom surface of the column being circular, anglewise or point-like) (when the recessed portion is in the form of a columnar hole, a plurality of such recessed portions G are two-dimensionally formed in an arrangement of a honeycomb, a grid or spots on a dice). The n-side electrode 21 is formed on the n-type nitride-based III-V Group compound semiconductor layer 15 at the bottom of each recessed portion G. For example, where the recessed portions G are each in the form of a columnar hole and are two-dimensionally formed in an arrangement of a honeycomb, a grid or spots on a dice, the p-side electrode 19 is formed to surround the n-side electrode 21 or the n-side electrode 21 is formed to surround the p-side electrode 19. With an instance shown in FIG. 11, the n-type nitride-based III-V Group compound semiconductor layer 16, active layer 17 and p-type nitride-based III-V Group compound semiconductor layer 18 are, respectively, formed thereinto with a recessed portion G in the form of a slit groove of a small width or a columnar hole (e.g. the bottom surface of the column being circular, anglewise, point-like or the like) (when the recessed portion G is in the form of a columnar hole, a plurality of the recessed portions G are formed in an arrangement of a honeycomb, a grid or spots on a dice). Each recessed portion G is formed with an insulating film I made of a $SiO_2$ film on a side wall thereof. An n-side electrode 21 is formed on the n-type nitride-based III-V Group compound semiconductor layer 15 at the bottom of each recessed portion in a condition of electric insulation with the n-type nitride-based III-V Group compound semiconductor layer 16, active layer 17 and p-type nitride-based III-V Group compound semiconductor layer 18 by means of the insulating film I to an extent of burying the recessed portion H therewith. For instance, where the recessed portions G are in the form of such a columnar hole as mentioned above and are two-dimensionally formed in an arrangement of a honeycomb, a grid or spots on a dice, the p-side electrode 19 is formed to surround the n-side electrode 21, or the n-side electrode 21 is formed to surround the p-side electrode 19. In the instances shown in FIGS. 7 to 11, particularly in FIG. 11, the wiring for the p-side electrode 19 and n-side electrode 21 is readily realized by use of a conventional double-layer wiring technique.

The structures of the light-emitting diodes illustrated hereinbefore are most suited, especially, as a structure for a flip-chip (FC) light-emitting diode in which a optically transparent substrate is used as the substrate 11 and light emission is effected from the entirety of a back side of the optically transparent substrate. For one of performance indices of the light-emitting diode, mention is made of (luminous efficiency)/(total chip area). For improving the index of this (luminous efficiency)/(total chip area), it is desirable to reduce the number of the recessed portions G, in which the active layer 17 has been removed, to an extent as small as possible or to reduce the bottom surface area of the recessed portion G to an extent as small as possible. Hence, taking the mobility of carriers (electrons) in the n-type nitride-based III-V Group compound semiconductor layer 15 into account, the total area of the n-side electrode 21 formed at the bottom of the recessed portion G is preferably at several tens of percent, more preferably several percent or below, and most preferably 1% or below, of the n-side electrode 21 of a columnar form relative to the total chip area, thereby ensuring satisfactory prevalence of an electric current throughout the active layer 17.

Figure 12:
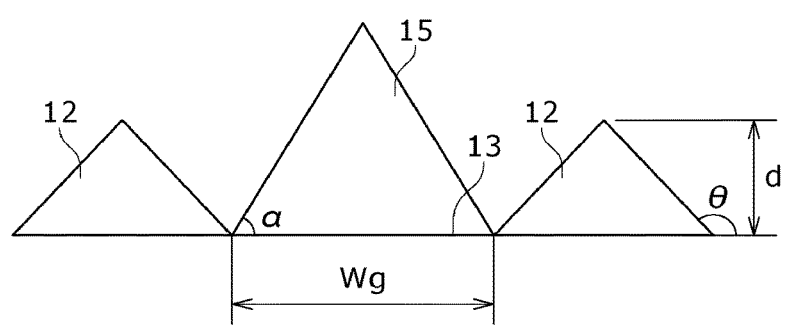
FIG. 12 is a schematic view showing a substrate used in the method of making a light-emitting diode according to the embodiment of the invention.

In the first embodiment, in order to minimize the threading dislocation density in the nitride-based III-V Group compound semiconductor layer 15, the width $W_g$ of the bottom surface of the recess portion 13, the depth d of the recess portion 13, i.e. the height of the of the protruded portion 12, and the angle α established between the inclined face of the nitride-based III-V Group compound semiconductor layer 15 in a state shown in FIG. 1C and the main surface of the substrate 11 are so determined as to satisfy the following equation (see FIG. 12)

$2d \geq W_g \tan \alpha$

For example, d≥1.75 μm for $W_g$=2.1 μm and α=59°, d≥1.66 μm for $W_g$=2 μm and α=59°, d≥1.245 μm for $W_g$=1.5 μm and α=59°, and d≥0.966 μm for $W_g$=1.2 μm and α=59°. In either case, it is preferred that d<5 μm.

For the growth of the nitride-based III-V Group compound semiconductor layer 15 in the steps shown in FIGS. 1B, 1C and 2A, it is preferred that the V/III ratio of the starting materials for growth is set at a relatively high value and the growth temperature is set at a relatively low level. More particularly, where the growth of the nitride-based III-V Group compound semiconductor layer 15 is carried out under a pressure of 1 atm, it is preferred that the V/III ratio of the starting materials is, for example, within a range of 13000±2000 and the growth temperature is set, for example, within a range of 1100±50° C. With respect to the V/III ratio of the starting materials, where the growth of the nitride-based III-V Group compound semiconductor layer 15 is carried out under pressure conditions of x atms, it is preferred to set the V/III ratio at a level obtained by the ratio times a variation of pressure squared in view of the Bernoulli's principle defining the relation between the flow rate and the pressure, particularly, substantially at $(13000±2000) \times x^2$. For instance, where the growth is performed at 0.92 atm (700 Torr), the V/III ratio of the starting materials is preferably set within a range of 11000±1700 (e.g. at 10530). x is preferably at 0.01 to 2 atms. With respect to the growth temperature, where the growth is carried out under pressure conditions of not higher than 1 atm, setting at a lower temperature is preferred so as to suppress the lateral growth of the nitride-based III-V Group compound semiconductor layer 15 and allow easy selective growth of the nitride-based III-V Group compound semiconductor layer 15 in the recess portion 13. For instance, when the growth is effected at 0.92 atms (700 Torr), it is preferred to set the growth temperature within a range of 1050±50° C. (e.g. at 1050° C.) In this way, the nitride-based III-V Group compound semiconductor layer 15 grows as is particularly shown in FIGS. 1B, 1C and 2A. Upon the growth, the nitride-based III-V Group compound semiconductor layer 15 does not start to grow from on the protruded portion 12. The growth rate is generally at 0.5 to 5 μm/hour, preferably about 3.0 μm/hour. Where the nitride-based III-V Group compound semiconductor layer 15 is made, for example, of a GaN layer, the flow rate of the starting material gas is, for example, at 20 SCCM for TMG and 20 SLM for $NH_3$. On the other hand, the growth (lateral growth) of the nitride-based III-V Group compound semiconductor layer 15 in the steps shown in FIGS. 2B and 2C is effected at a relatively low V/III ratio of the starting materials and at a relatively high growth temperature. More particularly, where the growth of the nitride-based III-V Group compound semiconductor layer 15 is carried out under pressure conditions of 1 atm, the V/III ratio of the starting materials is set, for example, within a range of 5000±2000 and the growth temperature is set, for example, within a range of 1200±50° C. With respect to the V/III ratio of the starting materials, where the growth of the nitride-based III-V Group compound semiconductor layer 15 is carried out under pressure conditions of x atms, it is preferred to set the V/III ratio at a level obtained by the ratio times a variation of pressure squared in view of the Bernoulli's principle defining the relation between the flow rate and the pressure, particularly, substantially at $(5000±2000) \times x^2$. For instance, where the growth is performed at 0.92 atm (700 Torr), the V/III ratio of the starting materials is preferably set within a range of 4200±1700 (e.g. at 4232). With respect to the growth temperature, where the growth is carried out under conditions of not higher than 1 atm, setting at a lower temperature is preferred so as to suppress the surface roughness of the nitride-based III-V Group compound semiconductor layer 15 and allow good lateral growth. For example, where the growth is effected at 0.92 atm (700 Torr), it is preferred to set the growth temperature within a range of 1150±50° C. (e.g. 1110° C.). Where the nitride-based III-V Group compound semiconductor layer 15 is made, for example, of a GaN layer, the flow rates of the starting material gases are, for example, at 40 SCCM for TMG and 20 SLM for $NH_3$. In this way, the nitride-based III-V Group compound semiconductor layer 15 is formed by lateral growth as shown in FIGS. 2B and 2C.

Figure 13:
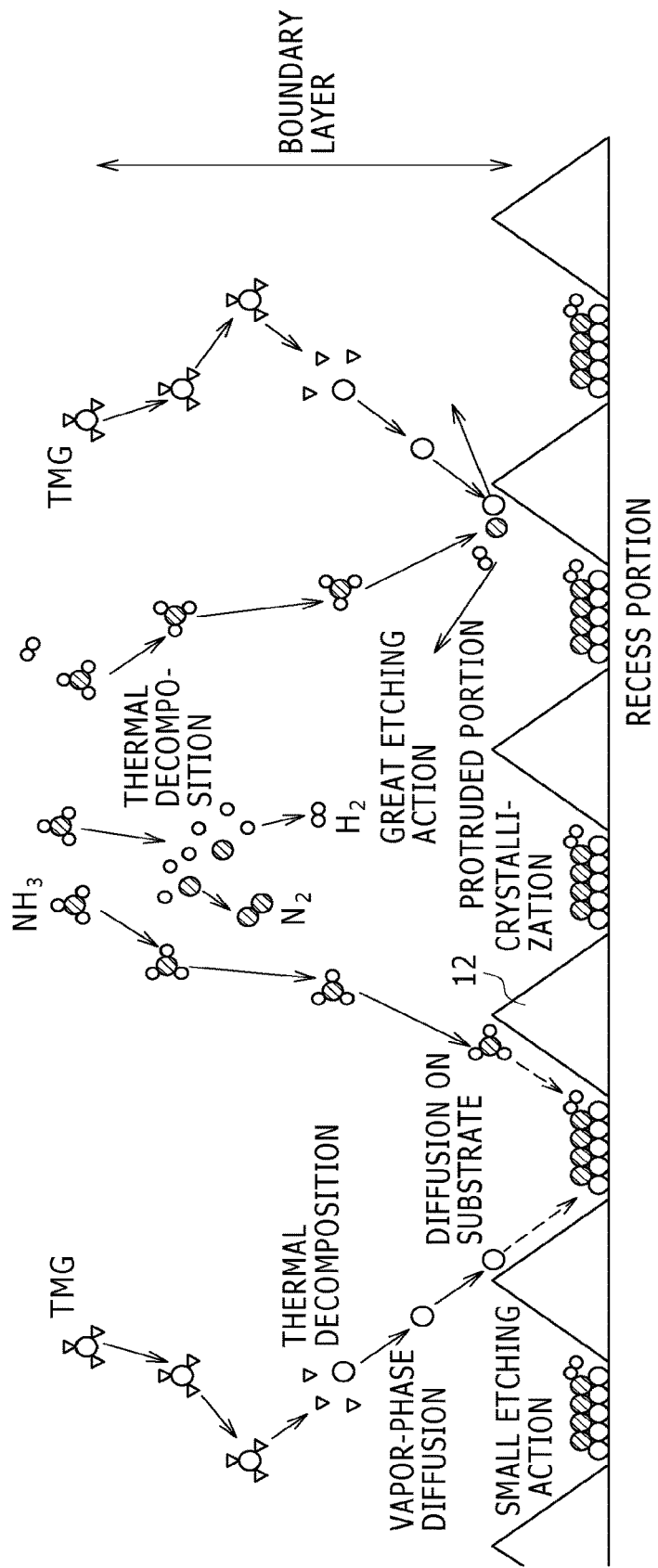
FIG. 13 is a schematic view illustrating how a nitride-based III-V Group compound semiconductor layer is grown on a substrate in the method of making a light-emitting diode according to the embodiment of the invention.

FIG. 13 schematically shows how the starting material gases flow and diffuse over the substrate at the stage of growth of a GaN layer indicated as an example of the nitride-based III-V Group compound semiconductor layer 15. The most important point in this growth resides in that at the initial stage of the growth, GaN does not grow at the protruded portion 12 of the substrate 11 and the growth of GaN starts at the recess portion 12. It will be noted that although the protruded portion 12 is shown in the form of a triangle in section in FIG. 13, no GaN grows on the protruded portion 12 even if the section is in the form of a trapezoid. In general, when considering the case where TMG is used as a starting material for Ga and NH$_3$ is used as a starting material for N, GaN grows by direction reaction between NH$_3$ and Ga as represented by the following reaction formulas

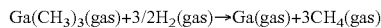

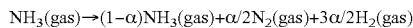

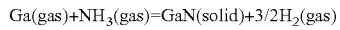

Although H$_2$ gas generates, this H$_2$ gas reversely acts on the crystal growth, or have etching action. In the steps shown in FIGS. 1B, 1C and 2A, growth on the protruded portion 12 is suppressed using the conditions which are not used for the growth of GaN on a conventional flat substrate, i.e. using the conditions of enhancing etching action and also conditions where growth is unlikely to occur (by increasing the V/III ratio). On the other hand, inside of the recess portion 13, crystallization occurs using the conditions of suppressed etching action. Traditionally, in order to improve the flatness of a grown crystal surface, the growth has been carried out under conditions where a degree of lateral growth increases (using a higher temperature). In the first embodiment, the growth is performed at a temperature lower than in the traditional case (e.g. at 1050±50° C.) for the purposes of bending threading dislocations toward a direction parallel to the main surface of the substrate to reduce the number thereof and burying the recess portion 13 with the nitride-based III-V Group compound semiconductor layer 15 at an early stage.

Figure 14:
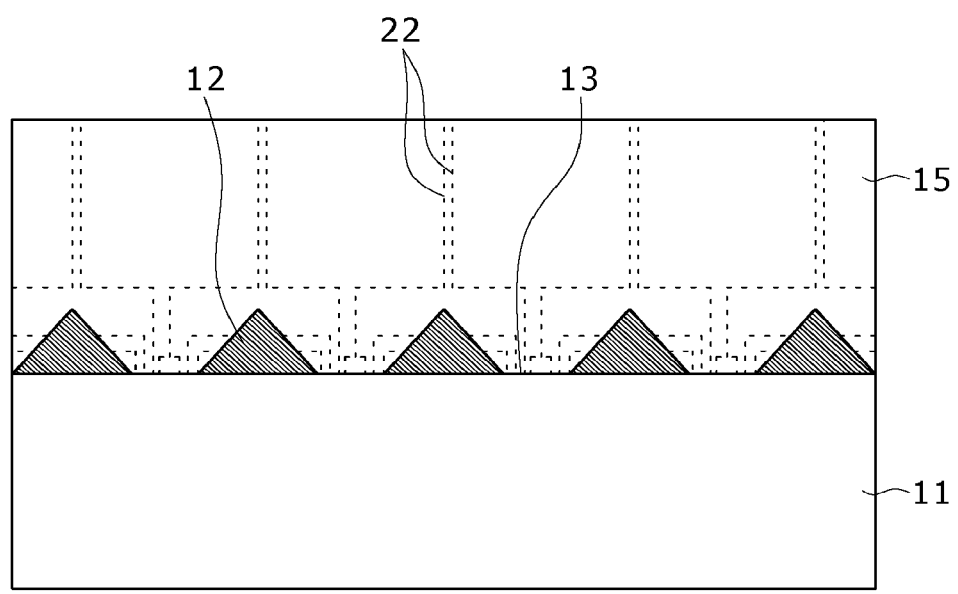
FIG. 14 is a schematic view illustrating the behavior of a dislocation observed through TEM observation of the nitride-based III-V Group compound semiconductor layer grown on a substrate in the method of manufacturing a light-emitting diode according to the embodiment of the invention.

FIG. 14 schematically shows the results of a study on a crystal defect distribution in the nitride-based III-V Group compound semiconductor layer 15 determined by a transmission electron microscope (TEM). In FIG. 14, reference numeral 22 indicates a threading dislocation. As will be seen from FIG. 14, although the dislocation density becomes high in the vicinity of the center of the protruded portion 12, i.e. at a portion of combination between the nitride-based III-V Group compound semiconductor layers 15 grown from adjacent recess portions 13, the dislocation density becomes low at the other portions including a portion above the recess portion 13. For instance, where the depth of the recess portion is at d=1 μm and the width of the bottom surface is at W$_g$=2 μm, the dislocation density at this low dislocation density is at 6×10$^7$/cm$^2$, which is reduced by one to two orders of magnitude over the case where the surface-protruded substrate 11 is not used. In addition, it will be seen that no dislocation occurs in a direction vertical to the side walls of the recess portion 13.

In FIG. 14, the average thickness of a region of the nitride-based III-V Group compound semiconductor layer 15 in contact with the substrate 11 at the recess portion 13 where the dislocation density is high and crystallinity is poor is about 1.5 times the average thickness of a region of the nitride-based III-V Group compound semiconductor layer 15 in contact with the substrate at the protruded portion 12 where the dislocation density is high and crystallinity is poor. This results from the lateral growth of the nitride-based III-V Group compound semiconductor layer 15 on the protruded portion 12.

Figure 15:
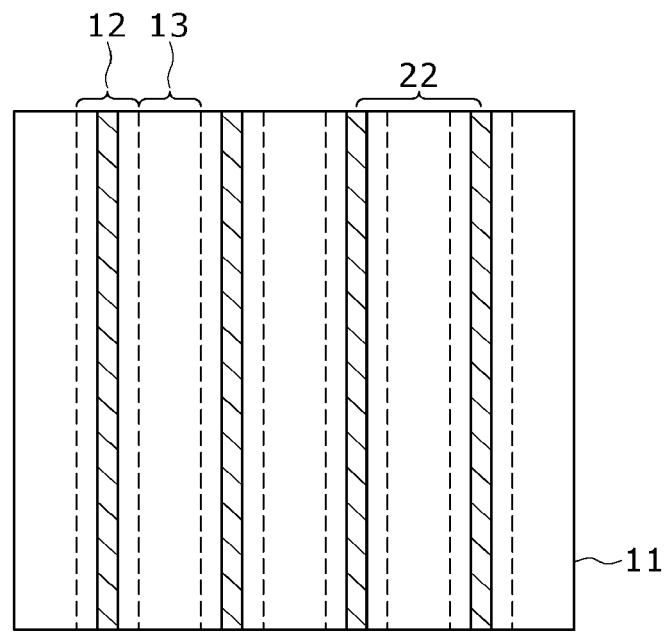
FIG. 15 is a schematic view showing an example of a distribution of threading dislocations in the nitride-based III-V Group compound semiconductor layer grown on a substrate in the method of manufacturing a light-emitting diode according to the embodiment of the invention.
Figure 16:
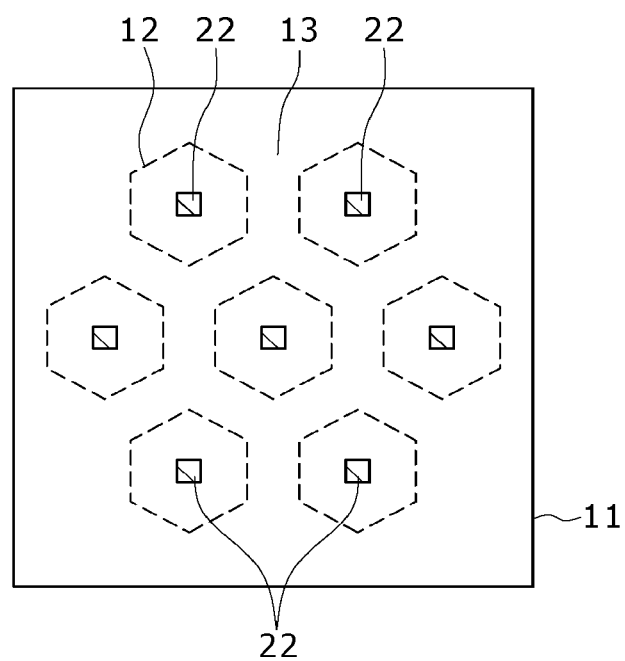
FIG. 16 is a schematic view showing an example of a distribution of threading dislocations in the nitride-based III-V Group compound semiconductor layer grown on a substrate in the method of manufacturing a light-emitting diode according to the first embodiment of the invention.

FIG. 15 shows a distribution of threading dislocations 22 in case where the protruded portion 12 has such a planar shape as shown in FIG. 4. FIG. 16 shows a distribution of threading dislocations 22 in case where the protruded portion 12 has such a planar shape as shown in FIG. 5.

Next, how the nitride-based III-V Group compound semiconductor layer 15 grows from an initial stage of growth and how dislocations propagate are illustrated with reference to FIG. 17A to FIG. 17F.

When the growth is initiated, a plurality of micronuclei 14 made of a nitride-based III-V Group compound semiconductor are produced at the bottom surface of the recess 13 as shown in FIG. 17A. In these micronuclei 14, a dislocation (indicated by dotted line) propagates from the interface with the substrate 11 in a vertical direction and goes through from the side faces of the micronucleus 14. When the growth is continued, a nitride-based III-V Group compound semiconductor layer 15 grows through the steps of growth and combination of the micronuclei 14 as shown in FIGS. 17B and 17C. During the course of the growth and combination of the micronuclei 14, bending of dislocations in directions parallel to the main surface of the substrate 11 takes place, so that dislocations going through to the upper portion are reduced in number. As the growth is further continued, as shown in FIG. 17D, the nitride-based III-V Group compound semiconductor layer 15 is formed as an isosceles triangle in section in which the bottom surface of the recess portion 13 is a base of the triangle. At this stage, the dislocations going through from the nitride-based III-V Group compound semiconductor layer 15 to the upper portion are significantly reduced in number. Next, as shown in FIG. 17E, the nitride-based III-V Group compound semiconductor layer 15 is laterally grown. In this step, dislocations that go through to the side faces of the nitride-based III-V Group compound semiconductor layer 15 having an isosceles triangle in section in which the bottom surface of the recess portion 13 is provided as a base behave such that some dislocations positioned at a level lower than the protruded portion 12 continuedly extend to the side face of the protruded portion 12 in parallel to the main surface of the substrate 11 and disappear, and some dislocations positioned at a level higher than the protruded portion 12 extend parallel to the main surface of the substrate 11 and go through to the side face of the laterally grown nitride-based III-V Group compound semiconductor layer 15. When the lateral growth of the nitride-based III-V Group compound semiconductor layer 15 is further continued, nitride-based III-V Group compound semiconductor layers 15 grown from opposite sides of the protruded portion 12 combine together at the top of the protruded portion 12 and finally, the nitride-based III-V Group compound semiconductor layer 15 becomes a flat surface parallel to the main surface of the substrate 11 as shown in FIG. 17F. The dislocation in the nitride-based III-V Group compound semiconductor layer 15 is bent upwardly (in a direction vertical to the main surface of the substrate 11) when the layers are combined together over the protruded portion 12.

Figure 18A:
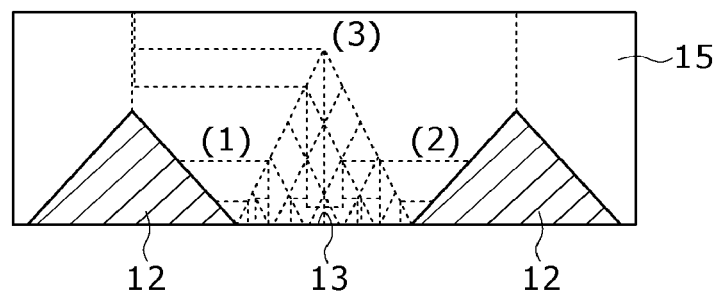
FIGS. 18A and 18B are, respectively, a schematic view illustrating the behavior of a dislocation in the nitride-based III-V Group compound semiconductor layer grown on a substrate in the method of manufacturing a light-emitting diode according to the embodiment of the invention.
Figure 18B:
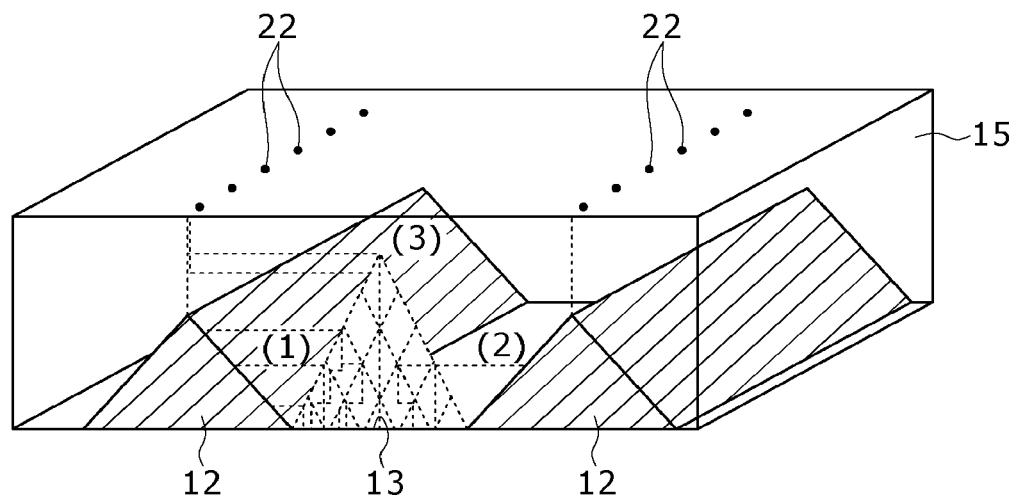

With reference to FIGS. 18A and 18B, the behavior of dislocations in the course of from the formation of the micronuclei 14 to after the lateral growth of the nitride-based III-V Group compound semiconductor layer 15 is illustrated again. As shown in FIGS. 18A and 18B, dislocations occurring from the interface with the substrate 11 in the course of the formation, growth and combination of the micronuclei 14 are repeatedly bent in horizontal directions and bundled (dislocation (1)). The dislocations bent in horizontal directions extend to the side face of the protruded portion 12 and disappear (dislocation (2)). Moreover, a dislocation occurring from the interface with the substrate 11 is bent once and goes through to the surface of the nitride-based III-V Group compound semiconductor layer 15 (dislocation (3)). By the bundling of the dislocations and the disappearance after extension of the dislocations bent in horizontal directions to the side faces of the protruded portion 12, there can be obtained a nitride-based III-V Group compound semiconductor layer 15 which is reduced in number of threading dislocations over the case where no micronuclei 14 are formed.

Figure 19A:
FIGS. 19A to 19C are, respectively, a photograph showing the initial state of growth of the nitride-based III-V Group compound semiconductor layer grown on a substrate in the method of making a light-emitting device according to the embodiment of the invention.
Figure 19C:
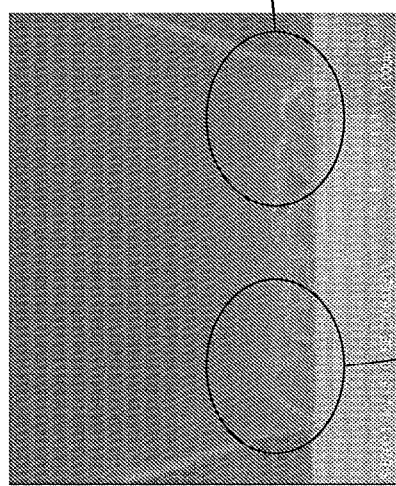
Figure 19B:
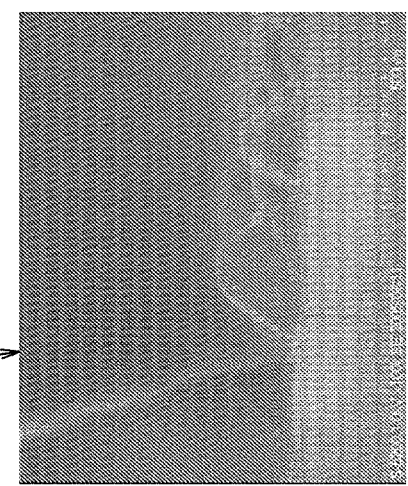

The TEM photographs of sections in the state where the micronuclei 14 are formed at the bottom surface of the protruded portion 13 as shown in FIG. 17A are shown in FIGS. 19A to 19C. FIGS. 19B and 19C are, respectively, an enlarged sectional TEM photograph of a portion surrounded by an oval in FIG. 19A. From FIGS. 19A to 19C, the formation of the micronuclei 14 at the initial stage of growth will be well seen.

Next, how the behavior of dislocations occurring in the nitride-based III-V Group compound semiconductor layer 15 differ between the case where micronuclei 14 are formed at an initial stage of growth and the case where no micronuclei 14 are formed is illustrated.

Figure 20A:
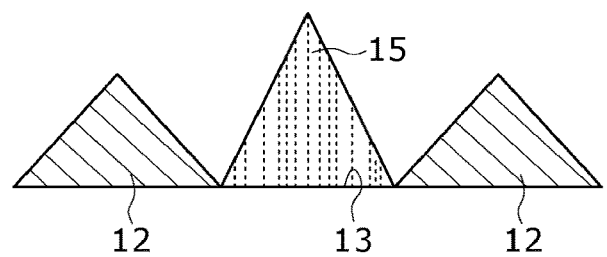
FIGS. 20A to 20C are, respectively, a schematic view showing the state of growth in case where no formation of micronuclei is involved at the initial stage of growth of the nitride-based III-V Group compound semiconductor layer on a substrate in the method of manufacturing a light-emitting diode according to the embodiment of the invention.
Figure 20B:
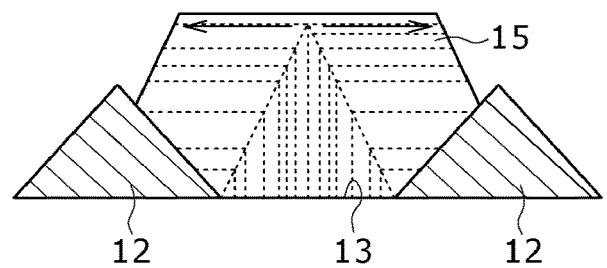
Figure 20C:
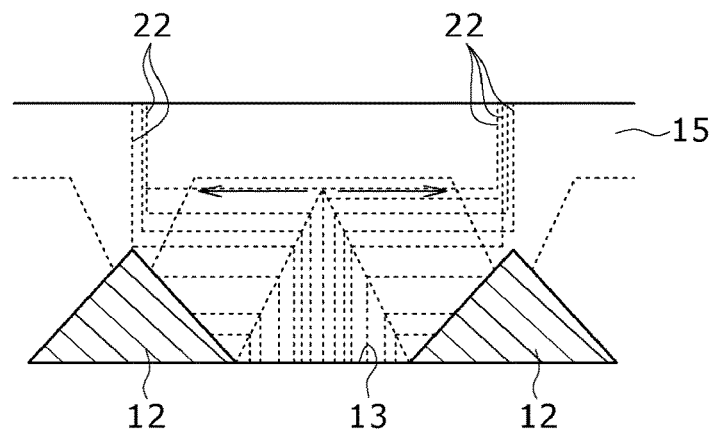

FIGS. 20A to 20C, respectively, show states corresponding to FIGS. 17D to 17F in the case where no micronuclei 14 occur at an initial stage of growth of the nitride-based III-V Group compound semiconductor layer 15. As shown in FIG. 20A, where no micronuclei 14 occur at the initial stage of growth, only dislocations extending upwardly from the interface with the bottom surface of the recess portion 13 exist at the time when the nitride-based III-V Group compound semiconductor layer 15 is so grown as to have an isosceles triangle in section in which the bottom surface of the recess portion 13 constitutes a base of the triangle, and this dislocation density is generally greater than in the case of FIG. 17D. As shown in FIG. 20B, when the growth is continued, dislocations going through to the side faces of the nitride-based III-V Group compound semiconductor layer 15 having an isosceles triangle in section using the bottom surface of the recess portion 13 as a base are so behaved as follows. Dislocations positioned at a level lower than the protruded portion 12 continuedly extend to the side faces of the protruded portion 12 in parallel to the main surface of the substrate 11 and disappear, and dislocations positioned at a level higher than the protruded portion 12 extend in parallel to the main surface of the substrate 11 and go through to the side faces of the laterally grown nitride-based III-V Group compound semiconductor layer 15. As shown in FIG. 20C, when the lateral growth of the nitride-based III-V Group compound semiconductor layer 15 is further continued, nitride-based III-V Group compound semiconductor layers 15 grown from the opposite side of the protruded portion 12 mutually combine together over the protruded portion 12, and the nitride-based III-V Group compound semiconductor layer 15 finally results in a flat surface parallel to the main surface of the substrate 11. The dislocations in the nitride-based III-V Group compound semiconductor layer 15 upwardly bend upon the mutual combination over the protruded portion 12, resulting in threading dislocations 22.

Figure 21A:
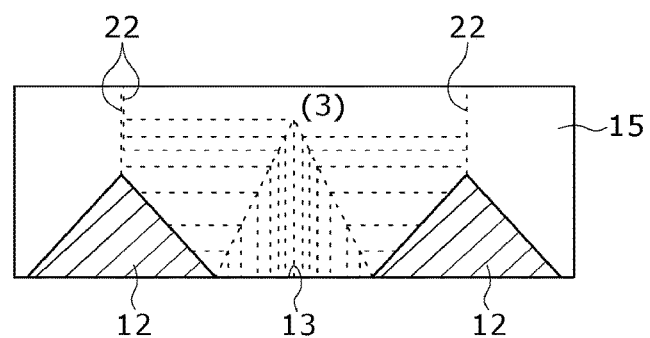
FIGS. 21A and 21B are, respectively, a schematic view showing the state of growth in case where no formation of micronuclei is involved at the initial stage of growth of the nitride-based III-V Group compound semiconductor layer on a substrate in the method of manufacturing a light-emitting diode according to the embodiment of the invention.
Figure 21B:
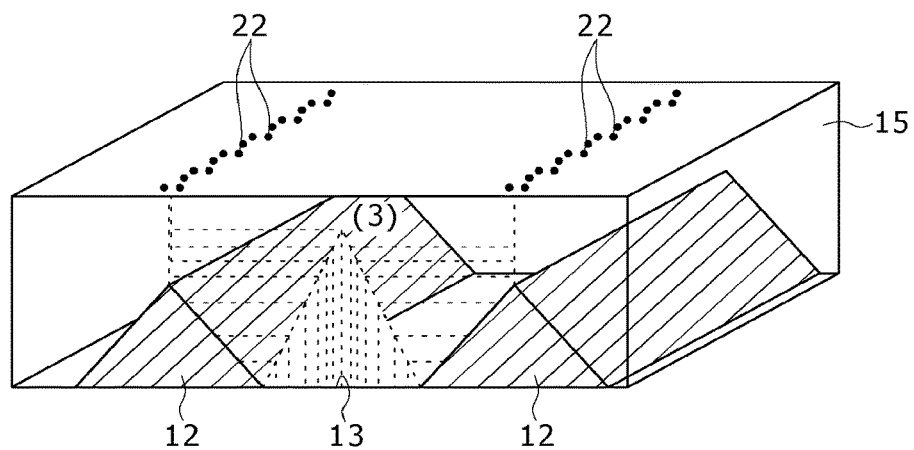

Although the density of the threading dislocations 22 is satisfactorily low, it is higher than in case where micronuclei 14 are formed on the bottom surface of the recess portion at the initial stage of growth. This is because as shown in FIGS. 21A and 21B, dislocations occurring from the interface with the substrate 11 in case where no micronuclei 14 are formed bend once in horizontal directions when arriving at an inclined face of an isosceles triangle using the bottom surface of the recess portion as a base. More particularly, in this case, no effect of bundling dislocations in the course of the formation, growth and combination of the micronuclei 14 is obtained.

Figure 22:
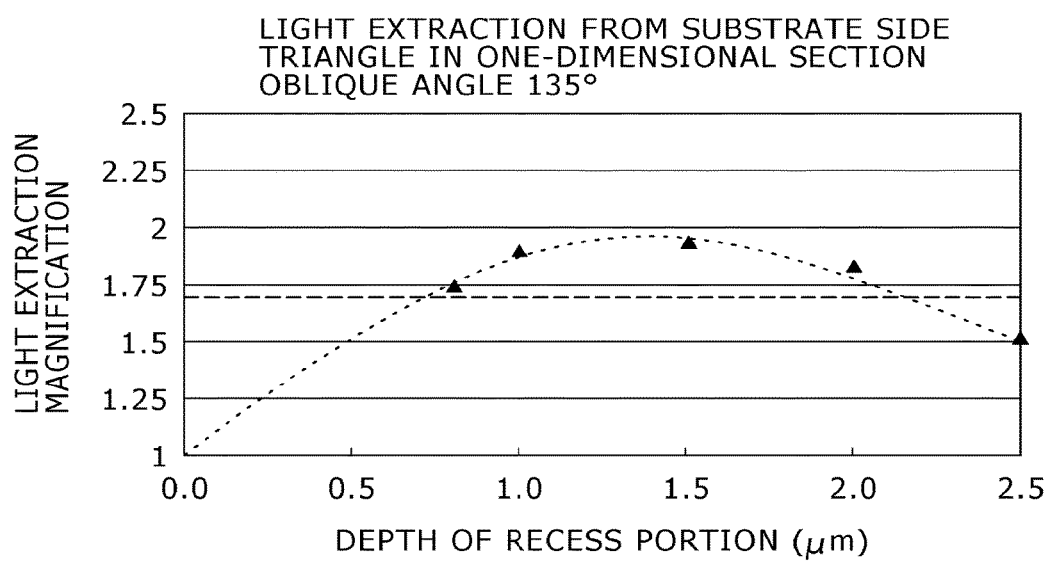
FIG. 22 is a schematic view showing the results of ray tracing simulation of the light-emitting diode manufactured according to the embodiment of the invention.

FIG. 22 shows one of the results of simulation (ray tracing simulation) as to how an efficiency of light extraction from a light-emitting diode to outside is improved when comparing the case where the depth of the recess of the substrate 11 is changed with the case where no irregularity is formed. The light extraction is carried out from the bask side of the substrate 11. In FIG. 22, the abscissa indicates a depth of the recess portion 13 (i.e. the height of the protruded portion 12) and the ordinate indicates a degree of improvement in light extraction efficiency η (light extraction magnification) in case where no protruded portion 12 is formed. In this connection, the protruded portion 12 has a striped shape extending in one direction, and an angle θ made between the side face of the protruded portion 12 and one main surface of the substrate 12 is at 135°, the length $W_g$ of the base of the recess portion 13 is at 2 μm, and the length of the base of the protruded portion 12 is at 3 μm. It is presumed that the refractive index of the substrate 11 is at 1.77 and the refractive index of the nitride-based III-V Group compound semiconductor layer 15 is at 2.35. From FIG. 22, the light extraction magnification is at 1.35 times or over for a depth of the recess portion 13 of 0.3 μm or over, at 1.5 times or over for a depth of 0.5 μm to 2.5 μm, at 1.75 times for 0.7 μm to 2.15 μm, at 1.85 times or over for 1 μm to 1.75 μm, and at a maximum value (of about 1.95 μm) for about 1.3 mm.

Figure 23:
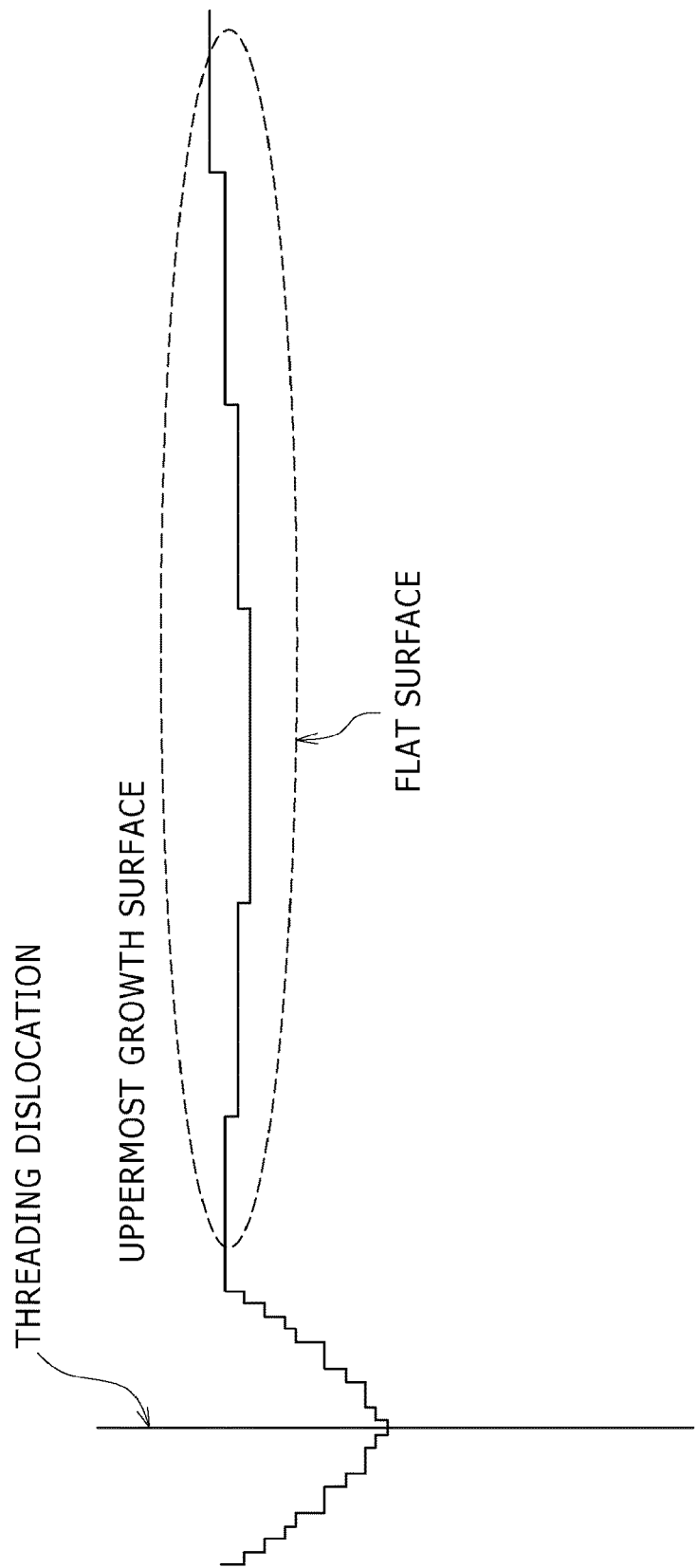
FIG. 23 is a schematic view illustrating the surface flatness of an active layer of the light-emitting diode manufactured according to the embodiment of the invention.
Figure 24:
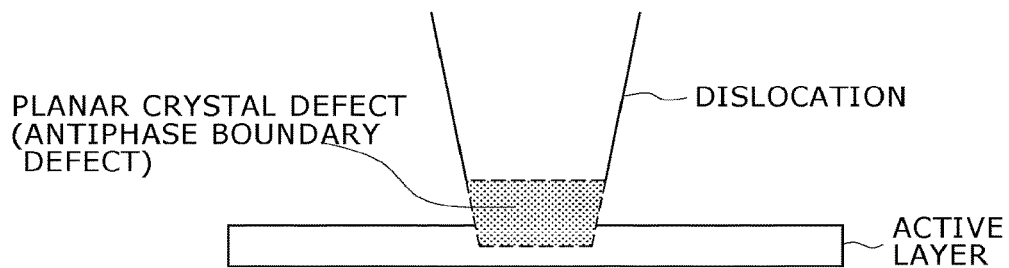
FIG. 24 is a schematic view illustrating the surface flatness of an active layer of the light-emitting diode manufactured according to the embodiment of the invention.

Next, consideration is given to the growth surface state in the vicinity of the active layer 17. In general, if threading dislocations exist in a growth layer, growth pits or the like occurs, thereby worsening the flatness of the growth surface as shown in FIG. 23. A higher threading dislocation density results in a greater degree of worsening. If threading dislocations exist in the active layer 17, fluctuation in thickness and composition takes place within the plane thereof, which causes inplane inhomogeneity of an emission wavelength and planar crystal defects such as an antiphase boundary defect to occur, thereby inviting a lowering of luminous efficiency (i.e. a lowering of internal quantum efficiency). In contrast, according to the first embodiment, the threading dislocation density in the nitride-based III-V Group compound semiconductor layer 15 is so significantly reduced as stated hereinbefore. Accordingly, the threading dislocation in the active layer 17 formed on the layer 15 also becomes low, so that the lowering of luminous efficiency ascribed to the threading dislocation is very small and thus, a higher luminous efficiency over a known counterpart can be obtained.

The threading dislocations in the nitride-based III-V Group compound semiconductor layer 15 concentrate in the vicinity of the central portion of the protruded portion of the substrate 11 and are regularly arranged according to the arrangement of the protruded portions 12, under which the threading dislocations in the active layers 17 are regularly arranged accordingly. Thus, an area of a portion where the flat surface of the active layer 17 is formed significantly increases when compared with the case where threading dislocations are randomly distributed, so that the luminous efficiency can be further improved thereby.

Further, when the growth surface is roughened, for example, in case where the In content in the active layer is high, crystal defects in the form of complexes of planar crystal defects such as an antiphase boundary defect and dislocations are liable to freshly occur from the active layer 17, thereby inviting a lowering of luminous efficiency. In contrast, according to the first embodiment of the invention, the surface flatness of the active layer 17 is remarkably improved as stated hereinbefore, so that such crystal defects are suppressed from occurring, with a luminous efficiency not lowering.

In order to improve the flatness of the growth surface of the active layer 17 and reduce the planar crystal defects in number, it is effective to constitute a barrier layer of the active layer 17 by use of Al-doped GaN, Al-doped GaInN, AlGaN or the like (see U.S. Pat. No. 3,543,628).

As stated hereinabove, according to the first embodiment, no space is formed between the substrate 11 and the nitride-based III-V Group compound semiconductor layer 15, so that the lowering of light extraction efficiency due to the space can be prevented. The threading dislocations in the nitride-based III-V Group compound semiconductor layer 15 concentrate in the vicinity of the central portion of the protruded portion 12 of the substrate 11, and a dislocation density at the other portions is, for example, as low as about $6 \times 10^7/cm^2$ and is thus remarkably reduced over the case using a conventionally indented substrate. Accordingly, the crystallinity of the nitride-based III-V Group compound semiconductor layer 15 and a nitride-based III-V Group compound semiconductor layer such as for the active layer 17 grown thereon is much improved, with a considerable reduction in number of non-emission centers. In this manner, there can be obtained a nitride-based III-V Group compound semiconductor-based light-emitting diode whose luminous efficiency is very high.

Additionally, epitaxial growth necessary for manufacturing the nitride-based III-V Group compound semiconductor-based light-emitting diode is needed only once. Not only no growth mask is necessary, but also the protruded portion 12 on the substrate 11 can be formed by forming, on the substrate 11, a film serving as a material for the protruded portion 12, e.g. an $SiO_2$ film, an SiON film, an SiN film, a CrN film, a CrON film or the like, and processing the film such as by etching, a powder blasting method, a sand blasting method or the like. Thus, no processing of the substrate 1 such as a sapphire substrate that is difficult in indentation processing is needed. Eventually, there can be manufactured a light-emitting diode using nitride-based III-V Group compound semiconductors by a simple procedure at low costs.

Next, a second embodiment of the invention is described.

Figure 25A:
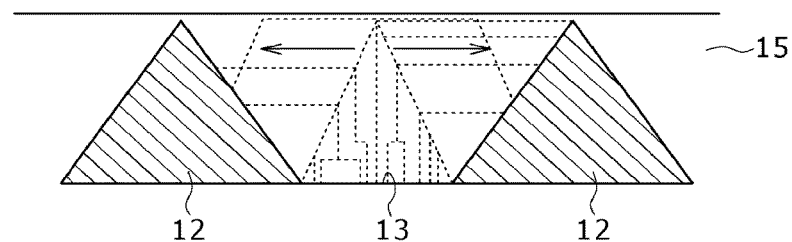
FIGS. 25A and 25B are, respectively, a sectional view illustrating a method for manufacturing a light-emitting diode according to another embodiment of the invention.
Figure 25B:
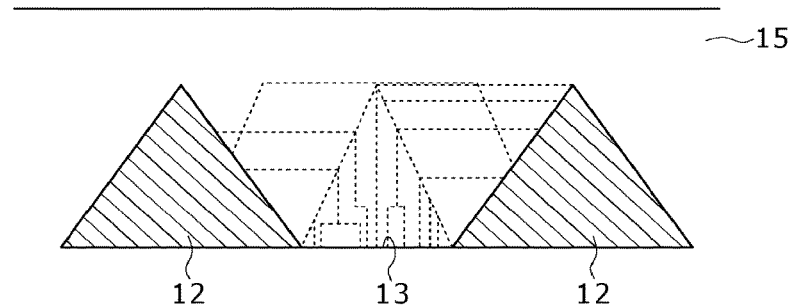

In this second embodiment, at the time when the nitride-based III-V Group compound semiconductor layer 15 is grown to an extent of making an isosceles triangle in section using the bottom surface of the recess portion 13 as a base thereof, the height of the protruded portion 12 is so selected that the height of the nitride-based III-V Group compound semiconductor layer 15 is lower than the height of the protruded portion 12. For an instance, the case where the height of the nitride-based III-V Group compound semiconductor layer 15 is equal to the height of the protruded portion 12 is shown in FIGS. 25A and 25B. This leads to the fact that all dislocations, which occur from the interface with the substrate 11 and go through to the side faces of the nitride-based III-V Group compound semiconductor layer 5 having an isosceles triangle in section using the bottom surface of the recess portion 13 as a base thereof, continuedly extend to the side face of the protruded portion 12 in parallel to the main surface of the substrate 1 and finally disappear. Hence, the threading dislocations 22 passing through to the surface of the nitride-based III-V Group compound semiconductor layer 15 are considerably reduced in number, thereby permitting a threading dislocation density to be substantially at zero.

The second embodiment other than those described above is similar to the first embodiment.

According to the second embodiment, since the nitride-based III-V Group compound semiconductor layer 15 whose threading dislocation density is substantially at zero can be grown, a substantially dislocation-free nitride-based III-V Group compound semiconductor substrate can be obtained. For example, when an n-type nitride-based III-V Group compound semiconductor layer 16, an active layer 17 and a p-type nitride-based III-V Group compound semiconductor layer 18 are grown on this dislocation-free nitride-based III-V Group compound semiconductor substrate, dislocation densities in these layers can be remarkably reduced, with the attendant advantage that a nitride-based III-V Group compound semiconductor-based light-emitting diode having very good characteristics can be realized. Needless to say, similar advantages as in the first embodiment can also be obtained.

Next, a third embodiment of the invention is described.

Figure 26:
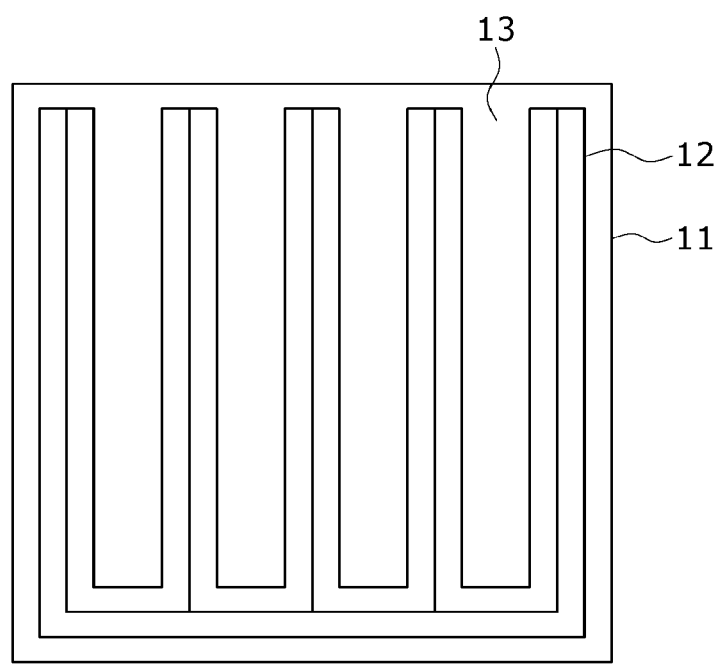
FIG. 26 is a plan view showing the light-emitting diode manufactured by a method for manufacturing a light-emitting diode according to a further embodiment of the invention.

In the third embodiment, as shown in FIG. 26, a protruded portion 12 formed on a substrate 11 is shaped in the form of an isosceles triangle in section and in the form of a comb as viewed in plane.

The third embodiment other than those described above is similar to the first embodiment.

According to this third embodiment, similar advantages as in the first embodiment can be obtained.

A fourth embodiment of the invention is described.

Figure 27:
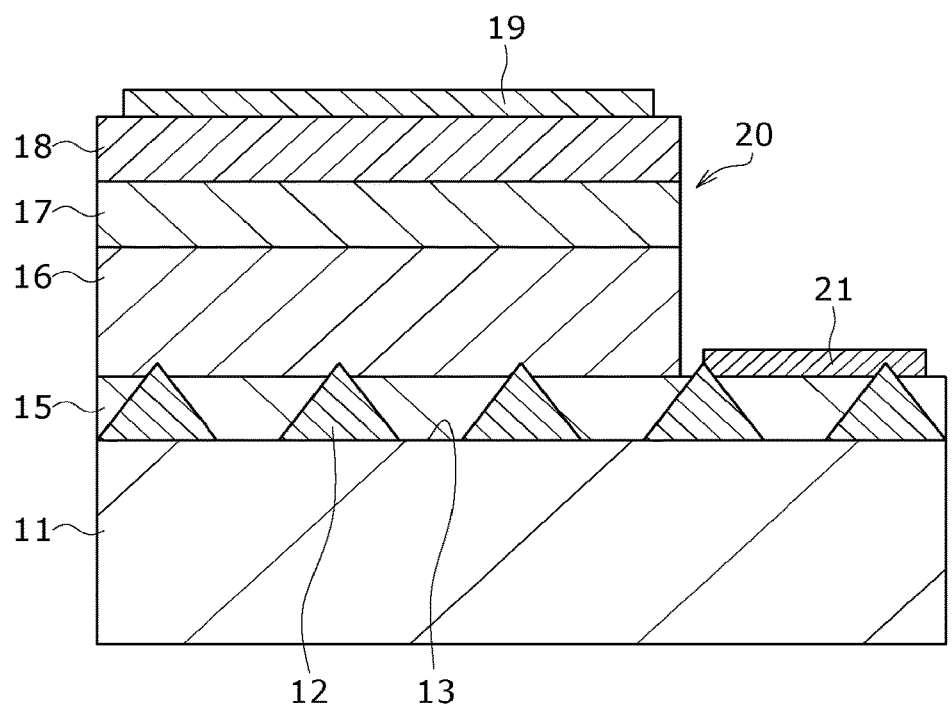
FIG. 27 is a sectional view illustrating a method for manufacturing a light-emitting diode according to a further embodiment of the invention.

In the fourth embodiment, as shown in FIG. 27, the thickness of the nitride-based III-V Group compound semiconductor layer 15 is smaller than the height of the protruded portion 12 and the top of the protruded portion 12 projects from the upper surface of the nitride-based III-V Group compound semiconductor layer 15.

The fourth embodiment other than those described above is similar to the first embodiment.

According to the fourth embodiment, similar advantages as in the first embodiment can be obtained.

Figure 28:
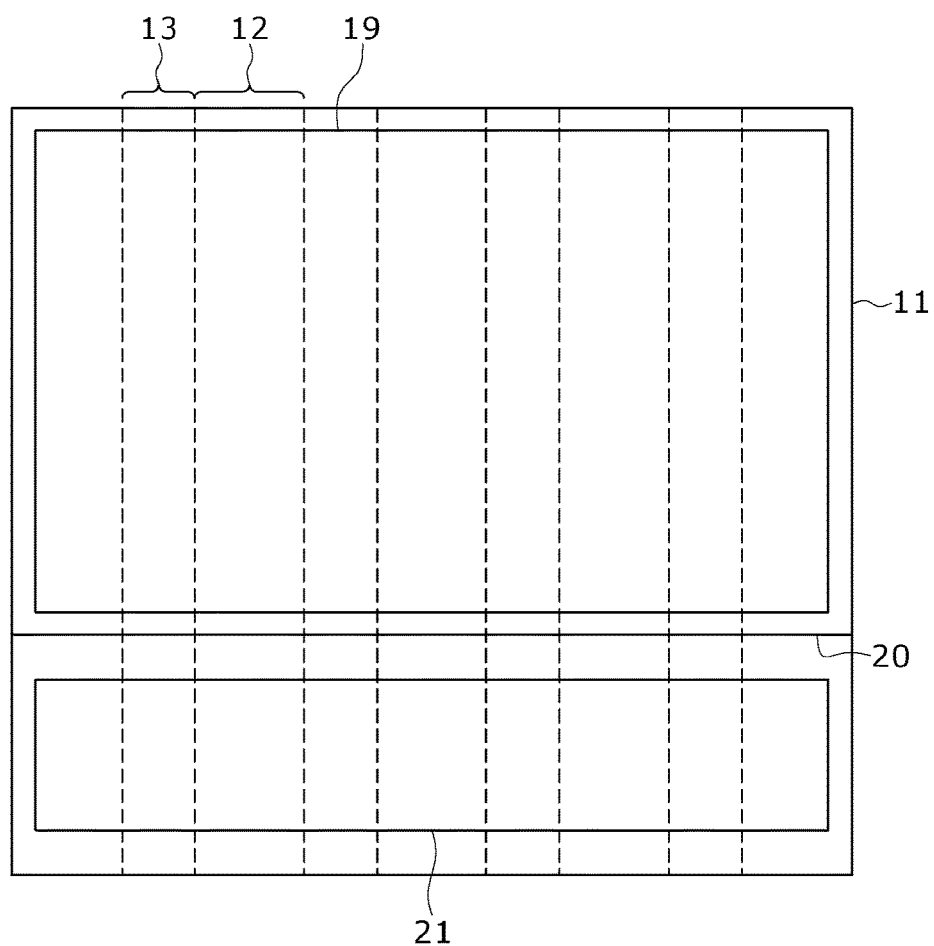
FIG. 28 is a plan view showing a light-emitting diode manufactured by a method for manufacturing a light-emitting diode according to a further embodiment of the invention.

A fifth embodiment of the invention is now described. In the fifth embodiment, as shown in FIG. 28, a mesa portion 20, a p-side electrode 19 and an n-side electrode 21 are so arranged as being rotated by 90° within a plane parallel to the one main surface of the substrate 11.

The fifth embodiment other than those described above is similar to the first embodiment.

According to the fifth embodiment, advantages as in the first embodiment can be obtained.

Next, a sixth embodiment is described.

Figure 29:
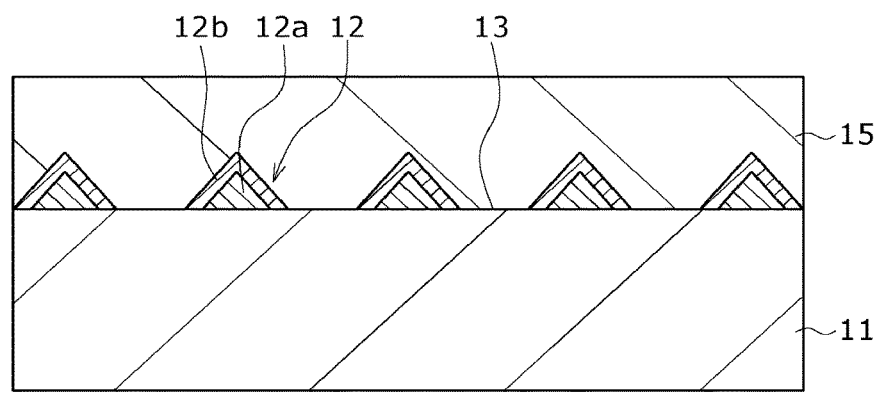
FIG. 29 is a sectional view illustrating a method for manufacturing a light-emitting diode according to a further embodiment of the invention.

In the sixth embodiment, as shown in FIG. 29, the protruded portion 12 consists of a first portion 12a having a triangle in section and a film-shaped second portion 12b covering the first portion 12a therewith. These first portion 12a and second portion 12b are formed of materials of different types. The materials for forming the first portion 12a and the second portion 12b include, for example, those set forth hereinbefore and are selected as required. In particular, the material for the first portion 12*a* is a dielectric material such as $SiO_2$ and the material for the second portion 12*b* is a metal or an alloy.

The sixth embodiment other than those described above is similar to the first embodiment.

According to the sixth embodiment, not only similar advantages as in the first embodiment are obtained, but also the following advantage can be obtained. More particularly, since the second portion 12*b* of he protruded portion 12 is made of a metal or an alloy, light emitted from the active layer 17 can be reflected to a side opposite to the substrate 11 by means of the second portion 12*b*, which is advantageous in the case where light is extracted from the opposite side of the substrate 11 to outside.

It will be noted where it is intended to extract light from the side of the substrate 11, at least one of the first portion 12*a* and the second portion 12*b* may be formed of a transparent conductor such as ITO, IZO, ZO or the like. In addition, the second portion 12*b* may be provided with an opening (window) so as to partially expose the first portion 12*a* of the protruded portion 12.

Next, a seventh embodiment of the invention is described.

Figure 30:
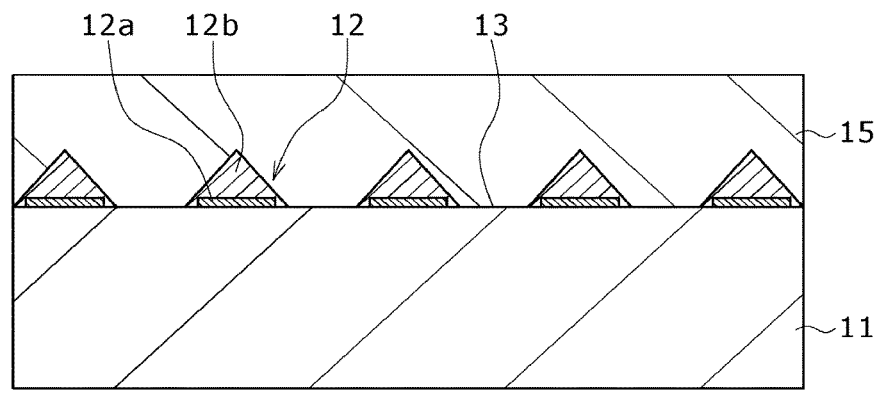
FIG. 30 is a sectional view illustrating a method for manufacturing a light-emitting diode according to a further embodiment of the invention.

In the seventh embodiment, as shown in FIG. 30, the protruded portion 12 is constituted of a film-shaped first portion 12*a* and a second portion 12*b* covering the first portion 12*a* therewith and having an isosceles triangle in section. The first portion 12*a* and the second portion 12*b* are, respectively, formed of materials of different types. The materials forming the first portion 12*a* and the second portion 12*b* are, respectively, those mentioned hereinbefore and are properly selected as required. Specific examples include a dielectric material such as $SiO_2$ for the first portion 12*a* and a metal or an alloy for the second portion 12*b*.

The seventh embodiment other than those described above is similar to the first embodiment.

According to the seventh embodiment, similar advantages as in the first and sixth embodiments can be obtained.

Next, an eighth embodiment of the invention is described.

Figure 31:
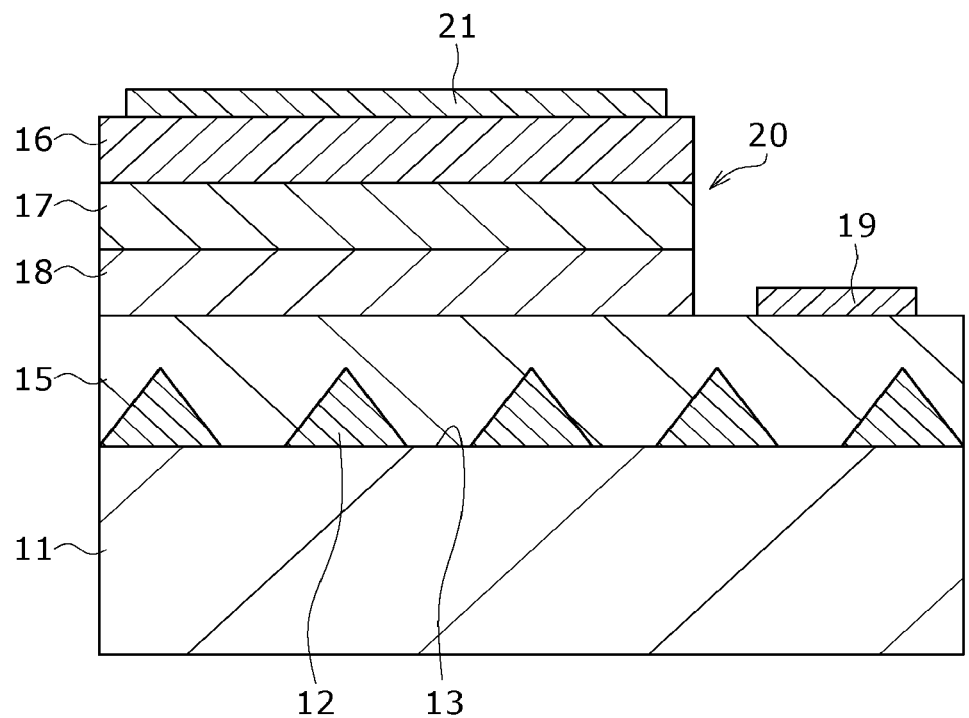
FIG. 31 is a sectional view illustrating a method for manufacturing a light-emitting diode according to an further embodiment of the invention.

In the eighth embodiment, as shown in FIG. 31, the nitride-based III-V Group compound semiconductor layer 15 used is of a p-type, on which a p-type nitride-based III-V Group compound semiconductor layer 18, an active layer 17 and an n-type nitride-based III-V Group compound semiconductor layer 16 are successively grown. Thereafter, an n-side electrode 21 is formed on the n-type nitride-based III-V Group compound semiconductor layer 16, and the p-type nitride-based III-V Group compound semiconductor layer 18, the active layer 17 and the n-type nitride-based III-V Group compound semiconductor layer 16 are subjected to etching to form a mesa portion 20. A p-side electrode 19 is formed on the p-type nitride-based III-V Group compound semiconductor layer 15 at a portion thereof adjacent to the mesa portion 20.

According to the eighth embodiment, advantages as in the first embodiment can be obtained.

Figure 32:
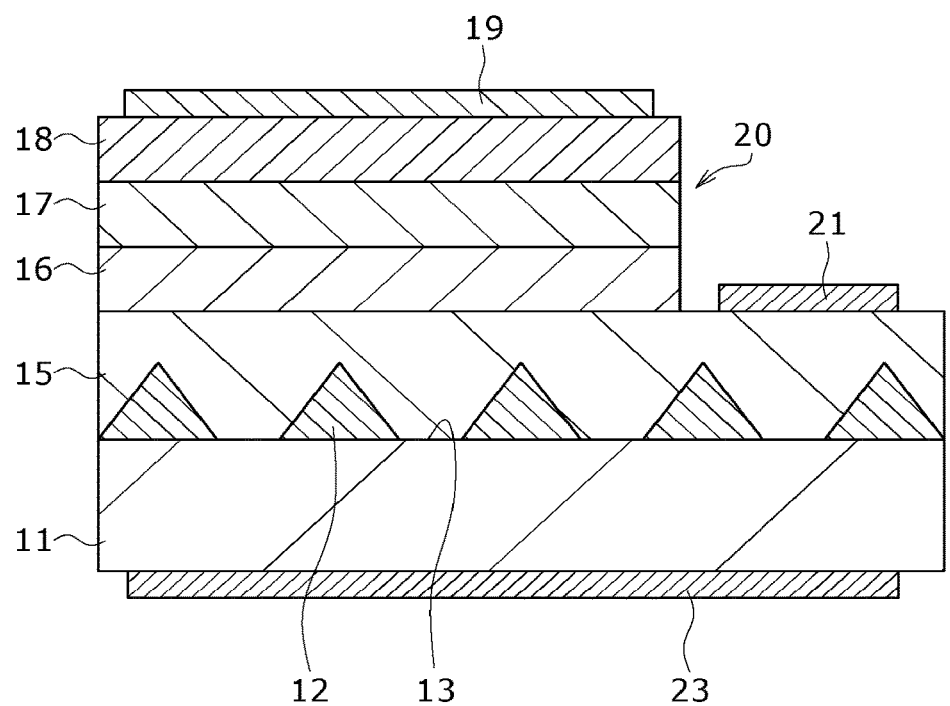
FIG. 32 is a sectional view illustrating a method for manufacturing a light-emitting diode according to a further embodiment of the invention.

A ninth embodiment of the invention is now described. In the ninth embodiment, as shown in FIG. 32, a reflective film 23 is formed on a back side of the substrate 11.

The ninth embodiment other than those described above is similar to the first embodiment.

According to the ninth embodiment, not only advantages as in the first embodiment are obtained, but also the following advantage can be obtained. More particularly, since the reflective film 23 is formed on the back side of the substrate 11, light emitted from the active layer 17 can be reflected toward a side opposite to the substrate 11, thus being beneficial in case where light is extracted from the opposite side relative to the substrate 11 to outside.

A tenth embodiment of the invention is described.

Figure 33:
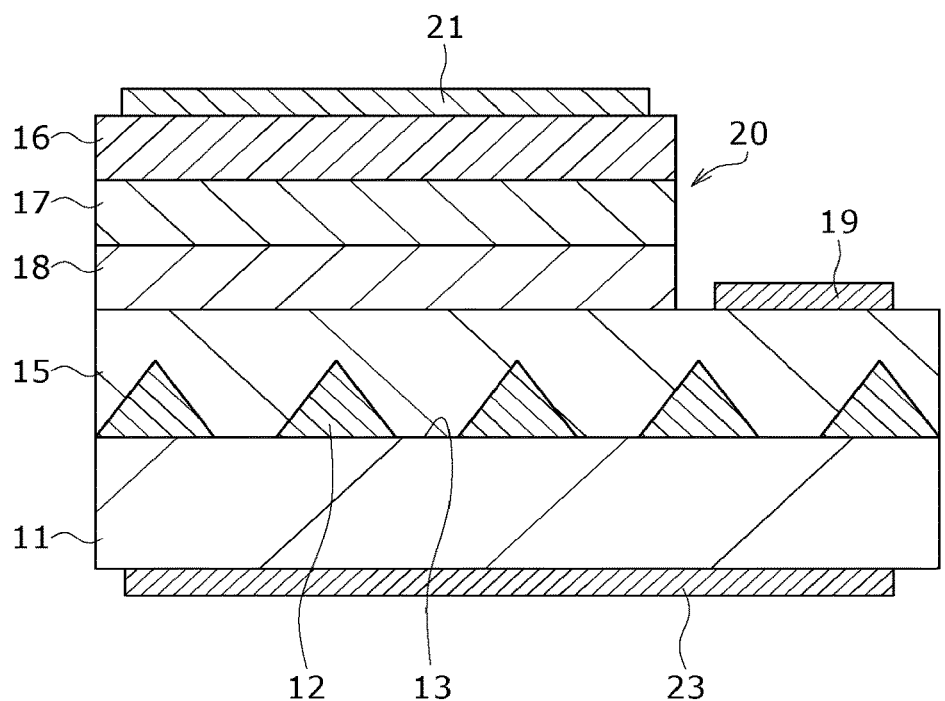
FIG. 33 is a sectional view illustrating a method for manufacturing a light-emitting diode according to a further embodiment of the invention.

In the tenth embodiment, as shown in FIG. 33, the light-emitting diode shown in FIG. 31 is formed with a reflective film 23 at the back side of the substrate 11.

The tenth embodiment other than those described above is similar to the first embodiment.

According to the tenth embodiment, similar advantages as in the first and ninth embodiments can be obtained.

An eleventh embodiment of the invention is now described.

Figure 34:
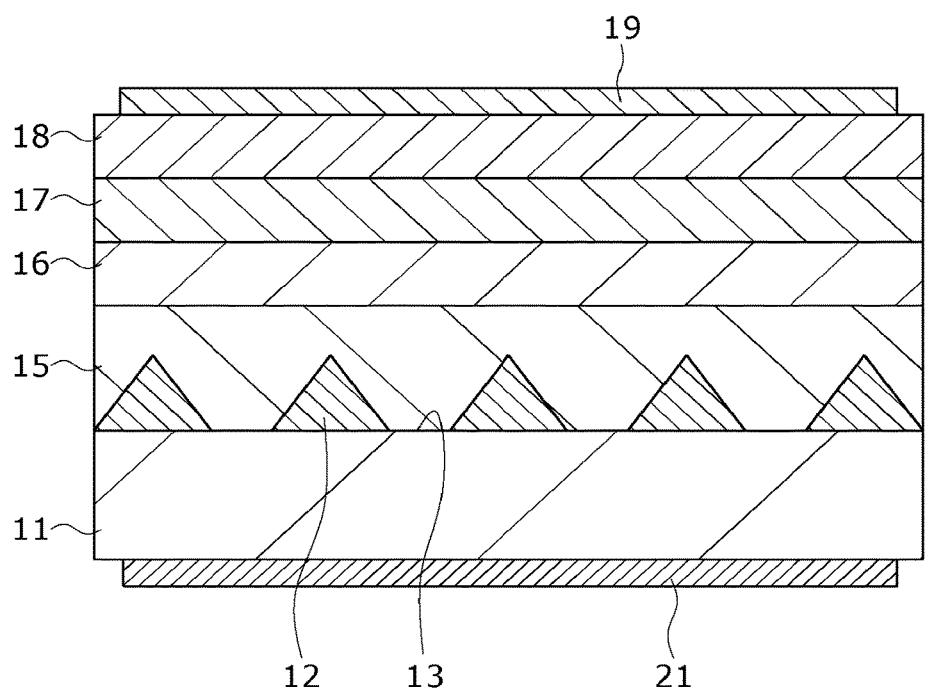
FIG. 34 is a sectional view illustrating a method for manufacturing a light-emitting diode according to a further embodiment of the invention.

In the eleventh embodiment, as shown in FIG. 34, no mesa portion 20 is formed with respect to the n-type nitride-based III-V Group compound semiconductor layer 16, active layer 17 and p-type nitride-based III-V Group compound semiconductor layer 18. In addition, the substrate 11 used is a conductive one and an n-side electrode 21 is formed on the back side of the substrate 11.

The eleventh embodiment other than those described above is similar to the first embodiment.

According to the eleventh embodiment, similar advantages as in the first embodiment can be obtained. Light emitted from the active layer 17 spreads toward the p-side electrode 19 and the n-side electrode 21. When the types of materials for the substrate 11 and the protruded portion 12, the arrangement of the protruded portion 12 and a high reflective electrode or a transparent electrode used as the p-side electrode 19 and the n-side electrode 21 are properly selected, alight extraction direction can be controlled.

Next, a twelfth embodiment of the invention is described.

Figure 35:
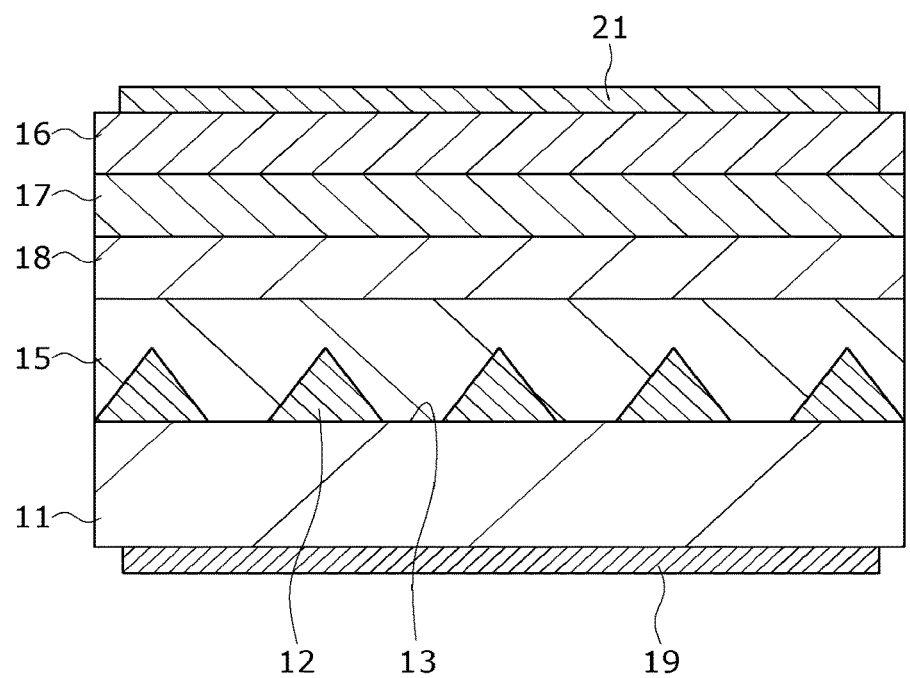
FIG. 35 is a sectional view illustrating a method for manufacturing a light-emitting diode according to a further embodiment of the invention.

In the twelfth embodiment, as shown in FIG. 35, the nitride-based III-V Group compound semiconductor layer 15 used is of a p-type, on which a p-type nitride-based III-V Group compound semiconductor layer 18, an active layer 17 and an n-type nitride-based III-V Group compound semiconductor layer 16 are successively grown. Thereafter, an n-side electrode 21 is formed on the n-type nitride-based III-V Group compound semiconductor layer 16. No mesa portion 20 is formed with respect to the p-type nitride-based III-V Group compound semiconductor layer 18, the active layer 17 and the n-type nitride-based III-V Group compound semiconductor layer 16. The substrate 11 used is a conductive one, and a p-side electrode 19 is formed on the backside of the substrate 11.

The twelfth embodiment other than those described above is similar to the first embodiment.

According to the twelfth embodiment, similar results as in the first embodiment can be obtained.

Next, a thirteenth embodiment of the invention is described.

Figure 36:
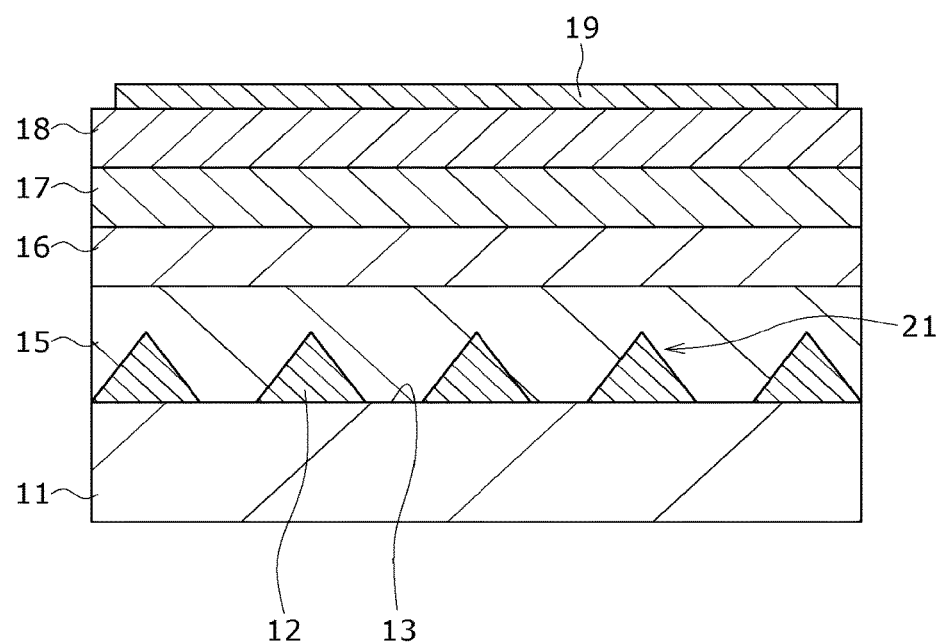
FIG. 36 is a sectional view illustrating a method for manufacturing a light-emitting diode according to a further embodiment of the invention.

In the thirteenth embodiment, as shown in FIG. 36, no mesa portion 20 is formed with respect to the n-type nitride-based III-V Group compound semiconductor layer 16, active layer 17 and p-type nitride-based III-V Group compound semiconductor layer 18. The protruded portion 12 is formed of a conductive material (including a transparent conductive material such as ITO, IZO, ZO or the like) and is used as an n-side electrode 21.

The thirteenth embodiment other than those described above is similar to the first embodiment.

According to the thirteenth embodiment, similar advantages as in the first embodiment can be obtained. Besides, since the protruded portion 12 serves also as the n-side electrode 21, no process of forming the n-side electrode 21 is necessary, with the attendant advantage that the manufacturing process becomes simple with a reduction of manufacturing costs. The protruded portions 12 act as the n-side electrode 21 in separate form, so that a current crowding phenomenon can be prevented from occurring in the course of operation of the light-emitting diode, thus being effective for a high power, high luminance and large area of a light-emitting diode.

Next, a fourteenth embodiment of the invention is described.

Figure 37:
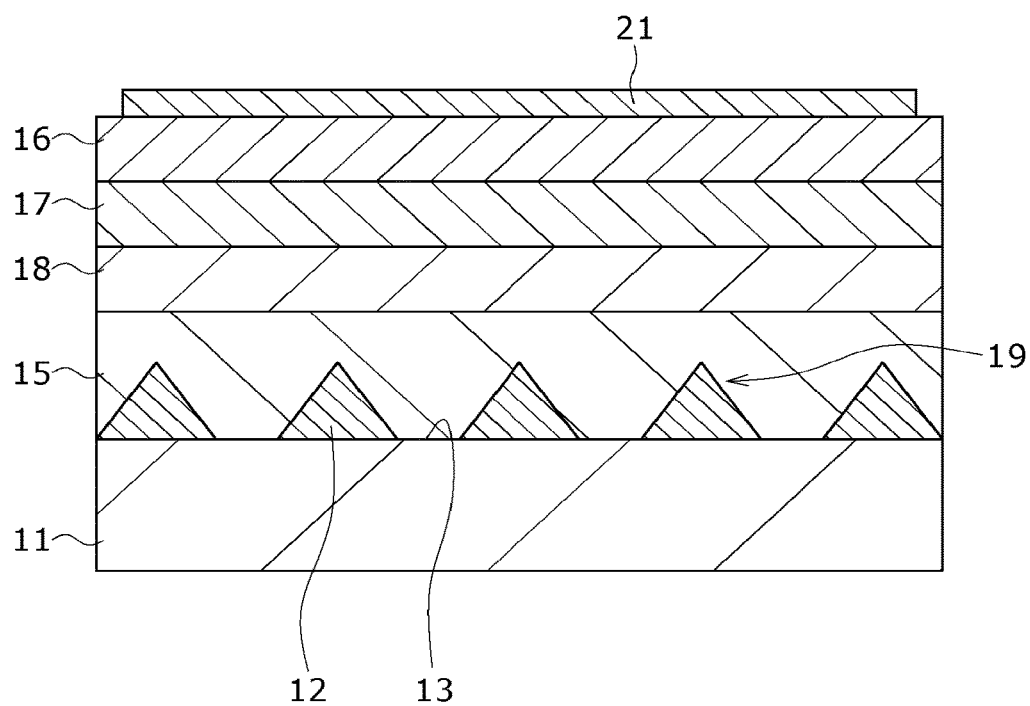
FIG. 37 is a sectional view illustrating a method for manufacturing a light-emitting diode according to a further embodiment of the invention.

In the fourteenth embodiment of the invention, as shown in FIG. 37, the nitride-based III-V Group compound semiconductor layer 15 used is a p-type one, on which a p-type nitride-based III-V Group compound semiconductor layer 18, an active layer 17 and an n-type nitride-based III-V Group compound semiconductor layer 16 are successively grown. Thereafter, an n-side electrode 21 is formed on the n-type nitride-based III-V Group compound semiconductor layer 16. No mesa portion 20 is formed with respect to the p-type nitride-based III-V Group compound semiconductor layer 18, the active layer 17 and the n-type nitride-based III-V Group compound semiconductor layer 16. The protruded portion 12 is formed of a conductive material (including a transparent conductive material such as ITO or the like) and used as a p-side electrode 19.

The fourteenth embodiment other than those described above is similar to the first embodiment.

According to the fourteenth embodiment, similar advantages as in the first embodiment can be obtained. Besides, since the protruded portion 12 serves also as the p-side electrode 19, no process of forming the p-side electrode 19 is necessary, with the attendant advantage that the manufacturing process becomes simple with a reduction of manufacturing costs. The protruded portions act as the p-side electrode 19 in separate form, so that a current crowding phenomenon can be prevented from occurring in the course of operation of the light-emitting diode, thus being effective for a high power, high luminance and large area of a light-emitting diode.

Next, a fifteenth embodiment of the invention is described.

Figure 38:
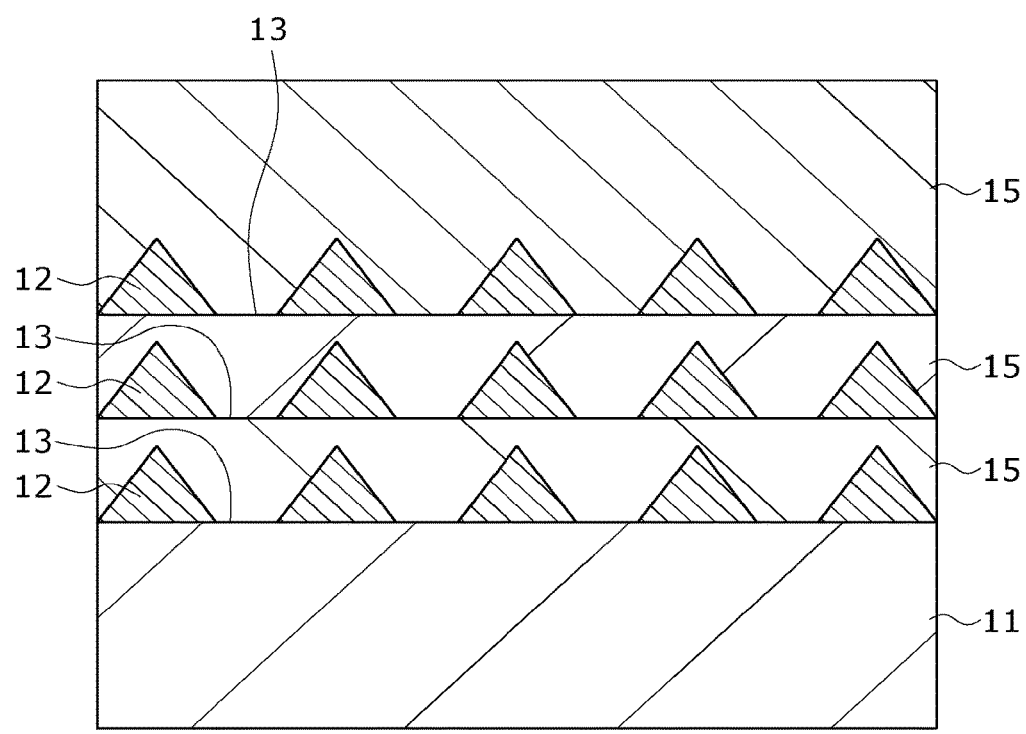
FIG. 38 is a sectional view illustrating a method for manufacturing a light-emitting diode according to a further embodiment of the invention.

In the fifteenth embodiment, as shown in FIG. 38, the step of forming protruded portions 12 and growing the nitride-based III-V Group compound semiconductor layer 15 like the first embodiment starts from forming protruded portions 12 on the substrate 11, followed by repeating the step plural times. The protruded portions 12 in the respective layers are formed at the same position within planes parallel to the main surface of the substrate 11. The uppermost nitride-based III-V Group compound semiconductor layer 15 is successively grown thereon, for example, with an nitride-based III-V Group compound semiconductor layer 16, an active layer 17 and a p-type nitride-based III-V Group compound semiconductor layer 18 like the first embodiment.

The fifteenth embodiment other than those described above s similar to the first embodiment.

According to the fifteenth embodiment, in addition to the advantages as attained in the first embodiment, because the formation of the protruded portions 12 and the growth of the nitride-based III-V Group compound semiconductor layer 15 are repeated plural times, a more upper nitride-based III-V Group compound semiconductor layer 15 exhibits better crystallinity. This is advantageous in that the crystallinity of the n-type nitride-based III-V Group compound semiconductor layer 16, active layer 17 and p-type nitride-based III-V Group compound semiconductor layer 18 grown on the more upper layer 15 can be remarkably improved. In this connection, threading dislocations occurring as concentrated in the nitride-based III-V Group compound semiconductor layer 15 formed over the protruded portions 12 can be covered with the upper protruded portions 12. This is particularly convenient for improving the crystallinity of the more upper nitride-based III-V Group compound semiconductor layer 15. A plurality of protruded portions 12 are, respectively, constituted of a conductive material and the protruded portions 2 in these plural layers are short-circuited by wiring, for which the current crowding phenomenon in the course of operation of a light-emitting diode can be more effectively prevented. This technique may be effective for whichever type of nitride-based III-V Group compound semiconductor layer 15, i.e. a p-type or an n-type. Especially, a p-type nitride-based III-V Group compound semiconductor layer 15 is small in carrier concentration (hole concentration and also in mobility, so that the effect of suppressing the current crowding phenomenon is very high, thereby leading to a remarkably improved luminous efficiency. If the protruded portions 12 in the plural layers are electrically disconnected from one another, the protruded portions 12 in the individual layers function as an independent wiring, permitting easy connection and mounting of various types of electronic devices.

Next, a sixteenth embodiment of the invention is described.

Figure 39:
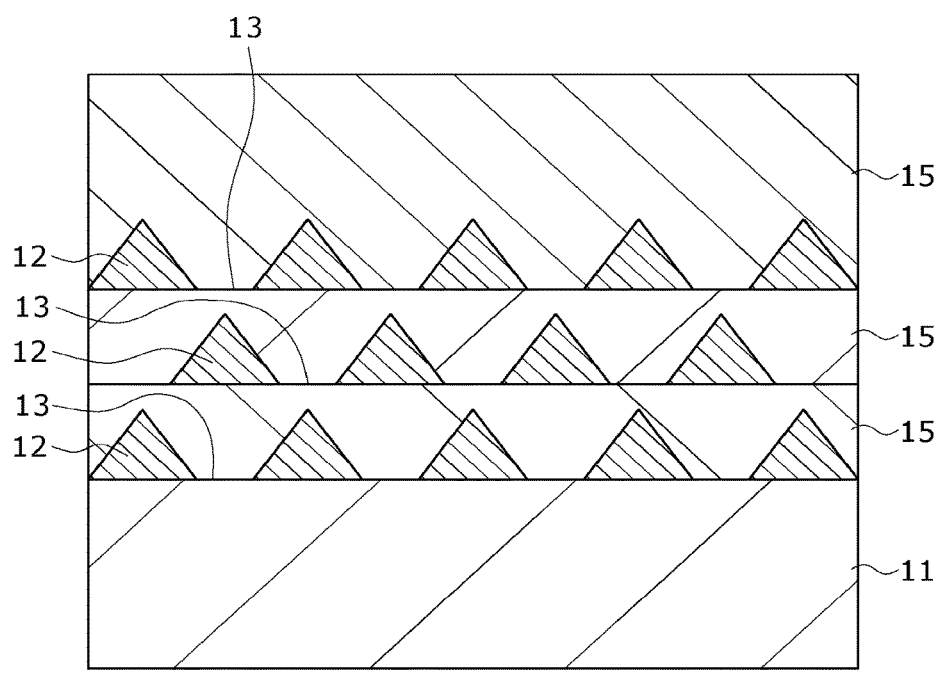
FIG. 39 is a sectional view illustrating a method for manufacturing a light-emitting diode according to a further embodiment of the invention.

In the sixteenth embodiment, as shown in FIG. 39, the step of forming protruded portions 12 and growing the nitride-based III-V Group compound semiconductor layer 15 like the first embodiment starts from forming protruded portions 12 on the substrate 11, followed by repeating the step plural times. In this case, the protruded portions in the respective layers are formed at positions that are mutually shifted by a half cycle within planes parallel to the main surface of the substrate 11. Like the first embodiment. The uppermost nitride-based III-V Group compound semiconductor layer 15 is successively grown thereon, for example, with an nitride-based III-V Group compound semiconductor layer 16, an active layer 17 and a p-type nitride-based III-V Group compound semiconductor layer 18.

The sixteenth embodiment other than those described above is similar to the first embodiment.

According to the sixteenth embodiment, similar advantages as in the first and fifteenth embodiments can be obtained.

A seventeenth embodiment of the invention is now described.

Figure 40:
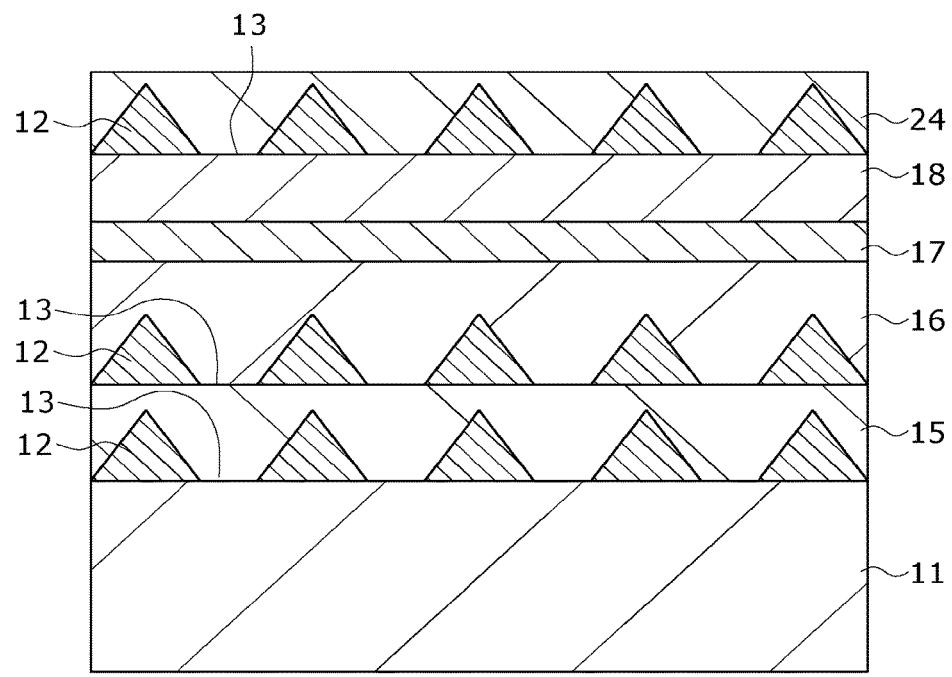
FIG. 40 is a sectional view illustrating a method for manufacturing a light-emitting diode according to a further embodiment of the invention.

In the seventeenth embodiment, as shown in FIG. 40, protruded portion 12 are formed on a substrate 11, and a nitride-based III-V Group compound semiconductor layer 15 is grown, like the first embodiment, followed by further formation of protruded portions 12. Like the first embodiment, for example, an n-type nitride-based III-V Group compound semiconductor layer 16 is further grown. Next, an active layer 17 and a p-type nitride-based III-V Group compound semiconductor layer 18 are successively grown on the n-type nitride-based III-V Group compound semiconductor layer 16. Thereafter, protruded portions 12 are formed on the p-type nitride-based III-V Group compound semiconductor layer 18, followed by further growth of a p-type nitride-based III-V Group compound semiconductor layer 24, like the first embodiment.

The seventeenth embodiment other than those described above is similar to the first embodiment.

According to the seventeenth embodiment, similar advantages as in the first and fifteenth embodiments can be obtained.

Next, an eighteenth embodiment of the invention is described.

Figure 41:
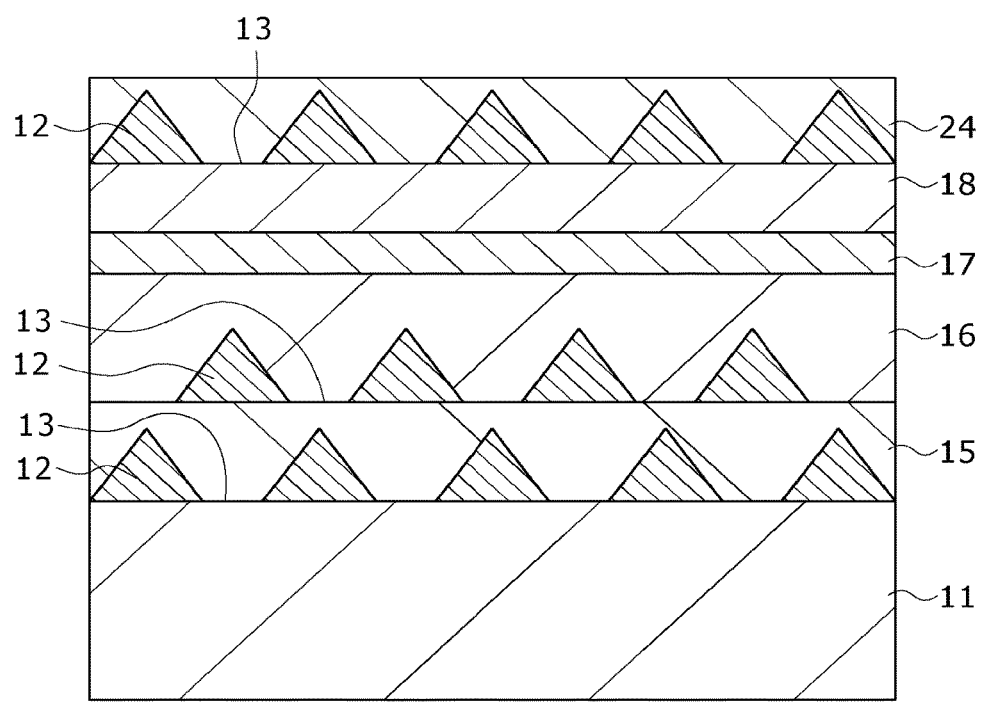
FIG. 41 is a sectional view illustrating a method for manufacturing a light-emitting diode according to an further embodiment of the invention.

In the eighteenth embodiment, as shown in FIG. 41, protruded portion 12 are formed on a substrate 11, and a nitride-based III-V Group compound semiconductor layer 15 is grown, like the first embodiment, followed by further formation of protruded portions 12 thereon. Like the first embodiment, for example, an n-type nitride-based III-V Group compound semiconductor layer 16 is further grown. Next, an active layer 17 and a p-type nitride-based III-V Group compound semiconductor layer 18 are successively grown on the n-type nitride-based III-V Group compound semiconductor layer 16. Thereafter, protruded portions 12 are formed on the p-type nitride-based III-V Group compound semiconductor layer 18, followed by further growth of a p-type nitride-based III-V Group compound semiconductor layer 24, like the first embodiment. In this case, the protruded portions 12 in the respective layers are, respectively, formed at positions shifted by a half cycle within planes parallel to the main surface of the substrate 11.

The eighteenth embodiment other than those described above is similar to the first embodiment.

According to the eighteenth embodiment, similar advantages as in the first and fifteenth embodiment can be obtained.

A nineteenth embodiment of the invention is described.

Figure 42:
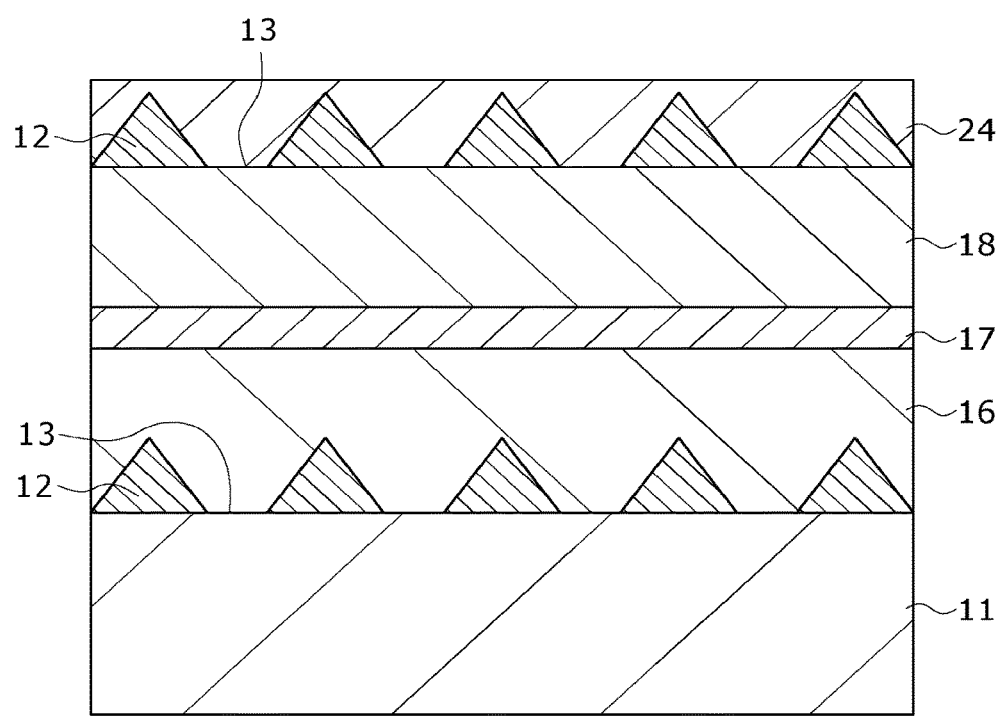
FIG. 42 is a sectional view illustrating a method for manufacturing a light-emitting diode according to a further embodiment of the invention.

In the nineteenth embodiment, as shown in FIG. 42, protruded portions 12 are formed on a substrate 11 and an n-type nitride-based III-V Group compound semiconductor layer 16 is, for example, grown like the first embodiment, followed by successive growth of an active layer 17 a p-type nitride-based III-V Group compound semiconductor layer 18 thereon. Next, protruded portions 12 are formed on the p-type nitride-based III-V Group compound semiconductor layer 18, followed by growth of a p-type nitride-based III-V Group compound semiconductor layer 24 like the first embodiment. The protruded portions in the respective layers are, respectively, formed at the same position within planes parallel to the main surface of the substrate 11.

Figure 44A:
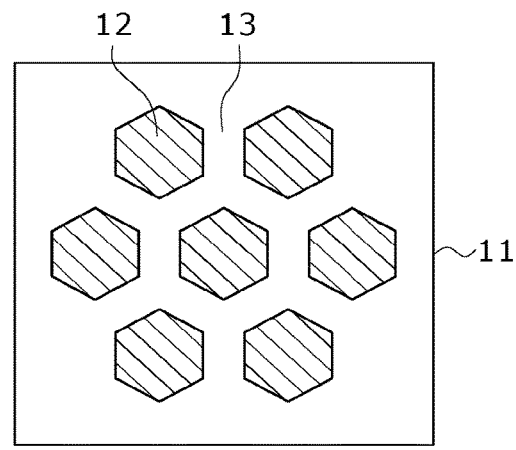
FIGS. 44A to 44C are, respectively, an example of a planar shape of a protruded portion above the active layer of the light-emitting diode according to the further embodiment of the invention.
Figure 44B:
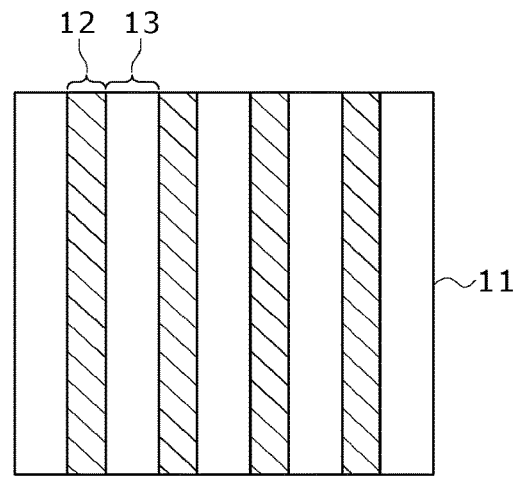
Figure 44C:
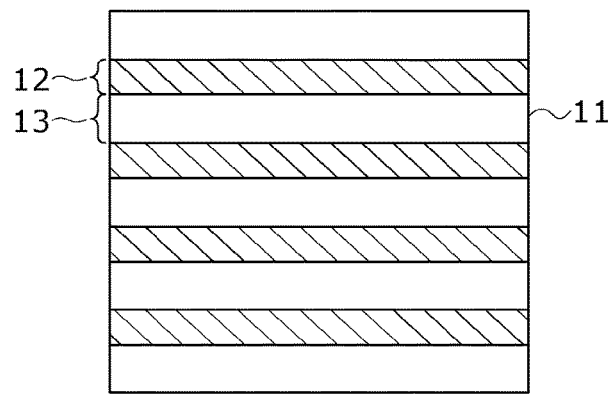

Examples of a planar shape of the protruded portions 12 below the active layer 17 are shown in FIGS. 43A to 43C, and examples of a planar shape of the protruded portions above the active layer 17 are shown in FIGS. 44A to 44C. The planar shapes of the protruded portion 12 below the active layer 17 and the protruded portion 12 above the active layer 17 may be used in arbitrary combination.

The nineteenth embodiment other than those described above is similar to the first embodiment.

According to the nineteenth embodiment, similar advantages as in the first and fifteenth embodiments can be obtained.

Figure 45:
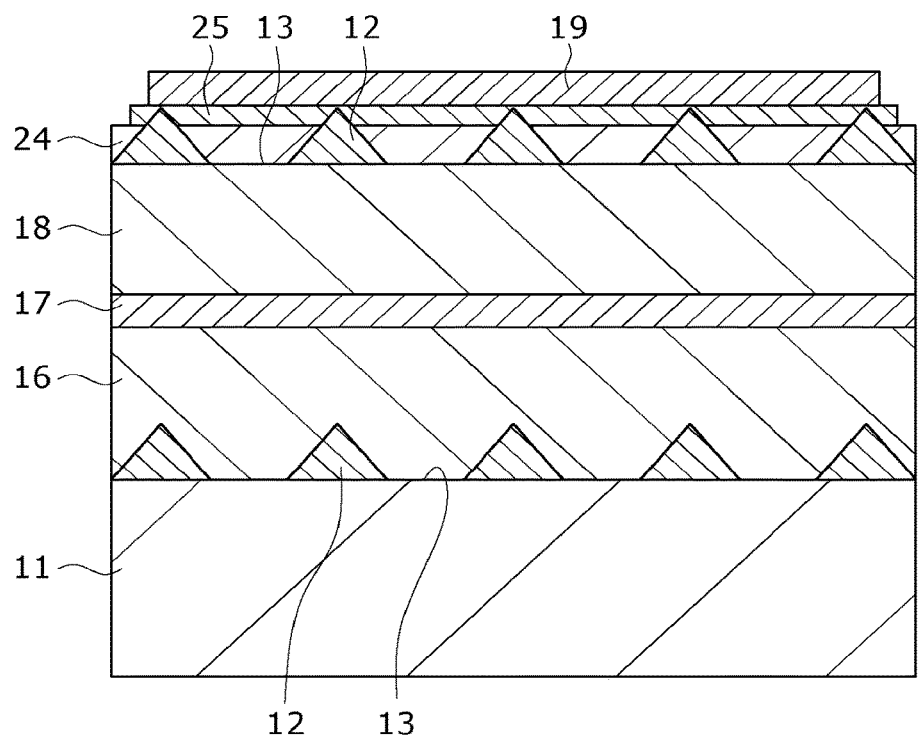
FIG. 45 is a sectional view showing a variation of a light-emitting diode according to the further embodiment of the invention.
Figure 46:
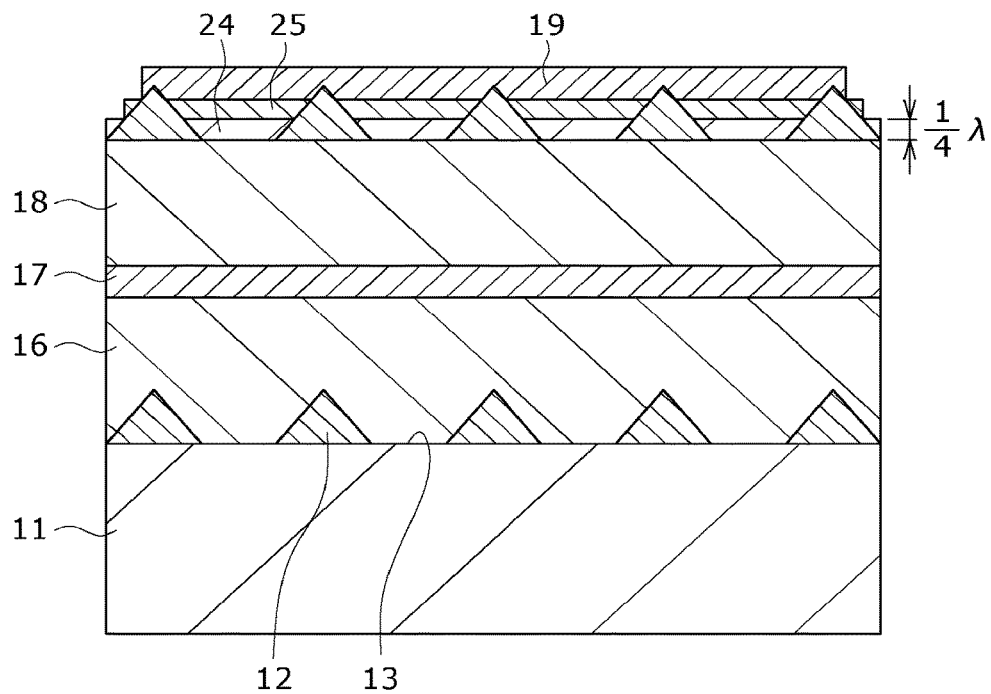
FIG. 46 is a sectional view showing another variation of the light-emitting diode according to the further embodiment of the invention.

It will be noted that in FIG. 42, either of the lower side protruded portions 12 and the upper side protruded portions 12 sandwiching the active layer 17 therebetween may be made of an electric conductor such as a metal, an alloy, a transparent conductor or the like. Especially, where a conductor such as a metal, an alloy, a transparent conductor or the like is used as a material for the upper side protruded portions 12 relative to the active layer 17, it is possible to form a reflective electrode 25 in contact with the protruded portions 12 and further form a p-side electrode 19 thereon as is particularly shown in FIG. 45. Alternatively, if the conductor, such as a metal, an alloy, a transparent conductor or the like, is used as a material for the upper side protruded portion 12 relative to the active layer 17 is either optically transparent or reflective, the thickness of the nitride-based III-V Group compound semiconductor layer 24 may be appropriately controlled, for example, at λ/4 (λ is an emission wavelength), followed by forming a reflective electrode 25 thereon in contact with the protruded portions 12 and further forming, for example, a p-side electrode 19 as shown in FIG. 46. In this way, it becomes possible to form a structure capable of reflecting light generated at the active layer from arbitrary direction toward the side of the substrate 11 while ensuring a good current pass from the p-side electrode 19 upon operation of the light-emitting diode.

Next, a twentieth embodiment of the invention is described.

Figure 47:
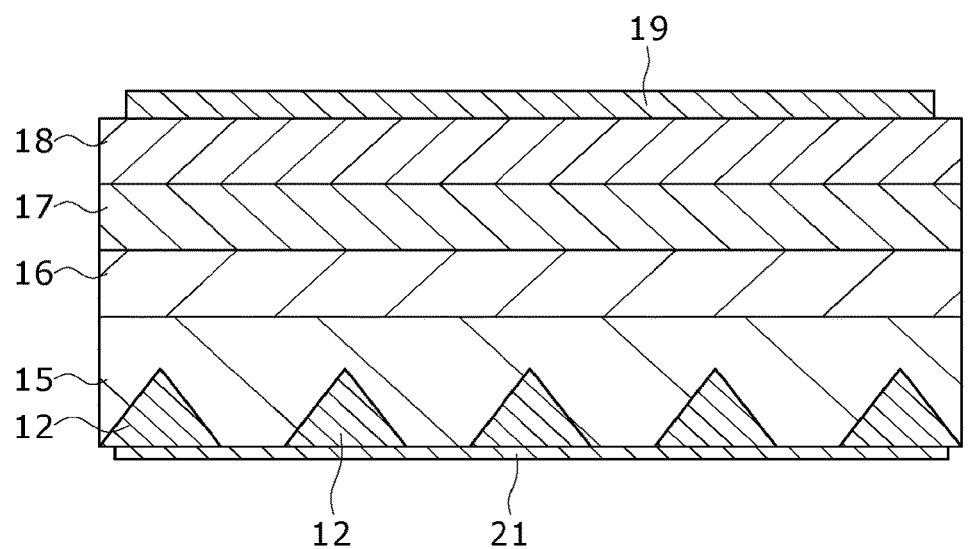
FIG. 47 is a sectional view illustrating a method for manufacturing a light-emitting diode according to a further embodiment of the invention.

In the twentieth embodiment, after the steps before the formation of the p-side electrode are performed in the same manner as in the eleventh embodiment shown in FIG. 34, the substrate 11 is removed to expose the back side of the n-type nitride-based III-V Group compound semiconductor layer 15. Thereafter, as shown in FIG. 47, an n-side electrode 21 is formed on the back side of the nitride-based III-V Group compound semiconductor layer 15.

If the p-side electrode 19 and the n-side electrode 21 are each made of a high reflective electrode or transparent electrode, a light extraction direction can be selected.

Figure 48:
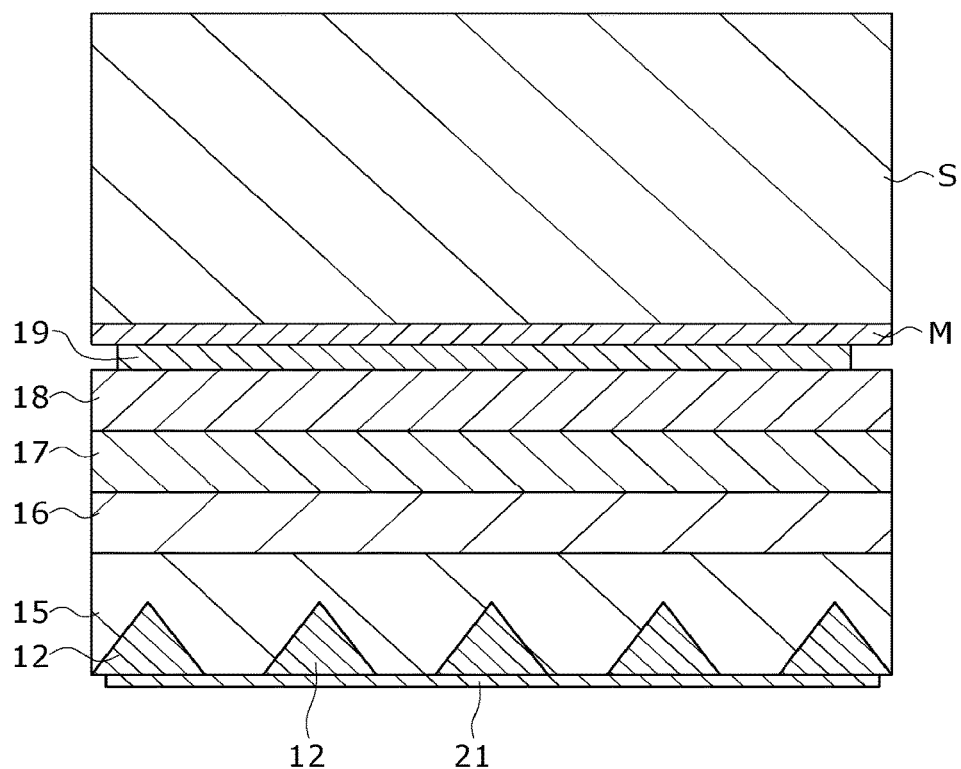
FIG. 48 is a sectional view illustrating a method for manufacturing a light-emitting diode according to the further embodiment of the invention.

The removal of the substrate 11 permits the resulting light-emitting diode to be totally very small in thickness. In order to improve mechanical strength, a support substrate S may be attached and bonded to the p-side electrode 19 through a metal electrode M as shown in FIG. 48. The support substrate S may be either conductive or non-conductive so far as the support substrate S has such a structure as to pass an electric current to the light-emitting diode through the metal electrode M.

The twentieth embodiment other than those described above is similar to the first embodiment.

According to the twentieth embodiment, similar advantages as in the first embodiment can be obtained.

Next, a twenty-first embodiment of the invention is described.

Figure 49:
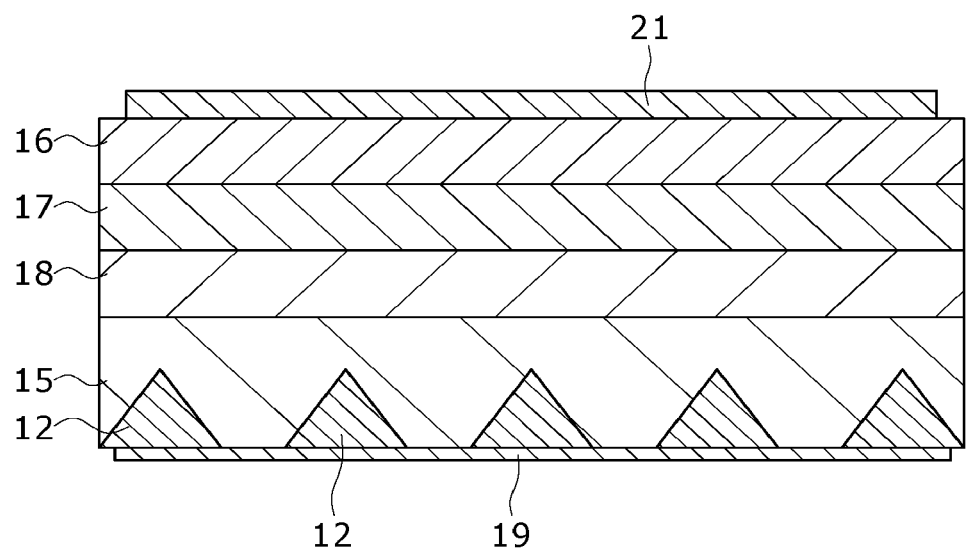
FIG. 49 is a sectional view illustrating a method for manufacturing a light-emitting diode according to a further embodiment of the invention.

In the twenty-first embodiment, after the steps before the formation of the n-side electrode 21 are performed in the same manner as in the twelfth embodiment shown in FIG. 35, the substrate 11 is removed to expose the back side of the p-type nitride-based III-V Group compound semiconductor layer 15. As shown in FIG. 49, a p-side electrode 19 is formed on the back side of this nitride-based III-V Group compound semiconductor layer 15.

The twenty-first embodiment other than those described above is similar to the first embodiment.

According to the twenty-first embodiment, similar advantages as in the first embodiment can be obtained.

A twenty-second embodiment of the invention is described.

Figure 50A:
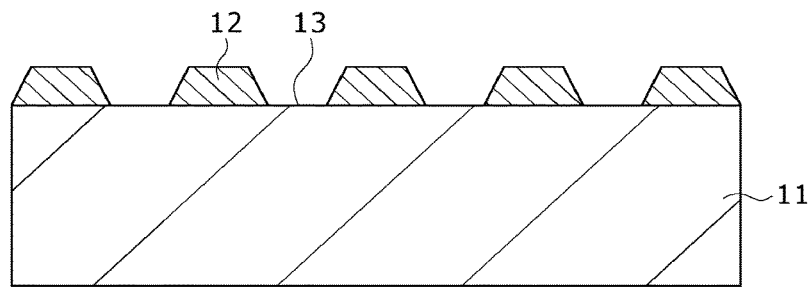
FIGS. 50A to 50C are, respectively, a sectional view illustrating a method for manufacturing a light-emitting diode according to a further embodiment of the invention.

In the twenty-second embodiment, as shown in FIG. 50A, protruded portions having a trapezoid in section are formed on a substrate 11 at given intervals as viewed in plane. Thus, a recess portion 13 having an inverted trapezoid in section are formed between the protruded portions 12.

Figure 50B:
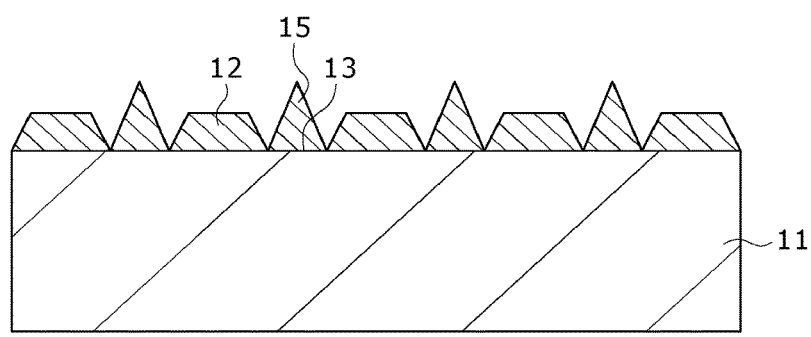
Figure 50C:
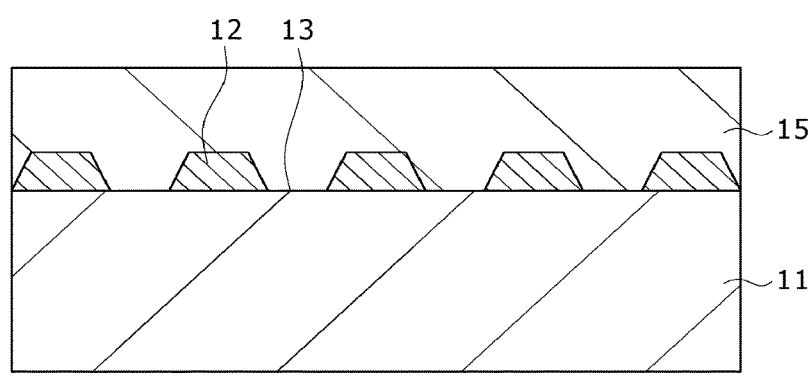

Next, the nitride-based III-V Group compound semiconductor layer 15 is grown in the same manner as in the first embodiment. More particularly, the nitride-based III-V Group compound semiconductor layer 15, which has an isosceles triangle in section using the bottom surface of the recess portion 13 as a base thereof, is grown through the steps of formation, growth and combination of micronuclei on the bottom surface of each recess portion as shown in FIG. 50B. Moreover, as shown in FIG. 50C, the nitride-based III-V Group compound semiconductor layer 15 having a flat surface and a low threading dislocation density is further grown through lateral growth.

Figure 51:
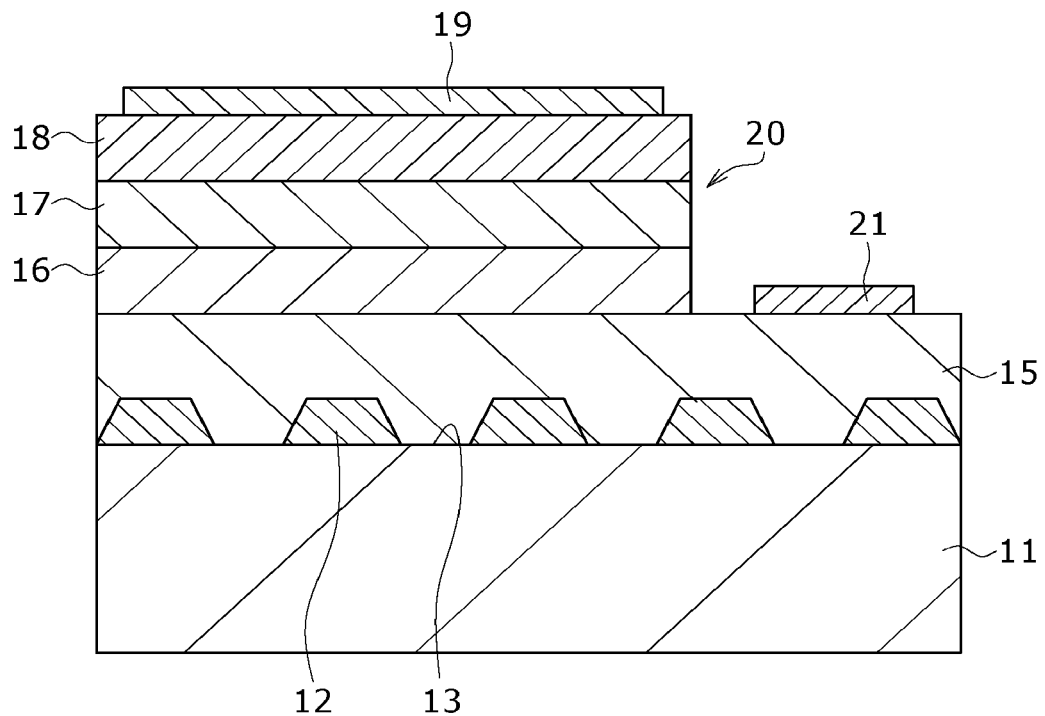
FIG. 51 is a sectional view illustrating a method for manufacturing a light-emitting diode according to the further embodiment of the invention.

Next, further steps are carried out in the same manner as in the first embodiment to obtain an intended, nitride-based III-V Group compound semiconductor-based light-emitting diode as shown in FIG. 51.

The twenty-second embodiment other than those described above is similar to the first embodiment.

Figure 52:
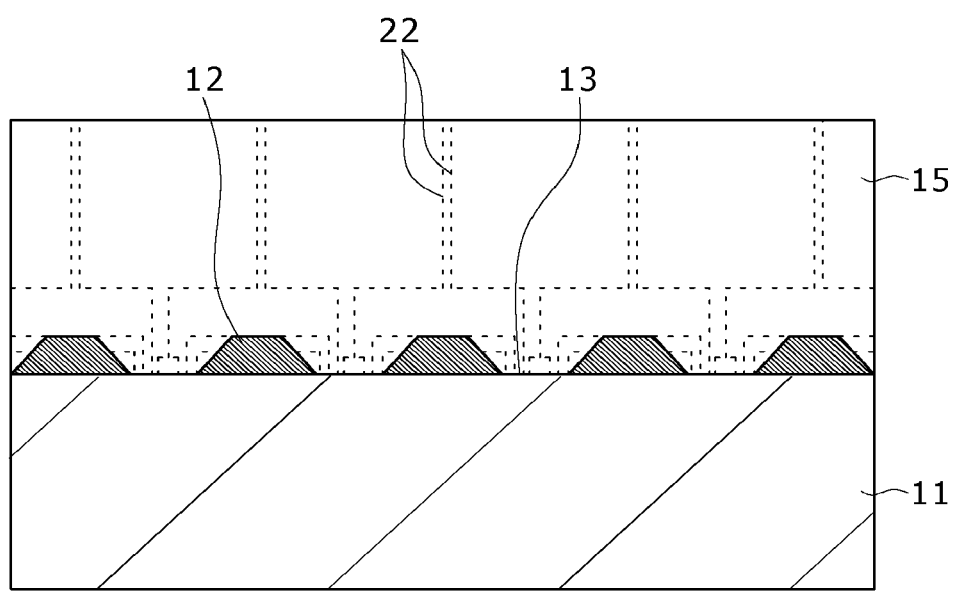
FIG. 52 is a schematic view illustrating the behavior of a dislocation obtained through TEM observation of a nitride-based III-V Group compound semiconductor layer grown in a substrate by a method of manufacturing a light-emitting diode according to the further embodiment of the invention.

FIG. 52 schematically shows the results of checking a crystal defect distribution in the nitride-based III-V Group compound semiconductor layer 15 by TEM.

According to this twenty-second embodiment, similar advantages as in the first embodiment can be obtained.

Figure 53:
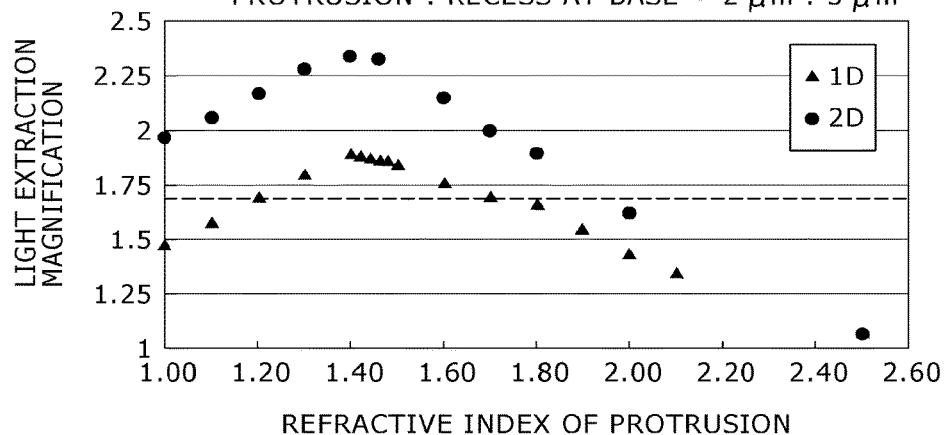
FIG. 53 is a diagram showing the results of ray tracing simulation of the light-emitting diode manufactured according to the further embodiment of the invention.
Figure 54:
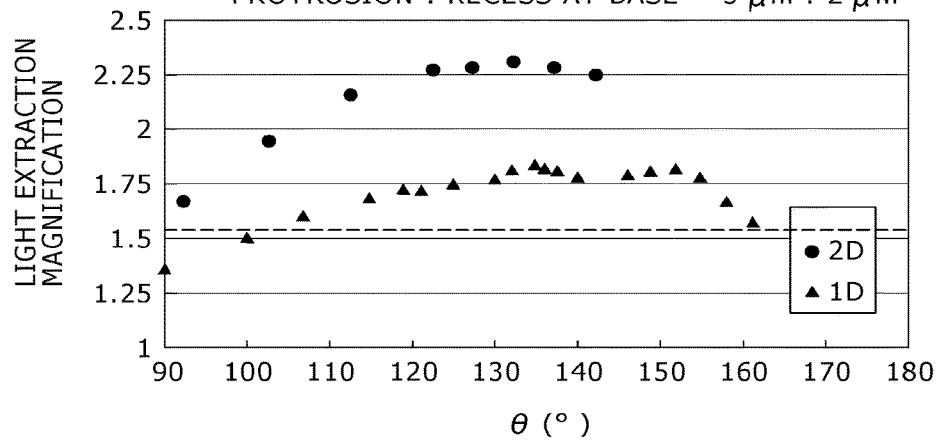
FIG. 54 is a diagram showing the results of ray tracing simulation of the light-emitting diode manufactured according to the further embodiment of the invention.
Figure 55:
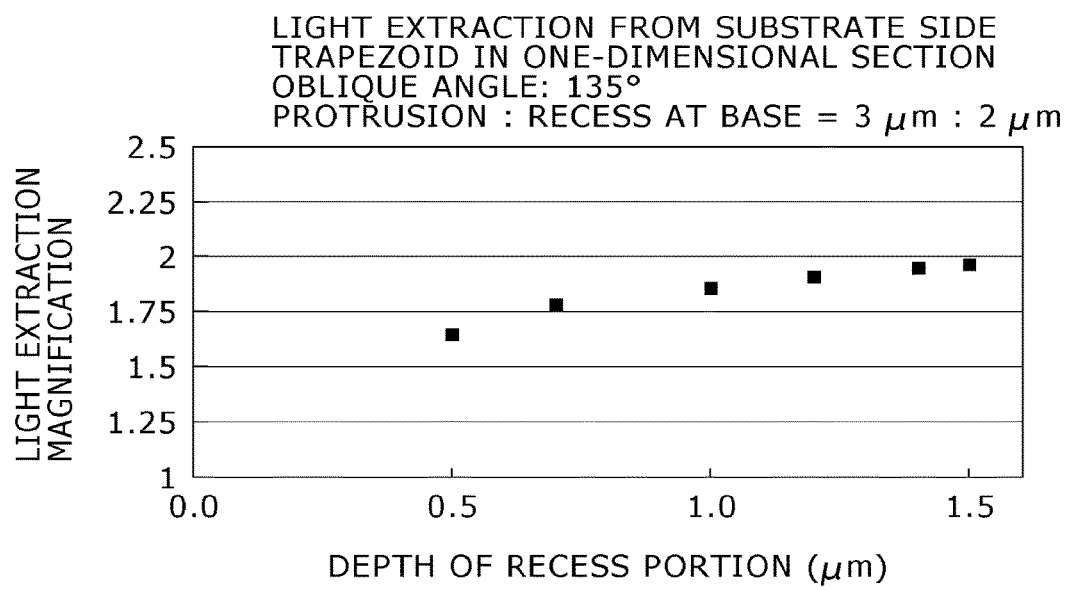
FIG. 55 is a diagram showing the results of ray tracing simulation of the light-emitting diode manufactured according to the further embodiment of the invention.

FIGS. 53 to 55, respectively, show an instance of the results of simulation of a change in efficiency of light extraction from a light-emitting diode to outside in cases where protruded and recess portions are formed on the substrate 11 and no such portions are formed. In all cases, light extraction is performed from the back side of the substrate 11.

In FIG. 53, the abscissa indicates a refractive index of the protruded portion 12 and the ordinate indicates a degree of improvement (light extraction magnification) of a light extraction efficiency η in case where no protruded portion is formed. In FIG. 53, data indicated by ▲ is for the case where the protruded portion 12 is in the form of a one-dimensional stripe (1D) as shown in FIG. 4, and data indicated by ● is for the case of a two-dimensional arrangement where one-dimensional stripe-shaped, protruded portions 12 mutually intersect each other (2D). The angle θ made between the side face of the protruded portion and the one main surface of the substrate 11 is 135°, the length $W_g$ of the bottom surface of the recess portion is at $W_g=2$ μm, and the length of the base of the protruded portion 12 is at 3 μm. It is assumed that the refractive index of the substrate 11 is at 1.77 and the refractive index of the nitride-based III-V Group compound semiconductor layer 15 is at 2.35. From FIG. 53, it will be seen that the light extraction efficiency becomes maximal when the refractive index of he protruded portion 12 is at 1.4 for both 1D and 2D and becomes satisfactorily great within a range of refractive index of 1.2 to 1.7. 2D is greater than 1D with respect to the light extraction magnification.

It will be noted that these results are true of the case where the section of the protruded portion 12 is triangular as in the first embodiment.

In FIG. 54, the abscissa indicates an angle θ made between the side face of the protruded portion 12 and the one main surface of the substrate 11, and the ordinate indicates a light extraction magnification. In FIG. 54, data indicated by ▲ is for the case where the protruded portion 12 is in the form of a one-dimensional stripe (1D) as shown in FIG. 4, and data indicated by ● is for the case of a two-dimensional arrangement where one-dimensional stripe-shaped, protruded portions 12 mutually intersect each other (2D). The length $W_g$ of the bottom surface of the recess portion 13 is at $W_g=3$ μm, and the length of the base of the protruded portion 12 is at 2 μm. It is assumed that the refractive index of the substrate 11 is at 1.77, the refractive index of the protruded portion is at 1.4, and the refractive index of the nitride-based III-V Group compound semiconductor layer 15 is at 2.35. From FIG. 54, it will be seen that the light extraction magnification is as great as 1.55 times or over when the angle θ made between the side surface of the protruded portion 12 and the one main surface of the substrate is within a range of 100°<θ<160° for both 1D and 2D, is very great at 1.75 times or over within a range of 132°<θ<139° and becomes maximal, especially, at θ=135°.

In addition, the factor is very great at 1.75 times or over even within a range of 147°<θ<154° and becomes maximal, especially, at θ=152°. 2D is greater than 1D with respect to the light extraction magnification.

These results are true of the case where the section of the protruded portion 12 is triangular as in the first embodiment.

In FIG. 55, the abscissa indicates a depth d of the recess portion 13 and the ordinate indicates a degree of improvement of light extraction efficiency η (light extraction magnification) in case where no protruded portion 12 is formed. The protruded portion 12 has a one-dimensional striped shape as shown in FIG. 4. The ratio between the length $W_g$ of the base of the recess portion 13 and the length of the base of the protruded portion 12 is at 3:2. It is assumed that the refractive index of the substrate 11 is at 1.77, the refractive index of the protruded portion 12 is at 1.4, and the refractive index of the nitride-based III-V Group compound semiconductor layer 15 is at 2.35. From FIG. 55, it will be seen that the light extraction magnification increases with an increasing depth of the recess portion 13.

A twenty-third embodiment of the invention is now described.

Figure 56A:
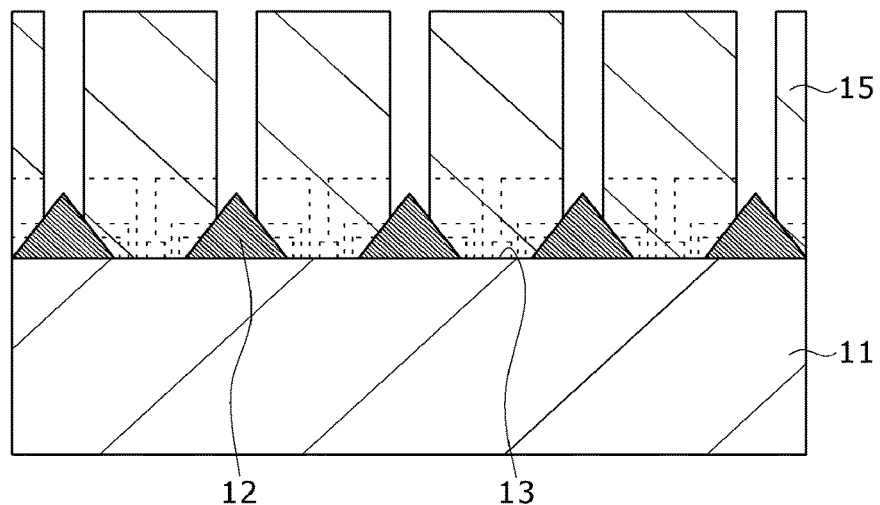
FIGS. 56A and 56B are, respectively, a sectional view illustrating a method for manufacturing a light-emitting diode according to a further embodiment of the invention.

In the twenty-third embodiment, as shown in FIG. 56A, the nitride-based III-V Group compound semiconductor layer 15 is grown until the surface becomes flat in the same manner as in the first embodiment, after which a portion where threading dislocations 22 concentrate over the protruded portion 12 is selectively removed by etching or the like so that the surface of the protruded portion 12 at this portion is exposed.

Figure 56B:
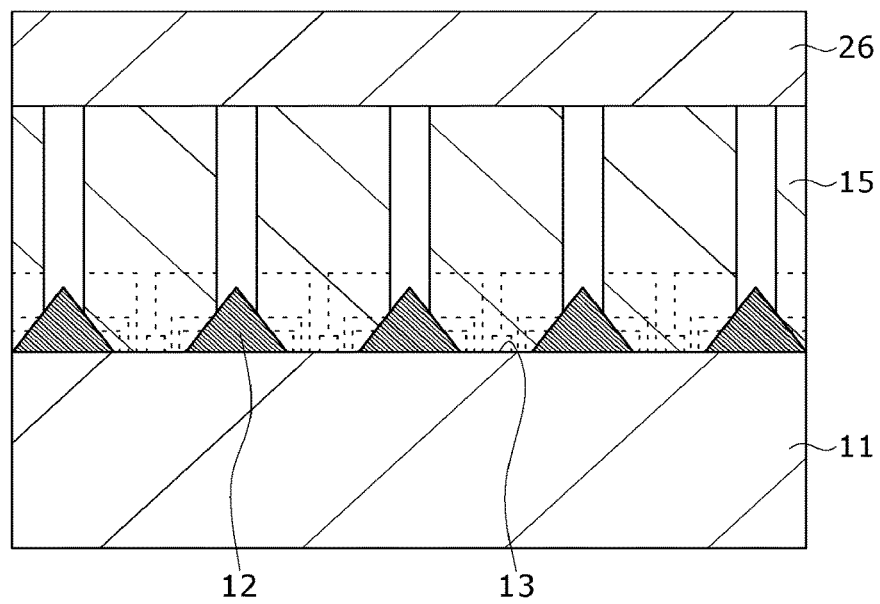

Next, as shown in FIG. 56B, a nitride-based III-V Group compound semiconductor layer 26 is laterally grown from the left nitride-based III-V Group compound semiconductor layers 15.

Thereafter, the steps after the growth of the n-type nitride-based III-V Group compound semiconductor layer 16 are performed in the same manner as in the first embodiment to provide a light-emitting diode.

According to this twenty-third embodiment, similar advantages as in the first embodiment can be obtained.

Next, a twenty-fourth embodiment of the invention is described.

Figure 57A:
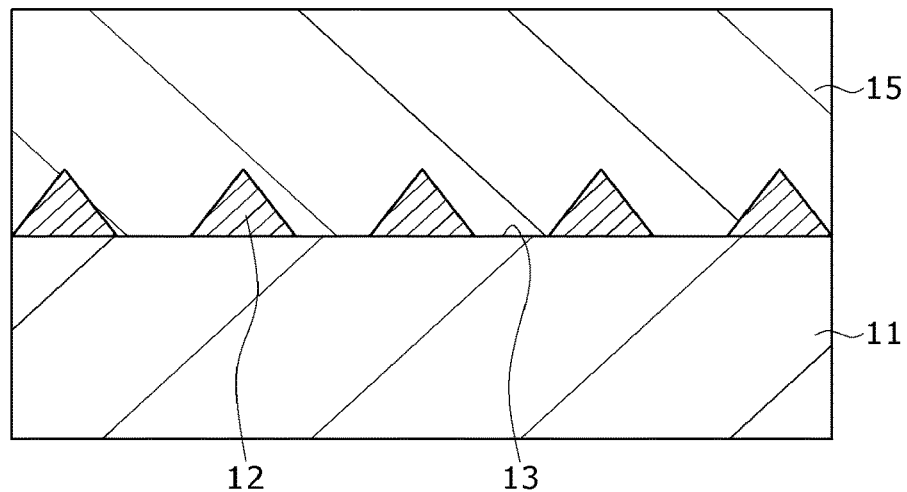
FIGS. 57A and 57B are, respectively, a sectional view illustrating a method for manufacturing a light-emitting diode according to a further embodiment of the invention.

In the twenty-fourth embodiment, as shown in FIG. 57A, a protruded portion 12 is formed on a substrate 11 and a nitride-based III-V Group compound semiconductor layer 15 is grown in the same manner as in the first embodiment.

Figure 57B:
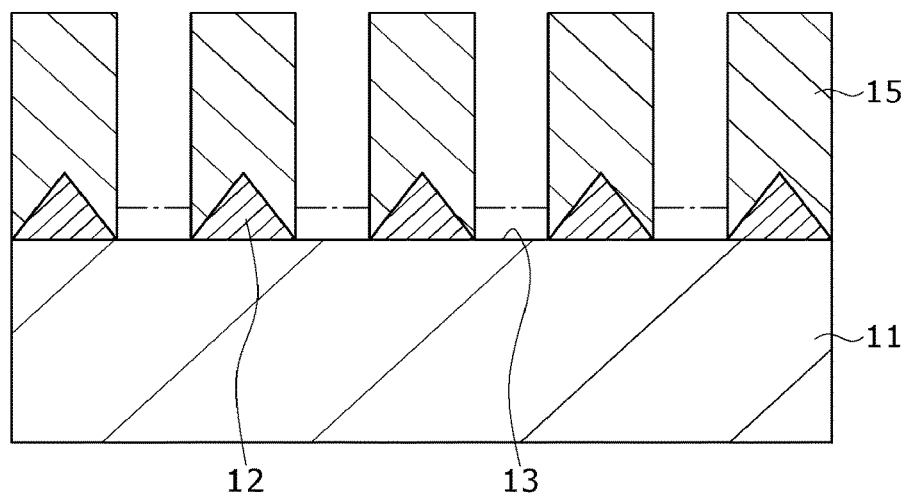

Next, as shown in FIG. 57B, a mask (not shown) corresponding to the protruded portion 12 is formed on the nitride-based III-V Group compound semiconductor layer 15 at a portion above the protruded portion 12, after which the nitride-based III-V Group compound semiconductor layer 15 is etched or abraded, for example, by a RIE method, a powder blasting method, a sand blasting method or the like until the substrate 11 is exposed.

Figure 58A:
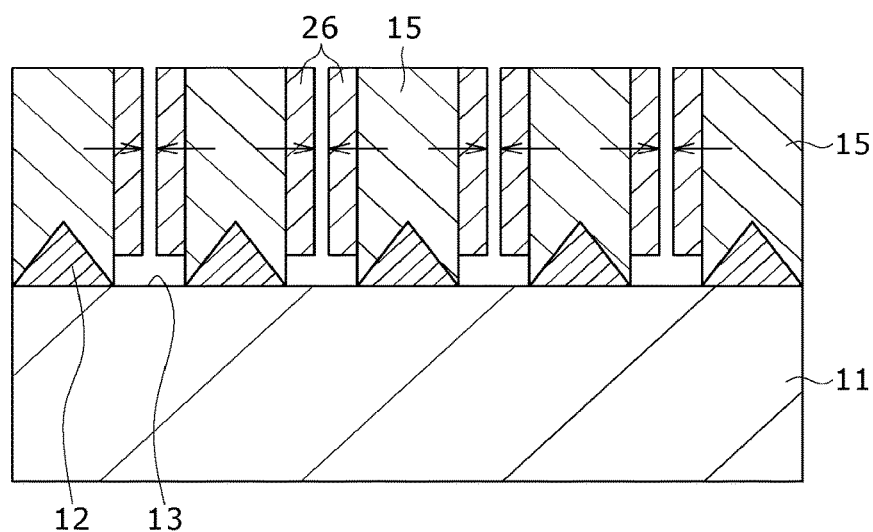
FIGS. 58A and 58B are, respectively, a sectional view illustrating a method for manufacturing a light-emitting diode according to the further embodiment of the invention.
Figure 58B:
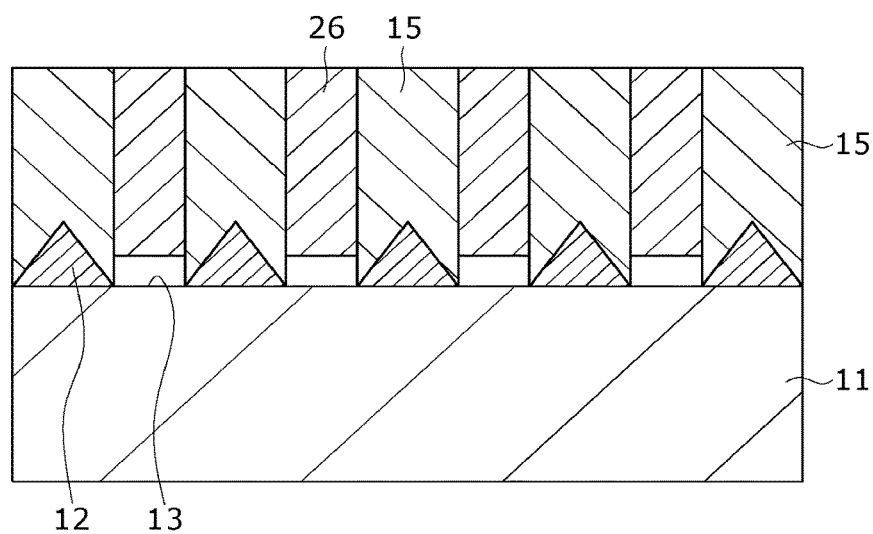

Next, after removal of the mask, as shown in FIG. 58A, a nitride-based III-V Group compound semiconductor layer 26 is laterally grown from opposite sides of the thus patterned nitride-based III-V Group compound semiconductor layer 15 to bury a space between the nitride-based III-V Group compound semiconductor layers 15 therewith as shown in FIG. 58B. At this stage, a space is formed between the nitride-based III-V Group compound semiconductor layer 26 and the substrate 11.

Figure 59A:
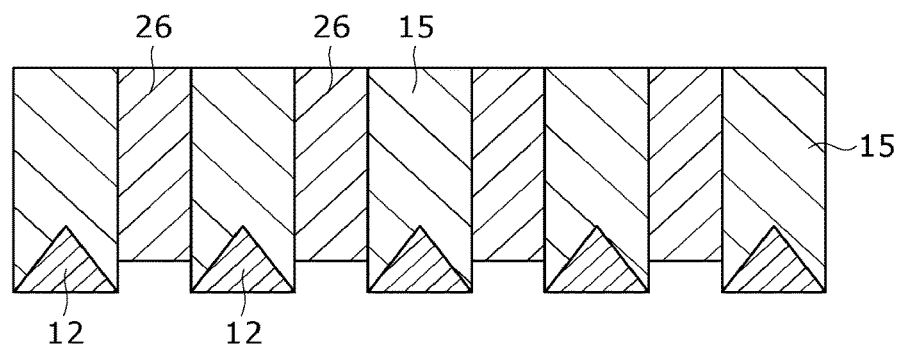
FIGS. 59A to 59C are, respectively, a sectional view illustrating a method for manufacturing a light-emitting diode according to the further embodiment of the invention.

Thereafter, as shown in FIG. 59A, the substrate is removed or peeled off. The removal or peeling of the substrate 11 can be performed, as shown in FIG. 58B, chemically or mechanically (physically) by using a space formed between the nitride-based III-V Group compound semiconductor layer 26 and the substrate 11. More particularly, for example, a given type of etchant or etching gas (reactive gas) is spread into a space to etch the substrate from the sides of the nitride-based III-V Group compound semiconductor layers 15, 26 for the removal or peeling. Alternatively, heat may be applied to the space, protruded portion 12 or peripheral material layers thereof, or ultrasonic waves may be irradiated thereto to mechanically peel off the substrate 11. Moreover, a laser beam such as from a YAG laser, an excima laser or the like may be used for this purpose.

Figure 59B:
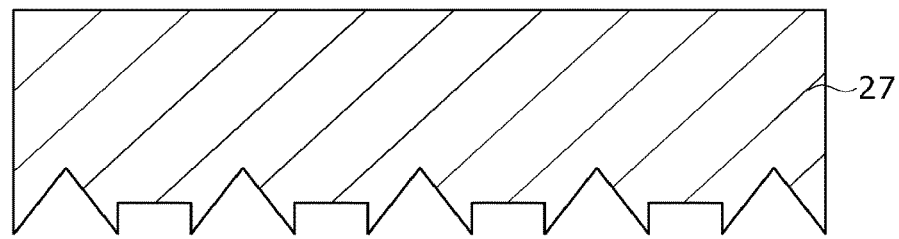

Next, if the protruded portion is left, this is completely removed by etching. In this way, a nitride-based III-V Group compound semiconductor substrate 27 consisting of the nitride-based III-V Group compound semiconductor layers 15, 26 is obtained as shown in FIG. 59B.

For removal or peeling of the substrate 11, there may be used methods including a method in which the protruded portion 12 is selectively dissolved or molten, for example, by a chemical or thermal technique and a method in which a low temperature buffer layer (e.g. a buffer layer made of GaN, AlN, AlGaN, CrN or the like) is selectively dissolved or molten, for example, by a chemical or thermal technique. These methods can be properly selected depending on the resistance or durability of the nitride-based III-V Group compound semiconductor layers 15, 26. Especially, where CrN is used as a material of the protruded portion 12, a CrN buffer layer may be used as a low temperature buffer layer, for which the nitride-based III-V Group compound semiconductor layers 15, 26 can be readily peeled off from the substrate 11, such as a sapphire substrate, in a chemical manner.

At this stage, the nitride-based III-V Group compound semiconductor substrate 27 becomes irregular at the back side thereof, and the back side of the substrate 27 is flattened such as by polishing.

Figure 59C:
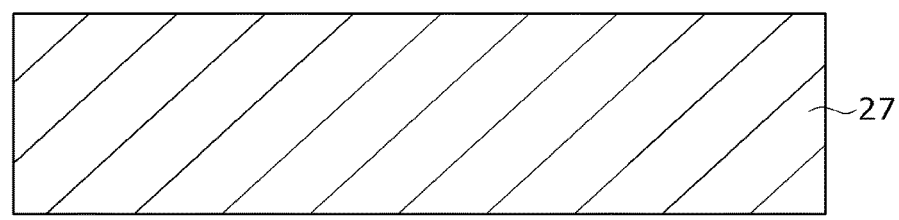

In this manner, as shown in FIG. 59C, there can be obtained the nitride-based III-V Group compound semiconductor substrate 27 in which both main surfaces are flat.

When given types of nitride-based III-V Group compound semiconductor layers are grown on this nitride-based III-V Group compound semiconductor substrate 27, various types of semiconductor devices such as a light-emitting diode can be manufactured.

Next, a twenty-fifth embodiment of the invention is described.

In the twenty-fifth embodiment, as shown in FIG. 57B, a mask (not shown) corresponding to the protruded portion 12 is formed on the nitride-based III-V Group compound semiconductor layer 15 at a portion above the protruded portion 12, after which the nitride-based III-V Group compound semiconductor layer 15 is etched or abraded to a depth indicated by the dashed-dotted line as shown in FIG. 57B, for example, by a RIE method, a powder blasting method, a sand blasting method of the like. In this case, etching or abrasion is stopped prior to exposure of the substrate 11.

Subsequent steps are performed in the same manner as in the twenty-fourth embodiment.

According to the twenty-fourth embodiment, similar advantages as in the first embodiment can be obtained.

Next, a twenty-sixth embodiment of the invention is described.

Figure 60A:
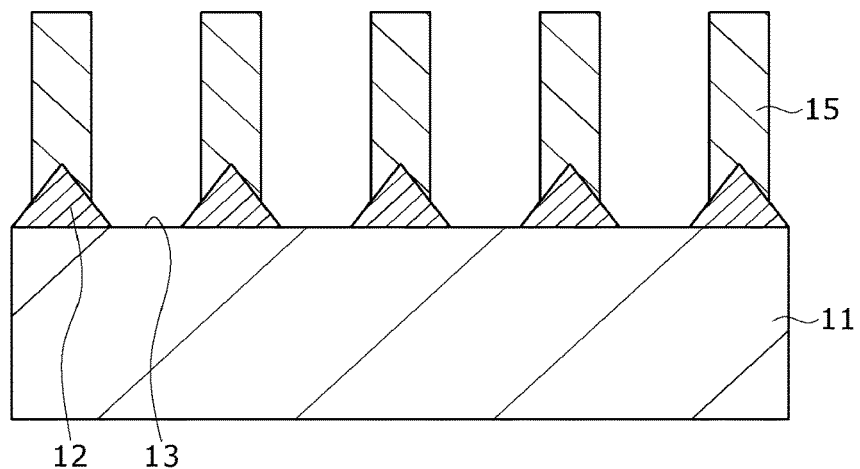
FIGS. 60A and 60B are, respectively, a sectional view illustrating a method for manufacturing a light-emitting diode according to a further embodiment of the invention.

In the twenty-sixth embodiment, as shown in FIG. 60A, a mask (not shown) that is smaller in width than the nitride-based III-V Group compound semiconductor layer 15 at a portion above the protruded portion 12 is formed, after which the nitride-based III-V Group compound semiconductor layer 15 is etched or abraded by use of the mask, for example, by a RIE method until the layer 15 is exposed.

Figure 60B:
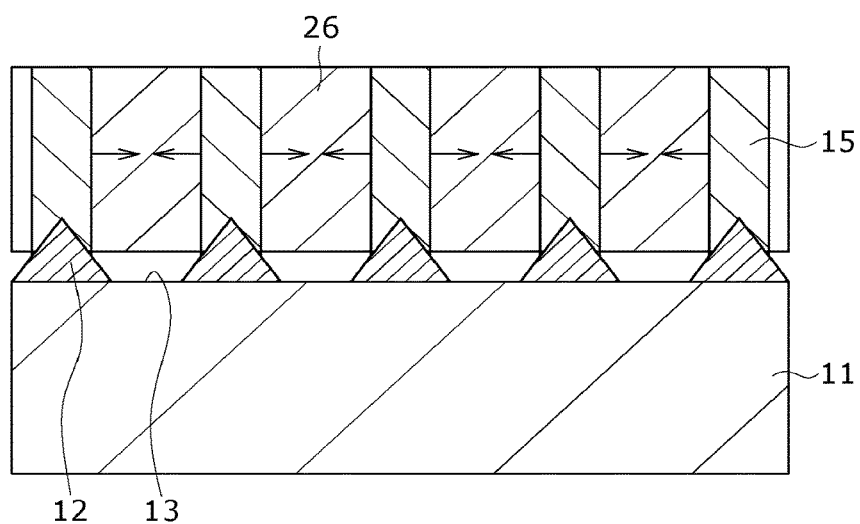

Next, after removal of the mask, as shown in FIG. 60B, a nitride-based III-V Group compound semiconductor layer 26 is laterally grown from opposite sides of the thus patterned nitride-based III-V Group compound semiconductor layer 15 to bury a space between the adjacent nitride-based III-V Group compound semiconductor layers 15. At this time, a space is formed between the nitride-based III-V Group compound semiconductor layer 26 and the substrate 11 as shown.

Thereafter, subsequent steps are performed in the same manner as in the twenty-fourth embodiment.

According to the twenty-sixth embodiment, similar advantages as in the first embodiment can be obtained.

Next, a twenty-seventh embodiment of the invention is described.

Figure 61A:
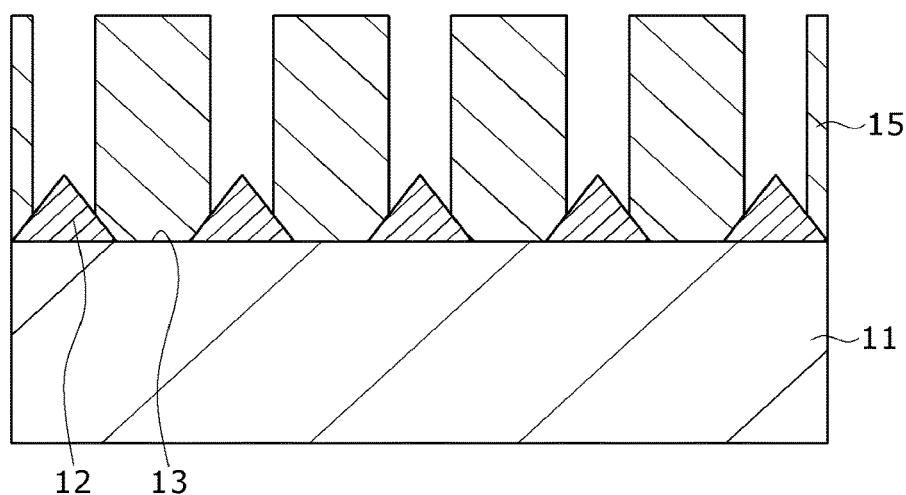
FIGS. 61A and 61B are, respectively, a sectional view illustrating a method for manufacturing a light-emitting diode according to a further embodiment of the invention.

In the twenty-seventh embodiment, as shown in FIG. 61A, a planar mask (not shown) is formed on the nitride-based III-V Group compound semiconductor layer 15 at a portion above the recess portion 12 so as to bridge over part of the protruded portion 12 and all of the recess portions 13. Thereafter, the nitride-based III-V Group compound semiconductor layer 15 is etched such as by a RIE method, or abraded until the protruded portion 12 is exposed.

Figure 61B:
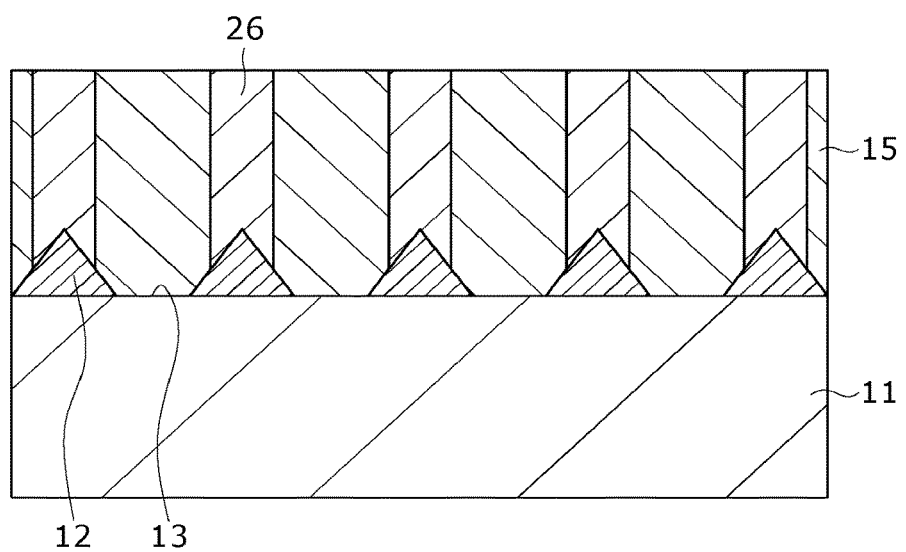

Subsequently, after removal of the mask, as shown in FIG. 61B, a nitride-based III-V Group compound semiconductor layer 26 is laterally grown from opposite sides of the thus patterned nitride-based III-V Group compound semiconductor layer 15 to bury a apace between the adjacent nitride-based III-V Group compound semiconductor layers 15.

Thereafter, subsequent steps are preformed in the same manner as in the twenty-fourth embodiment.

According to the twenty-seventh embodiment, similar advantages as in the first embodiment can be obtained.

Next, a twenty-eighth embodiment of the invention is described.

In the twenty-eighth embodiment, the steps before the formation of the p-side electrode 19 are performed in the same manner as in the first embodiment, and subsequent steps differ therefrom. For the formation of the p-side electrode 19, it is preferred to interpose a Pd-containing layer so as to prevent diffusion of an electrode material (e.g. Ag or the like), or to apply a technique used for a boundary-free, amorphous barrier metal layer by forming a layer of a high melting metal such as Ti, W, Cr or an alloy thereof, or a layer of a nitride of the high melting metal (e.g. TiN, WN, TiWN, CrN or the like) thereon so as to prevent the occurrence of a failure caused by stress, heat or diffusion, toward the p-side electrode 19, of Au or Sn from an Au or Sn-containing layer formed as an upper layer (a solder layer or a bump). The technique of interposing a Pd-containing layer is well known a Pd interposing layer, for example, in a metal plating technique, and materials for the barrier metal layer are known in an Al wiring technique and Ag wiring technique of Si-based electronic devices.

For the purpose of protecting the p-side electrode 19 that is in direct contact with the p-type nitride-based III-V Group compound semiconductor layer 18 and is not resistant to thermal stress, there is shown an instance of laminating, as a protecting layer, a high melting metal such as Ti, W, Cr or an alloy thereof or a nitride of the high melting metal. This protecting layer may be used as an electrode that is in direct contact with the p-type nitride-based III-V Group compound semiconductor layer 18. Because of good stress durability and adhesion reinforcement, the protecting layer may be not only applied to a side of the p-type nitride-based III-V Group compound semiconductor layer 18, but also used, especially, as an n-side electrode 21 in contact with the n-type nitride-based III-V Group compound semiconductor layer 15 in place of a conventionally employed Ti/Pt/Au electrode or as a first-layer n-side electrode. For a method using the adhesion reinforcement, a substrate laminating technique may be utilized, irrespective of the p-side or n-side, for the purpose of strengthening a metal-metal junction or a metal-dielectric junction. A specific example of imparting stress durability or adhesion reinforcement includes one of which in case where the uppermost surface of a p-side electrode 19, which is formed of a single-layer metal film or a multi-layer metal film, is made of Au, a high melting metal film made of Ti, W, Cr or an alloy thereof or a nitride film of the just-mentioned metal is formed on a conductive support substrate, on which an Au film is formed and this Au film is bonded with the p-side electrode 19.

Figure 62A:
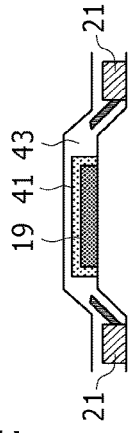
FIGS. 62A to 62J are, respectively, a sectional view illustrating a method for manufacturing a light-emitting diode according to a further embodiment of the invention.

More particularly, in the twenty-eighth embodiment, as shown in FIG. 62A, after formation of the p-side electrode 19, a Ni film 41 is formed by a lift method or the like so as to cover the p-side electrode 19 therewith. Next, although not shown, a Pd film is, for example, formed to cover the Ni film 41, and a metal nitride film, e.g. a film of TiN, WN, TiWN, CrN or the like, is formed to cover the Pd film, followed by further formation of a film of Ti, W, Mo, Cr or an alloy thereof so as to cover the Pd film, if necessary. Alternatively, a Pd film may be formed so as to cover the p-side electrode 19 without formation of the Ni film 41, followed by formation of a film of TiN, WN, TiWN, CrN or the like to cover the Pd film and, if necessary, further formation of a film of Ti, W, Mo, Cr or an alloy thereof to cover the nitride film.

Figure 62B:
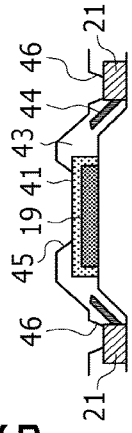

Next, as shown in FIG. 62B, a resist pattern 42 of a given form is formed to cover the Ni film 41 and the Pd film by lithography.

Figure 62C:
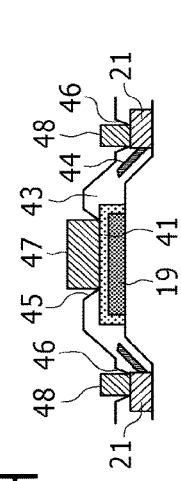

As shown in FIG. 62C, etching is carried out, for example, by a RIE method using the resist pattern 42 as a mask to form a mesa portion 20 of a trapezoid in section. The angle made between the inclined surface of the mesa portion 20 and the main surface of the substrate 11 is, for example, at 35 degrees. If necessary, a λ/c dielectric film (λ is an emission wavelength) is formed on the inclined surfaces of the mesa portion 20.

Figure 62D:
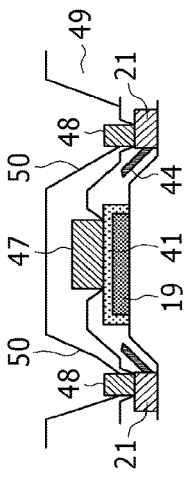

As shown in FIG. 62D, an n-side electrode 21 is formed on the n-type nitride-based III-V Group compound semiconductor layer 15.

Figure 62E:
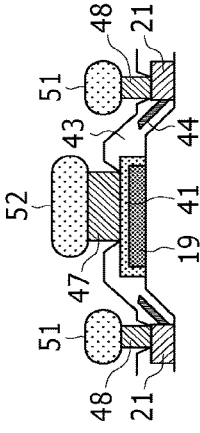

Next, as shown in FIG. 62E, a SiO$_2$ film 43 is formed on the entire surface of the substrate as a passivation film. Where taking adhesion to an underlying layer, durability and corrosion resistance in process applications into account, a SiN film or a SiON film may be used in place of the SiO$_2$ film.

Figure 62F:
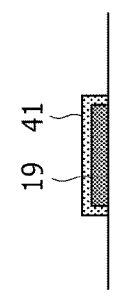

As shown in FIG. 62F, the SiO$_2$ film 43 is thinned by etching back, after which an Al film 44 is formed, as a reflective film, on the SiO$_2$ film 43 on the inclined surface of the mesa portion 20. This Al film 44 is provided to reflect light generated from the active layer 17 toward the side of the substrate 11 to improve the light extraction efficiency. The Al film 44 is formed in contact with the n-side electrode 21 at one end thereof. This is for the purpose of increasing light reflection by not permitting a space to be created between the Al film 44 and the n-side electrode 21. Thereafter, a SiO$_2$ film 43 is again formed to provide a thickness sufficient for the passivation film.

Figure 62G:
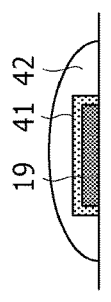

Next, as shown in FIG. 62G, the SiO$_2$ film 43 is removed by etching at portions thereof over the Ni film 41 and n-side electrode 21 to form openings 45, 46 thereby exposing the Ni film 41 and the n-side electrode 21 at these portions.

Figure 62H:
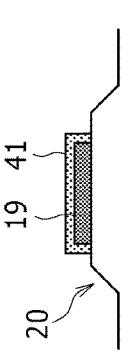

Next, as shown in FIG. 62H, a pad electrode 47 is formed on the Ni film 41 at the opening 45, and a pad electrode 48 is also formed on the n-side electrode 21 at the opening 46.

Figure 62I:
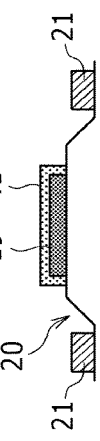

As shown in FIG. 62I, a bump mask material 49 is formed over the entire substrate surface, after which the bump mask material 49 is removed by etching at a portion above the pad electrode 48 to form an opening 50, and the pad electrode 48 is exposed at this portion.

Figure 62J:

As shown in FIG. 62J, the bump mask material 49 is used to form an Au bump 51 on the pad electrode 48. Next, the bump mask material 49 is removed. After forming a bump mask material (not shown) over the entire substrate surface again, the bump mask material is removed by etching at a portion thereof above the pad electrode 47 to form an opening, thereby permitting the pad electrode 47 to be exposed at the portion. Thereafter, an Au bump 52 is formed on the pad electrode 47.

If necessary, the substrate 11 on which a light-emitting diode structure has been formed in a manner as set out hereinabove is polished or lapped from the back side thereof to decrease the thickness thereof. The substrate 11 is subsequently scribed to form a bar. The bar is further scribed to provide a chip.

It will be noted that the electrode laminate structure illustrated in FIGS. 62A to 62J is merely an instance and especially, where the respective electrode layers are formed as multi-layered, it is necessary to improve adhesion between the p-side electrode 19 made of an Ag electrode and other metal layers, stress durability and anti-cracking property, to make a low contact resistance and to allow for high reflectivity by keeping the quality such as of an Ag electrode while taking into account suppression of stress occurrence ascribed to the differences in coefficient of thermal expansion of the respective metal layers accompanied by the rise of device temperature and suppression of diffusion between adjacent metal layers. Accordingly, such an Al wiring technique for Si-based electronic devices as set out above should be applied to, if necessary.

Next, a twenty-ninth embodiment of the invention is described.

In the twenty-ninth embodiment, the manufacture of a light-emitting diode backlight is described using, in addition to the blue light-emitting diode and green light-emitting diode obtained according to the method of the first embodiment, a separately provided red light-emitting diode (e.g. an AlGaInP light-emitting diode).

In the same manner as in the first embodiment, a blue light-emitting diode structure is formed on a substrate 11, and a bump (not shown) is formed on a p-side electrode 19 and an n-side electrode 21, respectively, followed by chipping to obtain a blue light-emitting diode in the form of a flip-chip. Likewise, a green light-emitting diode is obtained in the form of a flip-chip. On the other hand, a red light-emitting diode is formed such that an AlGaInP semiconductor is stacked on an n-type GaAs substrate to provide a diode structure, on which a p-side electrode is formed to provide an AlGaInP light-emitting diode in the form of a chip.

Figure 63A:
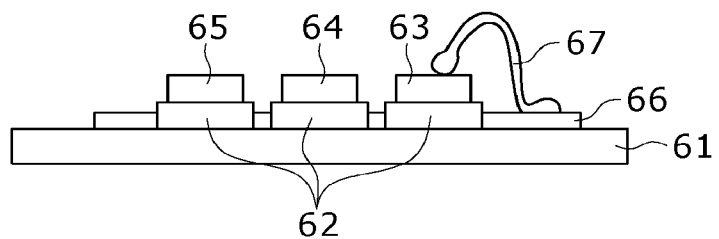
FIGS. 63A to 63C are, respectively, a sectional view illustrating a method for manufacturing a light-emitting diode backlight according to a further embodiment of the invention.

These red light-emitting diode chip, green light-emitting diode chip and blue light-emitting diode chip are, respectively, mounted on a submount such as of AlN. These submounts are mounted on a substrate such as, for example, an Al substrate in such a way that the submount is turned down. This is particularly shown in FIG. 63A. In FIG. 63A, indicated by 61 is a substrate, by 62 is a submount, by 63 is a red light-emitting diode chip, by 64 is a green light-emitting diode, and by 65 is a blue light-emitting diode chip. These red light-emitting diode chip 63, green light-emitting diode chip 64 and blue light-emitting diode chip 65 each have a chip size, for example, of 350 μm square. The red light-emitting diode chip 63 is mounted so that the n-side electrode is on the submount 62, and the green light-emitting diode chip 64 and the blue light-emitting diode chip 65 are mounted such that the p-side electrode and the n-side electrode are on the submounts 62 through a bump, respectively. The submount 62 on which the red light-emitting diode chip 63 is mounted has an extraction electrode (not shown) for n-side electrode formed in a given pattern. The n-side electrode side of the red light-emitting diode chip 63 is mounted in position of the extraction electrode. A wire 67 is bonded for connection between the p-side electrode of the red light-emitting diode chip 63 and a given pad electrode 66 formed on the substrate 61, and a wire (not shown) is bonded for connection between one end of the extraction electrode and another pad electrode formed on the substrate 61. The submount 62 on which the green light-emitting diode chip 64 is mounted is formed thereon with an extraction electrode for p-side electrode and an extraction electrode for n-side electrode (both not shown) in a given pattern, respectively. The p-side electrode and n-side electrode of the green light-emitting diode chip 64 are, respectively, mounted on given portions of the extraction electrode for p-side electrode and the extraction electrode for n-side electrode through bumps. A wire (not shown) is bonded for connection between one end of the extraction electrode for p-side electrode of the green light-emitting diode chip 64 and a pad electrode provided on the substrate 61, and a wire (not shown) is bonded for connection between one end of the extraction electrode for n-side electrode and a pad electrode provided on the substrate 61. This is true of the blue light-emitting diode chip 65.

It will be noted that the submounts 62 may be omitted, in which the red light-emitting diode chip 63, green light-emitting diode chip 64 and blue light-emitting diode chip 65 are mounted directly on an optional type of printed circuit board having a heat dissipating property, or an inner or outer wall of a board or casing having the function as a printed circuit board. This permits the light-emitting diode backlight or panel to be reduced in cost as a whole.

Figure 63B:
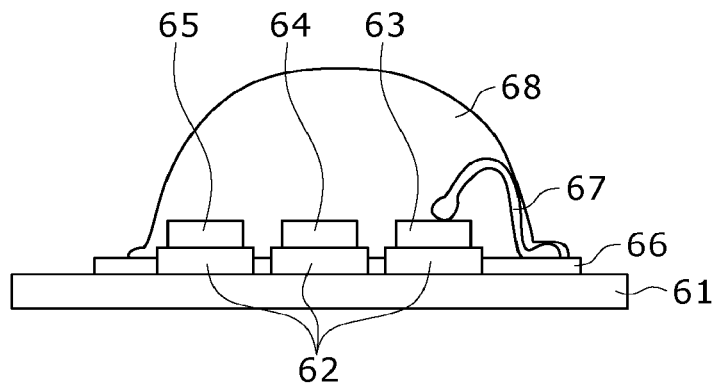
Figure 63C:
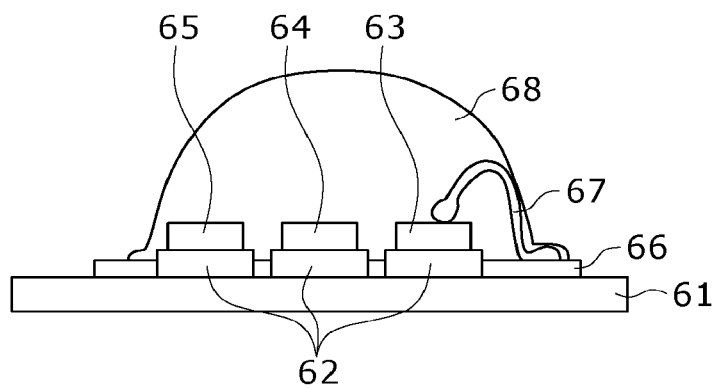
Figure 64:
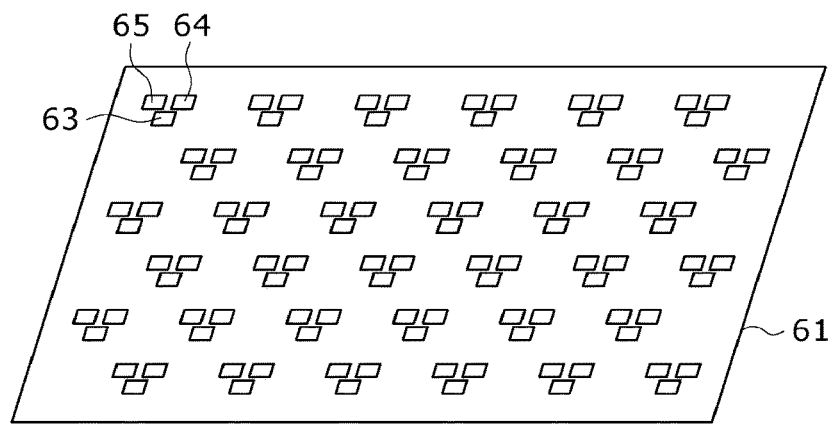
FIG. 64 is a perspective view illustrating a method for manufacturing a light-emitting diode backlight according to the further embodiment of the invention.
Figure 65:
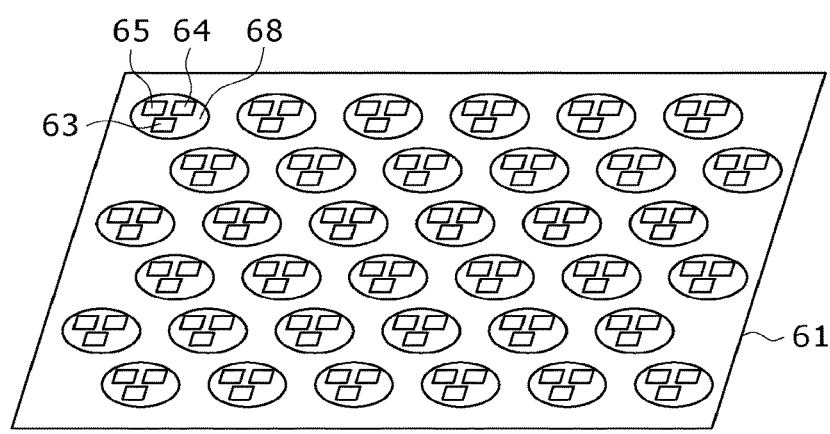
FIG. 65 is a perspective view illustrating a method for manufacturing a light-emitting diode backlight according to the further embodiment of the invention.

Such a red light-emitting diode chip 63, green light-emitting diode chip 64 and blue light-emitting diode chip 65 as set out above are provided as a unit (cell), and a necessary number of cells are arranged on the substrate 61 in a given pattern. An example of the arrangement is shown in FIG. 64. Next, as shown in FIG. 63B, potting with a transparent resin 68 is performed so as to cover the unit therewith. Thereafter, the transparent resin 68 is cured. The transparent resin 68 is solidified by the curing and undergoes contraction slightly according with the solidification (FIG. 63C). In this way, as shown in FIG. 65, there can be obtained a light-emitting diode backlight in which units, each made of the red light-emitting diode chip 63, green light-emitting diode chip 64, and blue light-emitting diode chip 65, are arranged in an array on the substrate 61. In this case, the transparent resin 68 is in contact with the back side of the substrate 11 of the green light-emitting diode chip 64 and blue light-emitting diode chip 65, so that the difference in refractive index becomes smaller than with the case where the back side of the substrate 11 is in direct contact with air. This entails a reduced ratio of reflection, at the back side of the substrate 11, of light that passes through the substrate 11 to outside, thereby improving a light extraction efficiency and thus improving an emission efficiency.

This light-emitting diode backlight is suited for use, for example, as a backlight of liquid crystal panels.

Next, a thirtieth embodiment of the invention is described.

Figure 66:
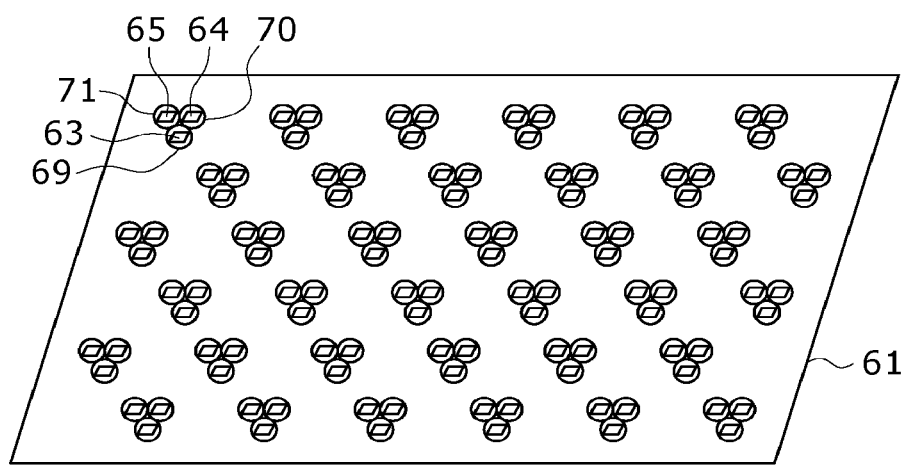
FIG. 66 is a perspective view illustrating a method for manufacturing a light-emitting diode backlight according to a further embodiment of the invention.
Figure 67:
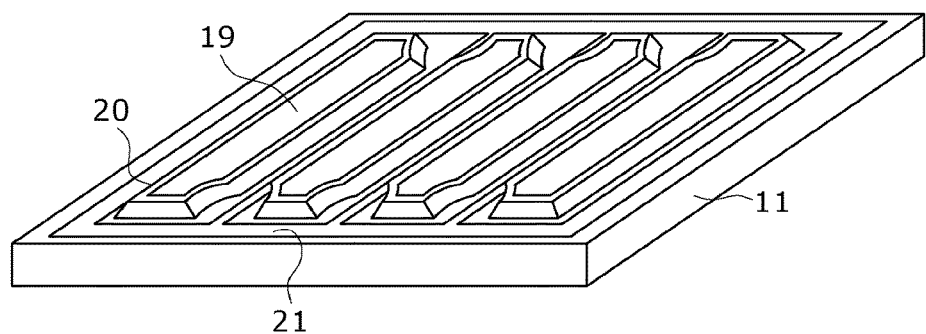
FIG. 67 is a perspective view showing an integrated light-emitting diode manufactured according to a further embodiment of the invention.

In the thirtieth embodiment, a necessary number of red light-emitting diode chips 63, green light-emitting diode chips 64 and blue light-emitting diode chips 65 are arranged in a given pattern, like the twenty-ninth embodiment. Thereafter, as shown in FIG. 66, a transparent resin 69 suited for the red light-emitting diode chip 63 is used for potting so as to cover this light-emitting diode chip 63 therewith. Likewise, potting with a transparent resin 70 suited for the green light-emitting diode chip 64 is effected so as to cover this light-emitting diode chip 64 therewith. Potting with a transparent resin 71 suited for the blue light-emitting diode chip 65 is effected so as to cover the blue light-emitting diode chip 65 therewith. Thereafter, the transparent resins 69 to 71 are, respectively, cured. The resins 69 to 71 are solidified by the curing and undergo contract slightly according with the solidification. In this manner, units, each made of the red light-emitting diode chip 63, green light-emitting diode chip 64 and blue light-emitting diode chip 65, are arranged in an array on the substrate 61 to obtain a light-emitting diode backlight. In this case, the transparent resins 70, 71 are in contact with the back side of the substrate 11 of the green light-emitting diode chip 64 and blue light-emitting diode chip 65, so that the difference in refractive index becomes smaller than with the case where the back side of the substrate 11 is in direct contact with air. This entails a reduced ratio of reflection, at the back side of the substrate 11, of light that passes through the substrate 11 to outside, thereby improving a light extraction efficiency and thus improving an emission efficiency.

This light-emitting diode backlight is suited for use, for example, as a backlight of liquid panels.

Next, a thirty-first embodiment of the invention is described.

Figure 68:
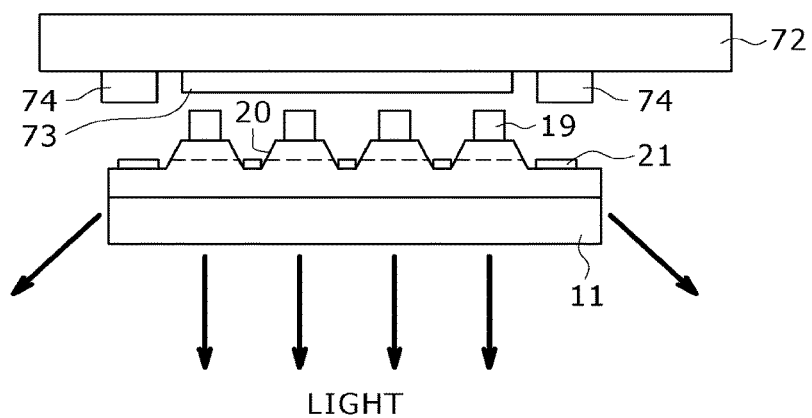
FIG. 68 is a sectional view showing how the integrated light-emitting diode, which is manufactured according to the thirty-first embodiment of the invention, is mounted on a submount.

In the thirty-first embodiment, a light-emitting diode structure is formed on a substrate 11 according to the method of the first embodiment, a p-side electrode 19 and an n-side electrode 21 are, respectively, shaped in a striped form. A bump (not shown) is formed on the p-side electrode 19 and the n-side electrode 21, respectively, followed by scribing the substrate to provide a quadrangular piece with a given size. Thus, an integrated light-emitting diode having striped emission units is obtained. In this case, the n-side electrode 21 is formed to surround a striped mesa portion 20. As shown in FIG. 68, this integrated light-emitting diode is mounted on a submount 72 made of AlN or the like. In this case, the submount 72 is formed thereon with an extraction electrode for p-side electrode and an extraction electrode for n-side electrode (both not shown) in given patterns, respectively, on which solders 73, 74 are formed. The p-side electrode 19 and n-side electrode 21 of the integrated light-emitting diode are, respectively, aligned on the solders 73 and 74, after which the solders 73, 74 are melted for bonding.

The respective light-emitting diodes may be provided with a protection circuit for the purpose of protection from overcurrent (e.g. a zener diode in (inverse-parallel) parallel connection) at a position not impeding light extraction.

Next, a thirty-second embodiment of the invention is described,

In the thirty-second embodiment, the manufacture of a light source cell unit using, addition to the blue light-emitting diode and green light-emitting diode obtained according to the method of the first embodiment, a separately provided red light-emitting diode is described.

Figure 69A:
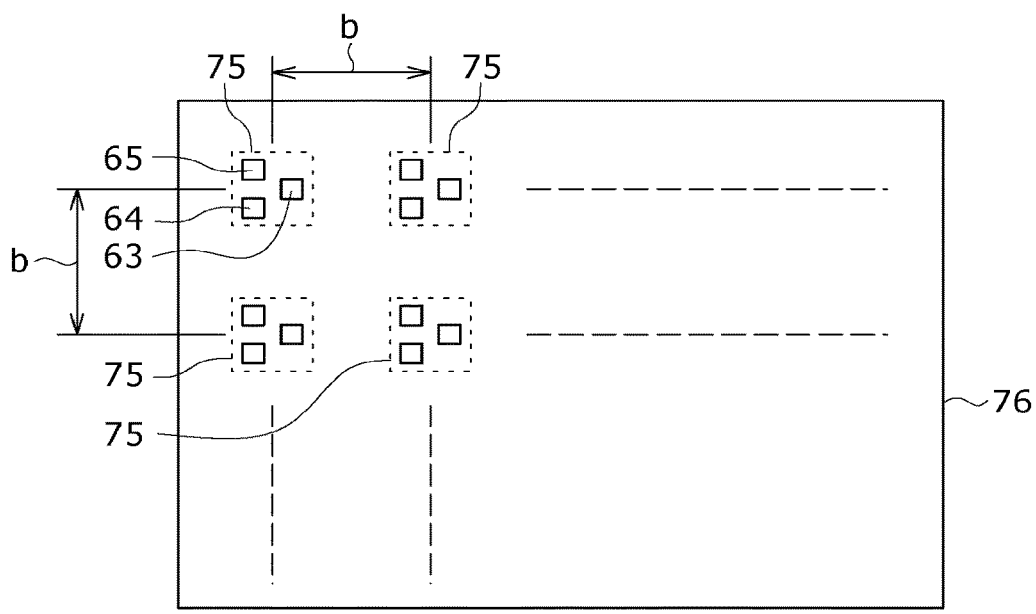
FIGS. 69A and 69B are, respectively, a plan view showing a light source cell unit and an enlarged view of the cell of the light source cell unit according to a further embodiment of the invention.
Figure 69B:
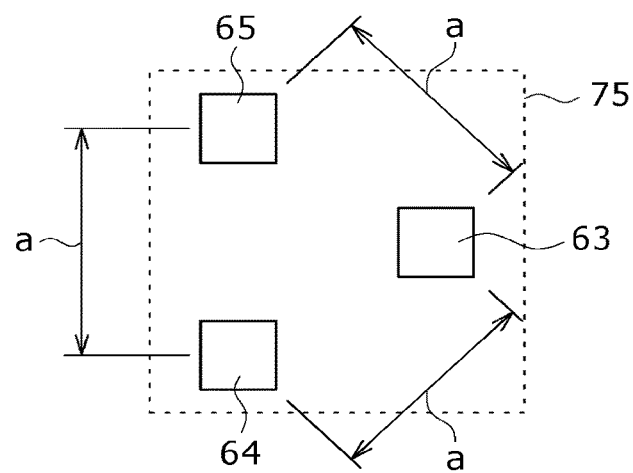

As shown in FIG. 69A, in the thirty-second embodiment, a necessary number of cells 75, each containing at least one of each of a red light-emitting diode chip 63, a green light-emitting diode chip 64 and a blue light-emitting diode chip 65 and arranged in a given pattern, are arranged in a given pattern on a printed circuit board 76, like the twenty-ninth embodiment. In this instance, individual cells 75 contain one red light-emitting diode chip 63, one green light-emitting diode chip 64 and one blue light-emitting diode chip 65, which are arranged at apexes of a regular triangle. FIG. 69B shows a cell 75 as enlarged. The interval a between the red light-emitting diode chip 63, green light-emitting diode chip 64 and blue light-emitting diode chip 65 in each cell 75 is, for example, at 4 mm although not limited to this value. The interval b between the cells 75 is, for example, at 30 mm although not limited to this value. For the printed circuit board 76, there can be used, for example, an FR4 (abbreviation of flame retardant type 4) substrate, a metal core substrate, a flexible printed board or the like although not limited thereto. This is because others may also be used so far as they are printed circuit boards having a heat dissipating property. Like the twenty-ninth embodiment, potting with a transparent resin is effected so as to cover each cell 76 therewith. Alternatively, like the thirtieth embodiment, potting with a transparent resin 69 may be effected so as to cover the red light-emitting diode chip 63, potting with a transparent resin 70 may be carried out to cover the green light-emitting diode chip 64, and potting with a transparent resin 71 may be carried out to cover the blue light-emitting diode chip 65. In this way, the cells 75, each consisting of the red light-emitting diode chip 63, green light-emitting diode chip 64 and blue light-emitting diode chip 65, are arranged on the printed circuit board 76 to obtain a light source cell unit.

Figure 70:
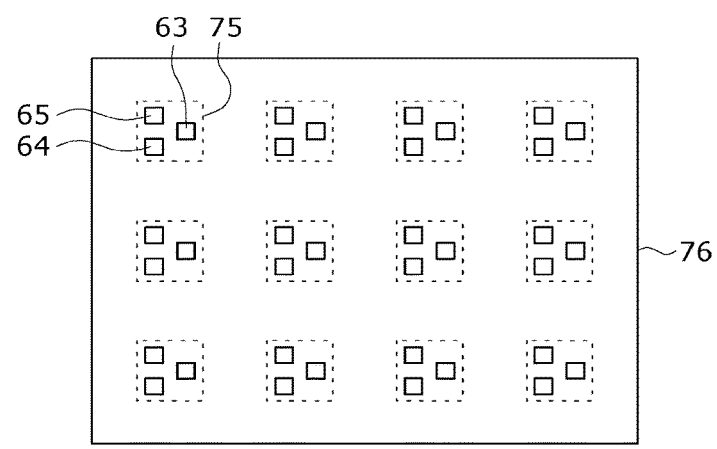
FIG. 70 is a plan view showing a specific example of a light source cell unit according to the further embodiment of the invention.
Figure 71:
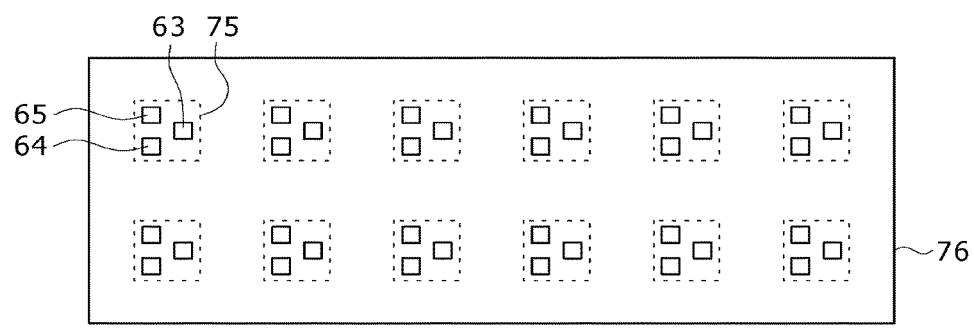
FIG. 71 is a plan view showing another example of a light source cell unit according to the further embodiment of the invention.

Specific examples of arrangement of the cells 75 in the printed circuit board 76 are shown in FIGS. 70 and 71, respectively, although not limited thereto. The instance shown in FIG. 70 is one of which the cells 75 are arranged in 4×3 two-dimensional array, and the instance shown in FIG. 71 is one of which the cells 75 are arranged in 6×2 two-dimensional array.

Figure 72:
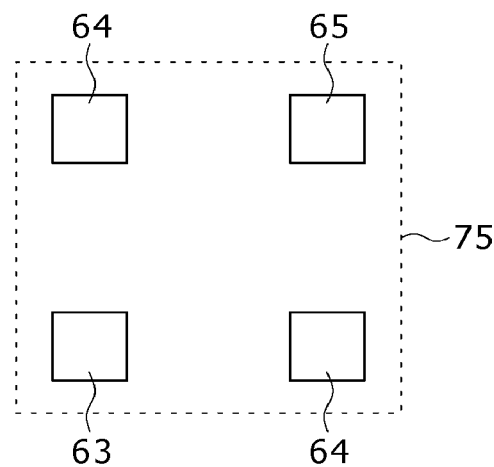
FIG. 72 is a plan view showing a further example of a light source cell unit according to the further embodiment of the invention.

FIG. 72 shows other arrangement of the cells 75. In this instance, the cells 75 each contain one red light-emitting diode chip 63, two green light-emitting diode chips 64 and one blue light-emitting diode chip 65, which are arranged, for example, at apexes of a square tetragon. The two green light-emitting diode chips 64 are placed at vertexes at opposite ends of one diagonal line of the square tetragon, and the red light-emitting diode chip 63 and the blue light-emitting diode chip 65 are arranged at vertexes at opposite ends of another diagonal line.

If this light source cell unit is arrayed singly or plurally, there can be obtained a light-emitting diode backlight suited, for example, as a backlight of liquid crystal panels.

Figure 11:
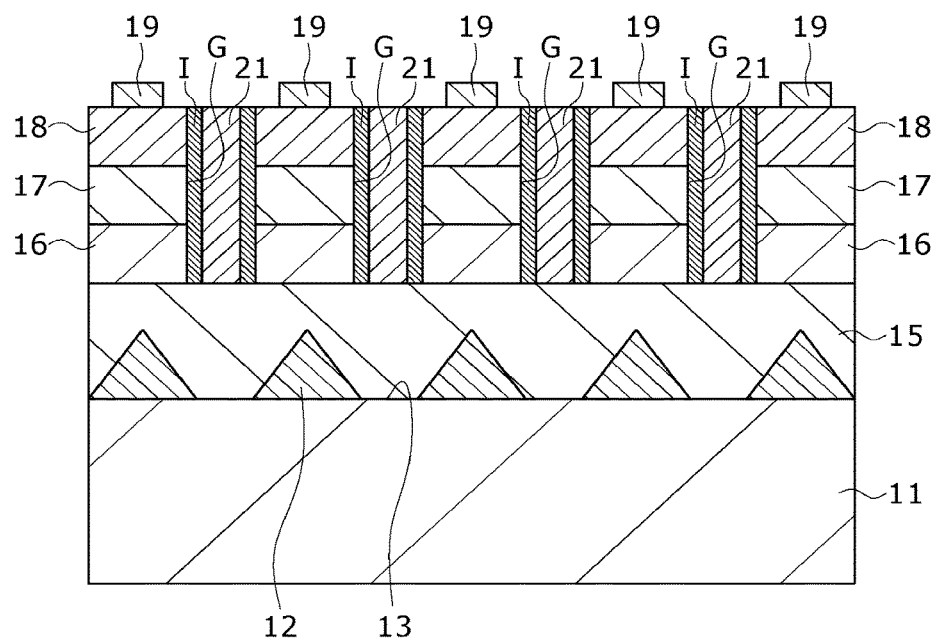
FIG. 11 is a sectional view of other structural example of the light-emitting diode manufactured according to the embodiment of the invention.

For the red light-emitting diode chip 63, green light-emitting diode chip 64 and blue light-emitting diode chip 65 of the cell 75, being shown in FIGS. 7 to 11, particularly in FIG. 11, a double-layer wiring technique is used for the wiring of the p-side electrode 19 and n-side electrode 21 may be mounted on the printed circuit board 76, or may be mounted on the printed circuit board 76 via a submount.

It will be noted that although it is general that the pad electrode portions and wiring portions on the printed circuit board 76 are conventionally formed of Au, all or part thereof may be formed of a high melting metal having good durability and adhesion reinforcement, such as Ti, W, Cr or an alloy thereof, or a nitride of the metal, on which Au is formed. These materials may be formed, for example, by electroplating, electroless plating, vacuum deposition (flash deposition), sputtering or the like. Alternatively, the pad electrode portions or wiring portions are formed of Au, on which such materials as mentioned above may be formed. Still alternatively, the pad electrode portions or wiring portions may be formed of a high melting metal such as Ti, W, Cr or an alloy thereof, which is subsequently nitrided and is again formed thereon with a high melting metal layer such as Ti, W, Cr or an alloy thereof so that the surface is returned to the state prior to the nitriding. Thereafter, the light-emitting diode chips 63 to 65 are die bonded from the side of a TiW electrode or an Au electrode, if necessary, through a single-layer film made of Ti, W, Cr, Au or the like.

When mounting protective chips (circuits) connected to the light-emitting diode chips 63 to 65 mounted on the printed circuit board 76, a base-opened transistor device (circuit), a trigger diode device (circuit), a negative resistor device (circuit) and the like, such an electrode structure as set out above using a high melting metal such as Ti, W, Cr or an alloy thereof or a nitride of the metal may be adopted for the purpose of improving reliability of the light source cell unit with respect to adhesion strength, thermal stress durability and the like.

Portions of the printed circuit board 76 other than the transparent resins 68 to 71 formed by potting may be finally, thickly coated with a resist that is as white as possible so that light from the light-emitting diode chips 63 to 65 are suppressed from absorption with the printed circuit board 76.

Although the embodiments of the invention have been particularly illustrated, this invention should not be construed as limiting to these embodiments and many variations and alterations may be possible within the scope of the invention.

For instance, the numerical values, types of materials, structures, shapes, types of substrate, starting materials, processes and orientations of protruded portion 12 and recess portion 13 indicated in first to thirty-second embodiments are by way of example only. If necessary, numerical values, materials, structures, shapes, substrates, starting materials and processes that differ from those illustrated may be used.

More particularly, for example, in the first to thirty-second embodiments, the p-type layer and n-type layer may be reversed with respect to the conduction type.

If necessary, two or more of the first to thirty-second embodiments may be combined.

It will be noted that light-emitting diodes having a patterned indented surface structure at a light extraction face or light reflection face include those shown in FIGS. 73 to 76.

In the light-emitting diode shown in FIG. 73, an n-type nitride-based III-V Group compound semiconductor layer 82, an n-type nitride-based III-V Group compound semiconductor layer 83, an active layer 84, a p-type nitride-based III-V Group compound semiconductor layer 85 and a p-type nitride-based III-V Group compound semiconductor layer 86 are successively grown on a substrate 81. Thereafter, the nitride-based III-V Group compound semiconductor layer 83, active layer 84, p-type nitride-based III-V Group compound semiconductor layer 85 and p-type nitride-based III-V Group compound semiconductor layer 86 are etched to form a mesa portion 87. The p-type nitride-based III-V Group compound semiconductor layer 86 is subjected to surface indentation and a p-side electrode 88 is buried in the recessed portion. An n-side electrode 89 is formed on the n-type nitride-based III-V Group compound semiconductor layer 82 at a portion adjacent to the mesa portion 87. With this light-emitting diode, light maybe extracted from the side of the substrate 81 or may be extracted from the side of the p-type nitride-based III-V Group compound semiconductor layer 86. For the substrate 81, such a substrate as the substrate 11 may be used.

Figure 74:
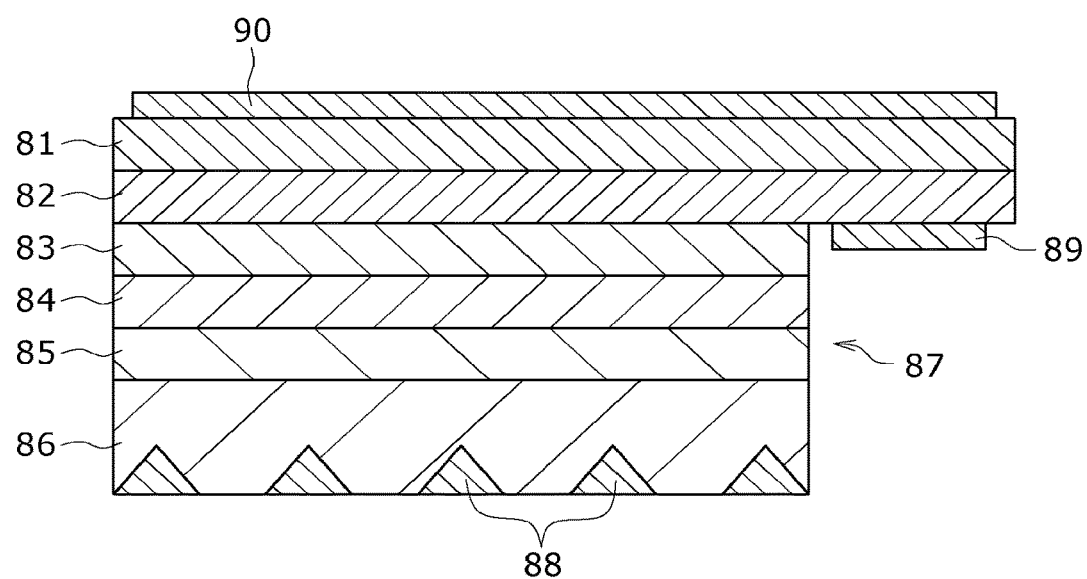
FIG. 74 is a sectional view showing a further example of a light-emitting diode.

In the light-emitting diode shown in FIG. 74, such a structure as shown in FIG. 73 is used except that a reflective film 90 is formed on the back side of the substrate 81. This reflective film 90 permits light generated from the active layer 84 is reflected toward the side of the p-type nitride-based III-V Group compound semiconductor layer 86, so that light is likely to be extracted from the side of the p-type nitride-based III-V Group compound semiconductor layer 86 to outside.

Figure 75:
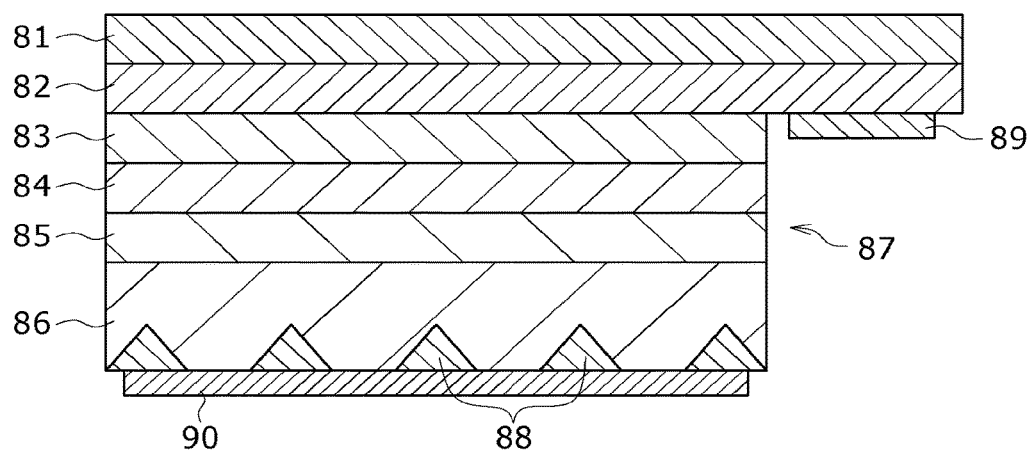
FIG. 75 is a sectional view showing a still further example of a light-emitting diode.

In the light-emitting diode shown in FIG. 75, such a structure as shown in FIG. 73 is used except that a reflective film 90 is formed on the back side of the p-side nitride-based III-V Group compound semiconductor layer 86. This reflective film 90 permits light generated from the active layer 84 to be reflected toward the side of the substrate 11 and, thus light is like to be taken out from the side of the substrate 11 to outside.

Figure 76:
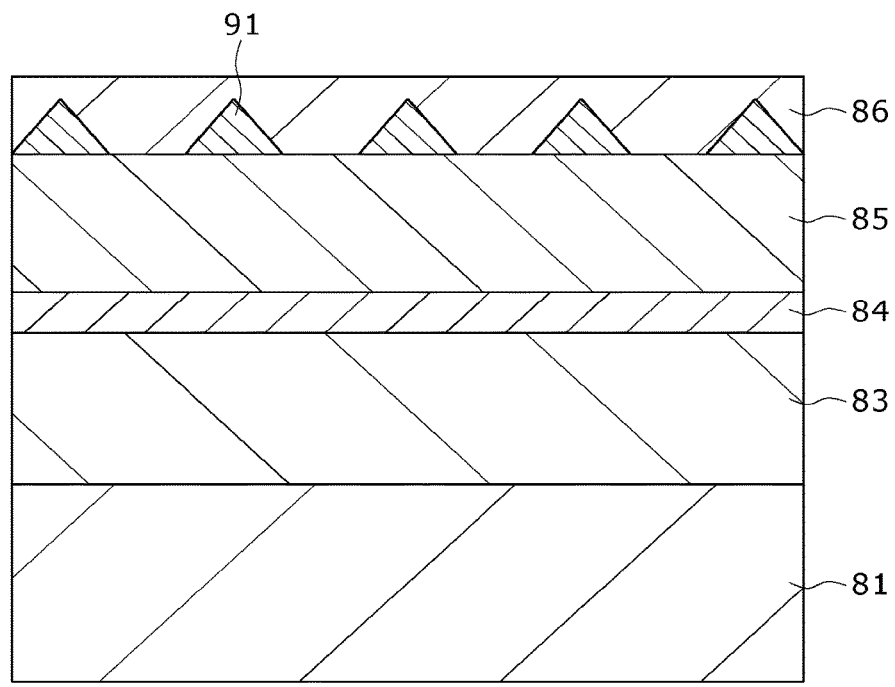
FIG. 76 is a sectional view showing a yet further example of a light-emitting diode.
Figure 77A:
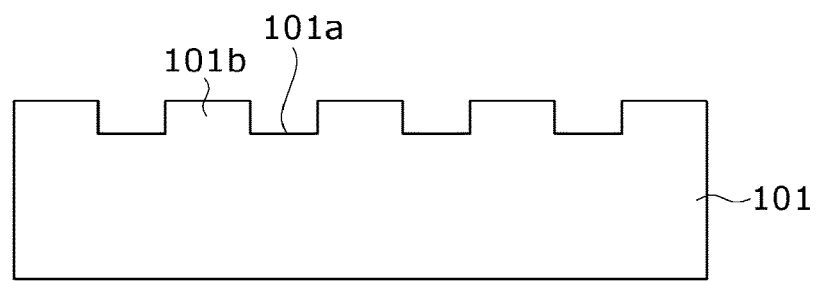
FIGS. 77A to 77C are, respectively, a sectional view illustrating a method of growing a GaN semiconductor layer on a conventional indented substrate.
Figure 77B:
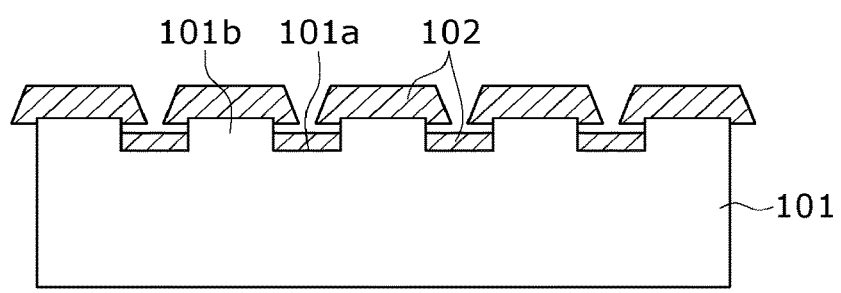
Figure 77C:
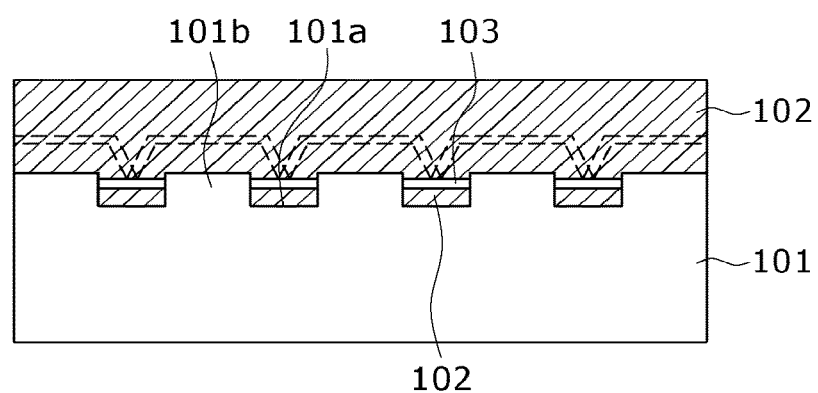
Figure 78:
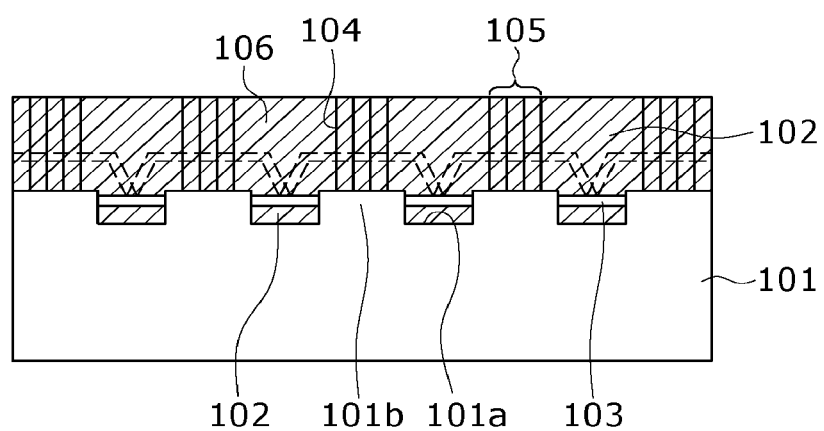
FIG. 78 is a sectional view illustrating a problem involved in a method of growing a conventional GaN semiconductor layer shown in FIGS. 77A to 77C.
Figure 79A:
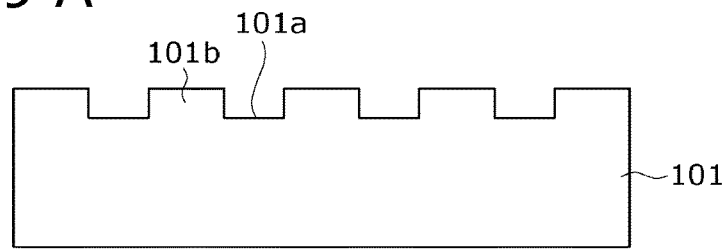
FIGS. 79A to 79D are, respectively, a sectional view illustrating a method of growing a GaN semiconductor substrate on a conventional, indented substrate.
Figure 79B:
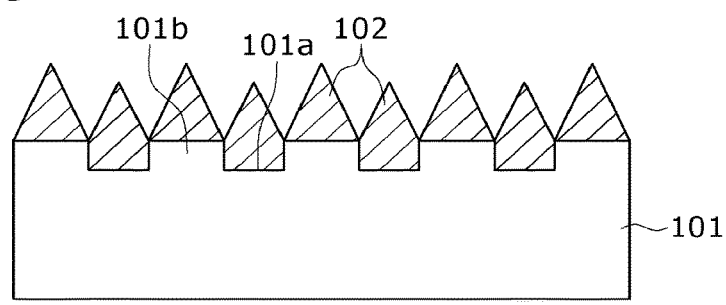
Figure 79C:
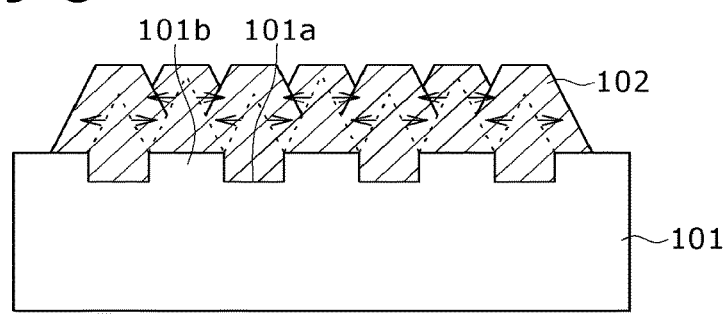
Figure 79D:
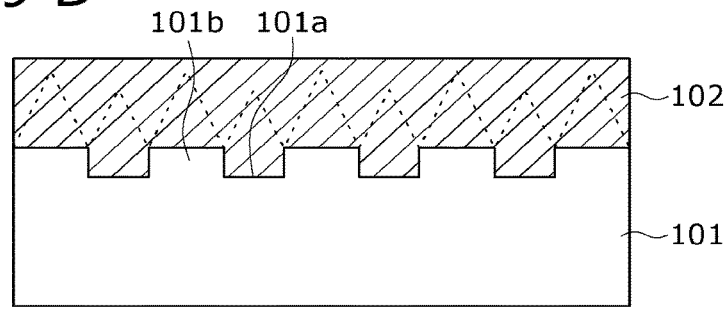
Figure 80A:
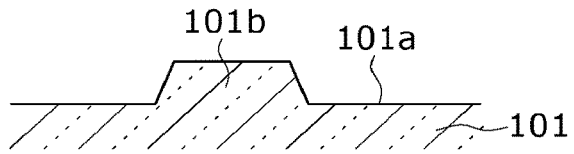
FIGS. 80A to 80F are, respectively, a sectional view illustrating a method of growing a GaN semiconductor layer on another type of indented substrate.
Figure 80B:
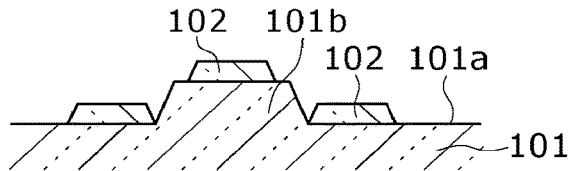
Figure 80C:
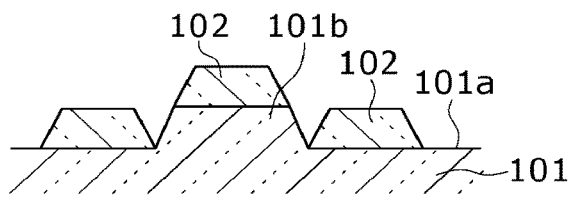
Figure 80D:
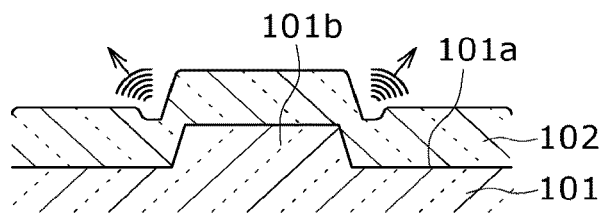
Figure 80E:
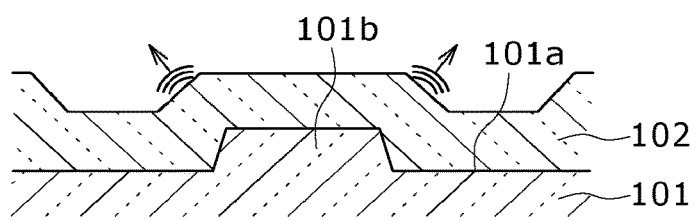
Figure 80F:
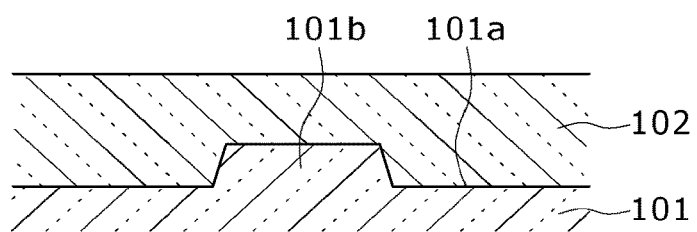
Figure 81A:
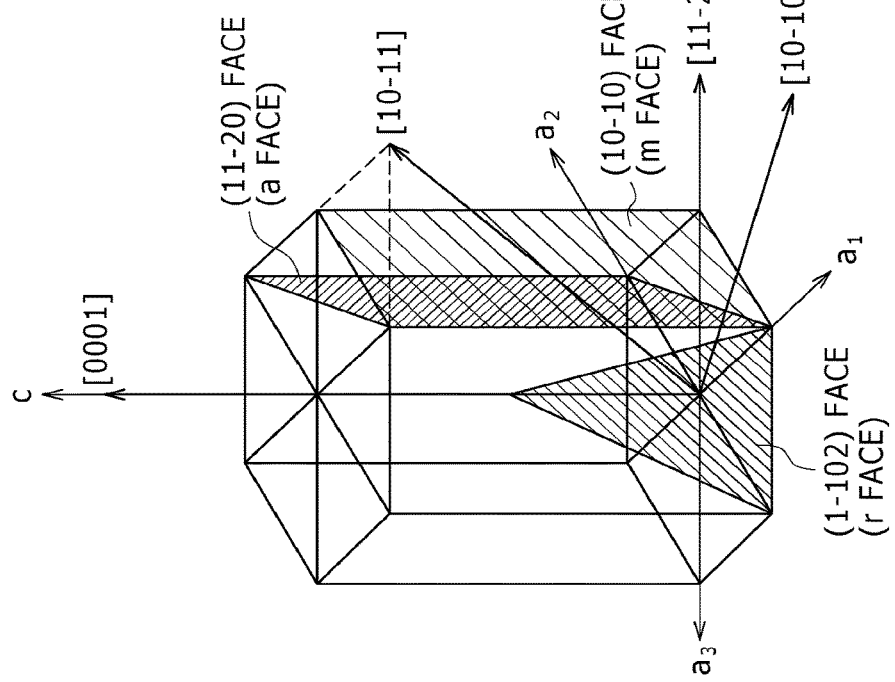
FIGS. 81A and 81B are, respectively, a schematic view showing main crystal faces and crystal orientations of sapphire.
Figure 81B:
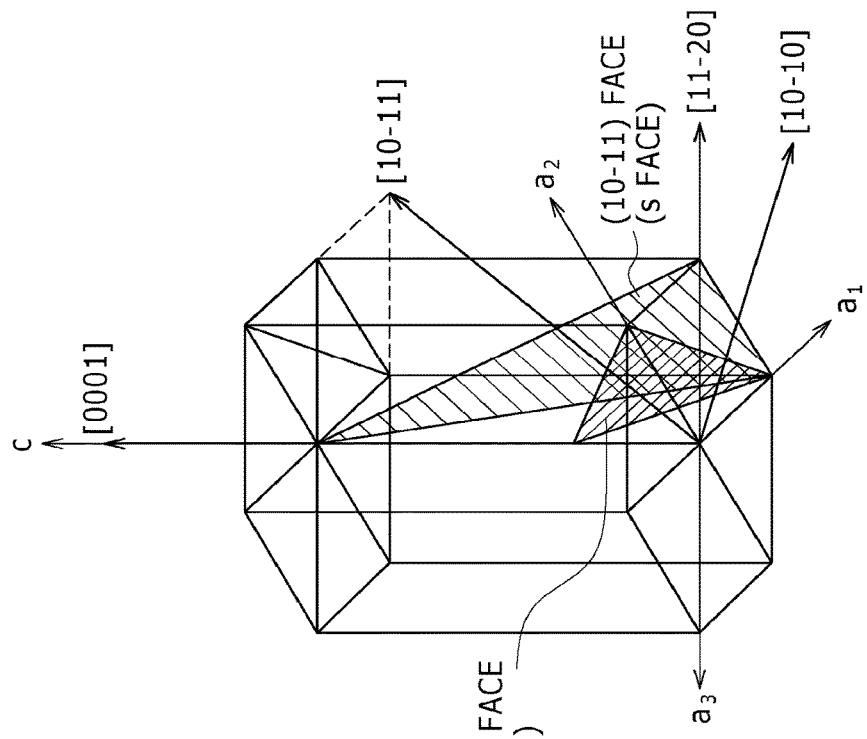

In the light-emitting diode shown in FIG. 76, after epitaxial growth, on the substrate 81, of the n-type nitride-based III-V Group compound semiconductor layer 83, active layer 84 and p-type nitride-based III-V Group compound semiconductor layer 85, protruded portions 91 are formed thereon, followed by growth of a p-type nitride-based III-V Group compound semiconductor layer 86 in the same manner as in the first embodiment. The protruded portion 91 is similar to the protruded portion 12.

It will be noted that in FIG. 76, a reflective electrode may be formed on the p-type nitride-based III-V Group compound semiconductor layer 86 in contact with the protruded portion 91. Alternatively, the irrespective of material of the protruded portion 91 being optically transparent or reflective, the thickness of the p-type nitride-based III-V Group compound semiconductor layer 24 may be properly adjusted, for example, to λ/4, on which a reflective electrode is formed in contact with the protruded portion 91, followed by further formation of a p-side electrode. This permits a structure in which light generated at the active layer 84 from arbitrary directions is reflected from the side of the substrate 81 at high reflectivity while ensuring a good current pass from the p-side electrode upon operation of the light-emitting diode.

What is claimed is:

1. A light-emitting diode comprising:
   a first nitride-based III-V compound semiconductor layer with oppositely facing first and second planar surfaces;
   a plurality of similarly shaped protruding portions embedded within the first nitride-based III-V semiconductor layer such that the protruding portions extend from the second surface into the first nitride-based III-V semiconductor layer, the protruding portions being spaced apart from each other along the second planar surface, each protruding portion being triangular or trapezoidal in cross section with a base at the second planar surface and inclined surfaces which are inclined relative to the second surface at angles between 100° to 160°; and
   a second nitride-based III-V compound semiconductor layer of a first conduction type, an active layer, and a third nitride-based III-V compound semiconductor layer of a second conduction type formed on said first nitride-based III-V compound semiconductor layer, wherein,
   along the cross section, each of the protruding portions bases has a width P, and the first nitride-based III-V compound semiconductor layer has second surface bases between the protruding portions bases, each of which has a width R,
   a ratio of P to R is from 0.5 to 3,
   the first nitride-based III-V compound semiconductor layer has (a) a thickness exceeding a height of the protruding portions, as measured from the second surface, and (b) for each second surface base, a threading dislocation with a first leg that extends vertically from a center of the second surface base to a point higher than the height of the protruding portions, a second leg that extends horizontally from the first leg to a point over a center of one of the protruding portions, and a third leg that extends vertically from the second leg to the first surface of the first nitride-based III-V compound semiconductor layer, and
   each first leg defines a center line of a equilateral triangular first growth phase of the first nitride-based III-V compound semiconductor layer.

2. A semiconductor device comprising a light emitting diode according to claim 1.

3. A light source cell unit comprising: a plurality of cells each containing at least one of each of a red light-emitting diode, a green light-emitting diode and a blue light-emitting diode, at least one light-emitting diode selected from the red light-emitting diode, green light-emitting diode and blue light-emitting diode on a printed wiring board, the at least one light-emitting diode being a light emitting diode according to claim 1.

4. An electronic device comprising a light emitting diode according to claim 1.

5. The light emitting diode of claim 1, wherein the inclined surfaces of the protruding portions are inclined relative to the second surface at angles between 132° to 139°.

6. The light emitting diode of claim 5, wherein the inclined surfaces of the protruding portions are inclined relative to the second surface at angles between 147° to 154°.

7. The semiconductor device of claim 6, wherein the inclined surfaces of the protruding portions are inclined relative to the second surface at angles between 135° to 152°.

8. The semiconductor device of claim 1, wherein:
   the first nitride-based III-V compound semiconductor layer has a first growth layer and a second growth layer which have a same composition or different compositions,
   between adjacent protruding portions, the first growth layer is triangular in shape with a base of the triangular shape at the second surface,
   the first growth layer contains vertically extending threading dislocations, including the first leg, but not horizontally extending threading dislocations,
   the second growth layer extends from the first growth layer and the protruding portions up to the first surface, and
   the second growth layer contains horizontally and vertically extending threading dislocations, including the second leg and third leg of the threading dislocation.

9. The semiconductor device of claim 8, wherein the first growth layer and the second growth layer have the same composition.

10. The semiconductor device of claim 8, wherein the first growth layer and the second growth layer have different compositions.

11. The semiconductor device of claim 8, wherein, given a height d of the protruding portions relative to the second surface, a width $W_g$ of the second bases, and an angle α made between inclined surfaces of the triangular shape of the first growth layer relative to the second surface, a relationship of $2d \geq W_g \tan \alpha$ holds.

12. The semiconductor device of claim 11, wherein:
0.5 μm≤d≤5 μm; and
0.5 μm≤$W_g$≤5 μm.

13. The semiconductor device of claim 12, wherein:
d=1.0 μm+/−0.2 μm; and
$W_g$=2.0 μm+/−0.5 μm.

14. The semiconductor device of claim 12, wherein each protruding portion is trapezoidal in the cross section and an upper surface has a width $W_t$ that is 1.0 μm to 1000 μm.

15. The semiconductor device of claim 14, wherein $W_t$ is 4.0 μm+/−2.0 μm.

16. A display device comprising:
a first nitride-based III-V compound semiconductor layer with oppositely facing first and second planar surfaces; and
a plurality of similarly shaped protruding portions embedded within the first nitride-based III-V semiconductor layer such that the protruding portions extend from the second surface into the first nitride-based III-V semiconductor layer, the protruding portions being spaced apart from each other along the second surface, each protruding portion being triangular or trapezoidal in cross section with a base at the second planar surface; and
a plurality of light-emitting diodes on the first nitride-based III-V compound semiconductor layer, each comprising a second nitride-based III-V compound semiconductor layer of a first conduction type, an active layer, and a third nitride-based III-V compound semiconductor layer of a second conduction type formed on said first nitride-based III-V compound semiconductor layer,
wherein,
along the cross section, each of the protruding portions bases has a width P, and the first nitride-based III-V compound semiconductor layer has second surface bases between the protruding portions bases, each of which has a width R,
a ratio of P to R is from 0.5 to 3,
the first nitride-based III-V compound semiconductor layer has (a) a thickness exceeding a height of the protruding portions, as measured from the second surface, and (b) for each second surface base, a threading dislocation with a first leg that extends vertically from a center of the second surface base to a point higher than the height of the protruding portions, a second leg that extends horizontally from the first leg to a point over one of the protruding portions, and a third leg that extends vertically from the second leg to the first surface of the first nitride-based III-V compound semiconductor layer, and
each first leg defines a center line of a equilateral triangular first growth phase of the first nitride-based III-V compound semiconductor layer.

17. An electronic device comprising a display device according claim 16.

18. A light-emitting diode backlight comprising:
a first nitride-based III-V compound semiconductor layer with oppositely facing first and second planar surfaces; and
a plurality of similarly shaped protruding portions embedded within the first nitride-based III-V semiconductor layer such that the protruding portions extend from the second surface into the first nitride-based III-V semiconductor layer, the protruding portions being spaced apart from each other along the second surface, each protruding portion being triangular or trapezoidal in cross section with a base at the second planar surface; and
at least three light-emitting diodes on the first nitride-based III-V compound semiconductor layer, each comprising a second nitride-based III-V compound semiconductor layer of a first conduction type, an active layer, and a third nitride-based III-V compound semiconductor layer of a second conduction type formed on said first nitride-based III-V compound semiconductor layer,
wherein,
along the cross section, each of the protruding portions bases has a width P, and the first nitride-based III-V compound semiconductor layer has second surface bases between the protruding portions bases, each of which has a width R,
a ratio of P to R is from 0.5 to 3,
the first nitride-based III-V compound semiconductor layer has (a) a thickness exceeding a height of the protruding portions, as measured from the second surface, and (b) for each second surface base, a threading dislocation with a first leg that extends vertically from a center of the second surface base to a point higher than the height of the protruding portions, a second leg that extends horizontally from the first leg to a point over one of the protruding portions, and a third leg that extends vertically from the second leg to the first surface of the first nitride-based III-V compound semiconductor layer, and
each first leg defines a center line of a equilateral triangular first growth phase of the first nitride-based III-V compound semiconductor layer.

* * * * *